United States Patent
Bowers et al.

(10) Patent No.: US 12,424,524 B2
(45) Date of Patent: Sep. 23, 2025

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Shaun Bowers, Gilbert, AZ (US); Yoshio Matsuda, Chandler, AZ (US); Hyung Il Jeon, Gyeonggi-do (KR); Byong Jin Kim, Seoul (KR); Gi Jeong Kim, Gyeonggi-do (KR); Jae Min Bae, Seoul (KR); Seung Woo Lee, Incheon (KR); Yong Ho Son, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 1 day.

(21) Appl. No.: 17/069,513

(22) Filed: Oct. 13, 2020

(65) Prior Publication Data
US 2022/0115304 A1    Apr. 14, 2022

Related U.S. Application Data

(60) Provisional application No. 63/091,021, filed on Oct. 13, 2020.

(51) Int. Cl.
*H01L 23/495* (2006.01)
*H01L 21/48* (2006.01)
(Continued)

(52) U.S. Cl.
CPC .... *H01L 23/49548* (2013.01); *H01L 21/4825* (2013.01); *H01L 21/4828* (2013.01);
(Continued)

(58) Field of Classification Search
CPC ....... H01L 23/49548; H01L 23/49579–49582; H01L 23/49562; H01L 23/3178;
(Continued)

(56) References Cited

U.S. PATENT DOCUMENTS 6,133,634 A    10/2000  Joshi
8,184,453 B1 *  5/2012  Kim .................. H01L 23/49548
                                                        361/813
(Continued)

OTHER PUBLICATIONS

"Advanced Embedded Active System Integration," Downloaded from ASE Global Website on Feb. 4, 2021.
(Continued)

*Primary Examiner* — Sue A Purvis
*Assistant Examiner* — Aneta B Cieslewicz
(74) *Attorney, Agent, or Firm* — Spectrum IP Law Group LLC

(57) ABSTRACT

In one example, an electronic device comprises a substrate comprising a first side and a second side, a first a lead on the second side, and a cavity in the second side adjacent to the first lead, an electronic component in the cavity and comprising a first terminal, a second terminal, and a third terminal, and a device encapsulant in the cavity and contacting a lateral side of the electronic component, and contacting a lateral side of the first lead opposite to the cavity. Other examples and related methods are also disclosed herein.

13 Claims, 45 Drawing Sheets

(51) Int. Cl.
*H01L 21/56* (2006.01)
*H01L 23/00* (2006.01)
*H01L 23/31* (2006.01)
*H01L 23/36* (2006.01)
*H01L 23/492* (2006.01)
*H01L 23/498* (2006.01)
*H01L 23/538* (2006.01)
*H01L 25/065* (2023.01)
*H01L 25/10* (2006.01)

(52) U.S. Cl.
CPC .......... *H01L 21/4842* (2013.01); *H01L 21/56* (2013.01); *H01L 21/561* (2013.01); *H01L 23/3178* (2013.01); *H01L 23/3192* (2013.01); *H01L 23/492* (2013.01); *H01L 23/49517* (2013.01); *H01L 23/49562* (2013.01); *H01L 23/49568* (2013.01); *H01L 23/49582* (2013.01); *H01L 23/49811* (2013.01); *H01L 23/5385* (2013.01); *H01L 24/16* (2013.01); *H01L 25/105* (2013.01); *H01L 23/3107* (2013.01); *H01L 23/36* (2013.01); *H01L 23/49816* (2013.01); *H01L 25/0652* (2013.01); *H01L 2224/0603* (2013.01); *H01L 2224/1403* (2013.01); *H01L 2224/16245* (2013.01); *H01L 2224/32257* (2013.01); *H01L 2224/97* (2013.01); *H01L 2225/0651* (2013.01); *H01L 2225/06517* (2013.01); *H01L 2225/06548* (2013.01); *H01L 2225/06572* (2013.01); *H01L 2225/06589* (2013.01); *H01L 2225/1023* (2013.01); *H01L 2225/1058* (2013.01)

(58) Field of Classification Search
CPC ............. H01L 23/3192; H01L 23/3107; H01L 21/56–561; H01L 21/561; H01L 21/4825; H01L 21/4828; H01L 21/4842; H01L 23/49568; H01L 23/36; H01L 23/5385; H01L 23/49816; H01L 23/49517; H01L 23/49811; H01L 23/492; H01L 24/16; H01L 25/0652; H01L 25/105; H01L 2225/06589; H01L 2225/06517; H01L 2225/1058; H01L 2225/1023; H01L 2225/06572; H01L 2225/0651; H01L 2225/06548; H01L 2224/1403; H01L 2224/16245; H01L 2224/97; H01L 2224/32257; H01L 2224/0603; H01L 23/49541–49565
See application file for complete search history.

(56) References Cited

U.S. PATENT DOCUMENTS

| | | |
|---|---|---|
| 8,884,420 B1 | 11/2014 | Hosseini et al. |
| 9,917,039 B2 | 3/2018 | Mangrum et al. |
| 10,490,487 B2 | 11/2019 | Mangrum |
| 11,562,950 B2* | 1/2023 | Stella .................. H01L 23/3114 |
| 2003/0193080 A1* | 10/2003 | Cabahug .......... H01L 23/49562 257/E23.044 |
| 2004/0061221 A1 | 4/2004 | Schaffer |
| 2005/0023670 A1* | 2/2005 | Hata ................. H01L 23/49562 257/E23.044 |
| 2005/0086794 A1* | 4/2005 | Fukunaka .............. G01R 33/07 29/603.01 |
| 2007/0090523 A1* | 4/2007 | Otremba .......... H01L 23/49562 257/E23.044 |
| 2009/0160046 A1 | 6/2009 | Otremba et al. |
| 2009/0194856 A1* | 8/2009 | Gomez ............. H01L 23/49503 257/676 |
| 2009/0250794 A1* | 10/2009 | St. Germain ........... H01L 24/37 257/676 |
| 2009/0267171 A1* | 10/2009 | Yean ................... H01L 23/3135 257/434 |
| 2010/0078783 A1 | 4/2010 | Otremba |
| 2013/0299845 A1* | 11/2013 | Nomoto ........... H01L 23/49562 257/693 |
| 2013/0328213 A1 | 12/2013 | Otremba et al. |
| 2016/0118320 A1* | 4/2016 | Coppone ................. H01L 24/97 438/123 |
| 2016/0150632 A1* | 5/2016 | Viswanathan ......... H05K 3/284 29/829 |
| 2016/0172284 A1 | 6/2016 | Cho |
| 2016/0183369 A1* | 6/2016 | Talledo .................. H05K 1/181 361/767 |
| 2017/0287820 A1* | 10/2017 | Ahlers ................ H01L 21/4825 |
| 2018/0096921 A1 | 4/2018 | Tsai et al. |
| 2019/0043791 A1* | 2/2019 | Haga .................. H01L 23/4952 |
| 2019/0148270 A1* | 5/2019 | Rivera-Marty ... H01L 23/49805 257/676 |
| 2021/0272923 A1* | 9/2021 | Ryu ....................... H01L 24/19 |

OTHER PUBLICATIONS

Courtney Furnival, "Scalability of SiC Near Chip-Scale Packages for Electric Vehicle & Locomotive Traction," BODO's Power Systems Magazine, Oct. 14, 2020, 9 pages.

Office Action for Taiwan Application No. 110132472 mailed Nov. 21, 2024.

\* cited by examiner

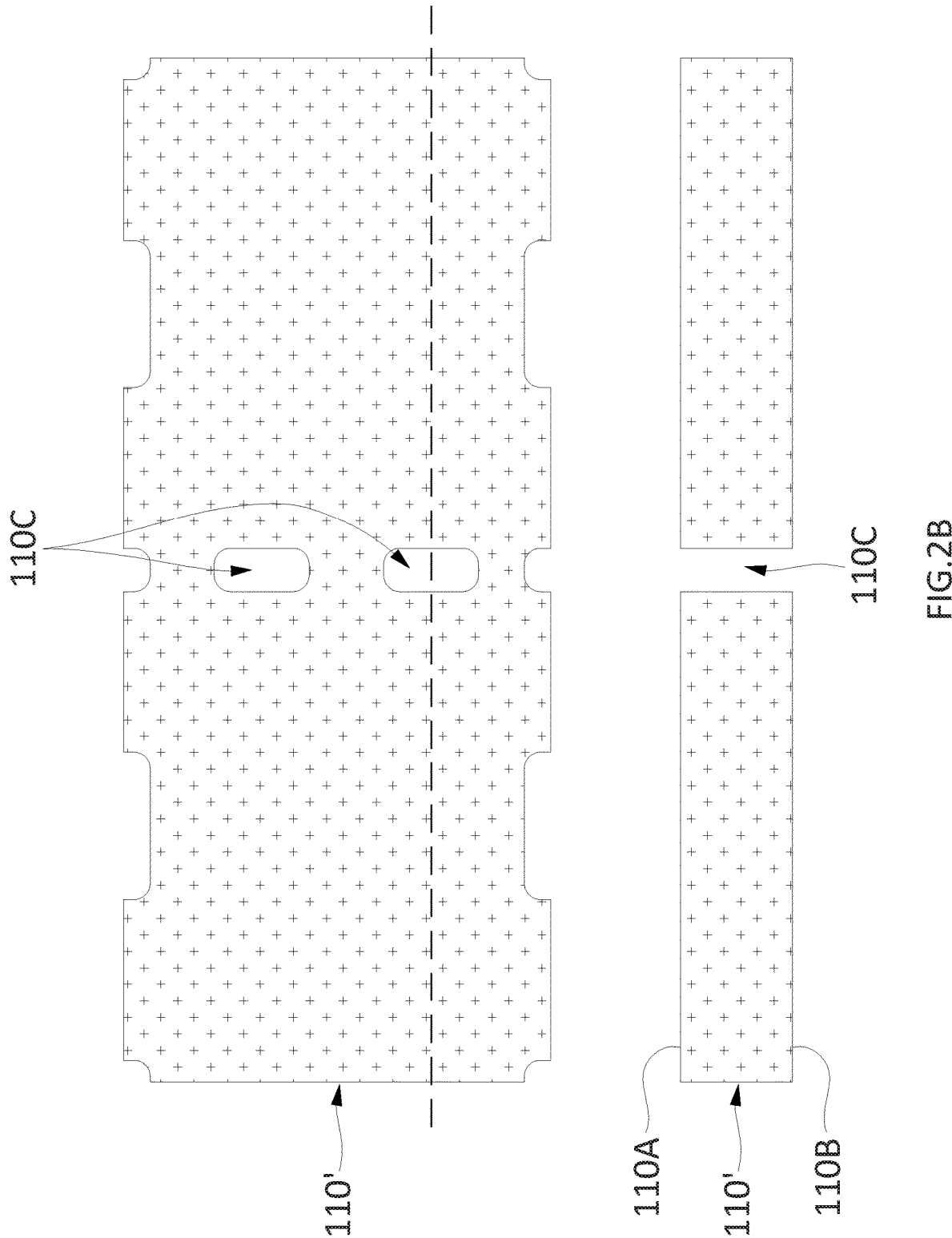

FIG. 2I

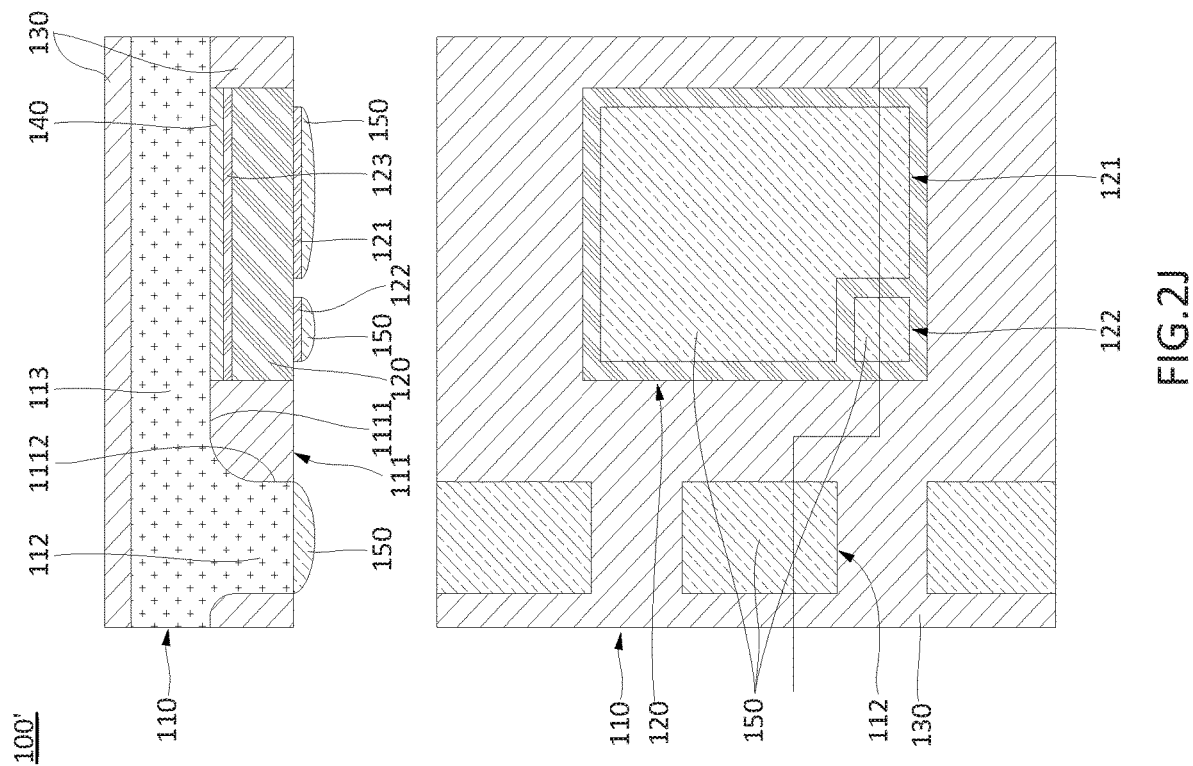

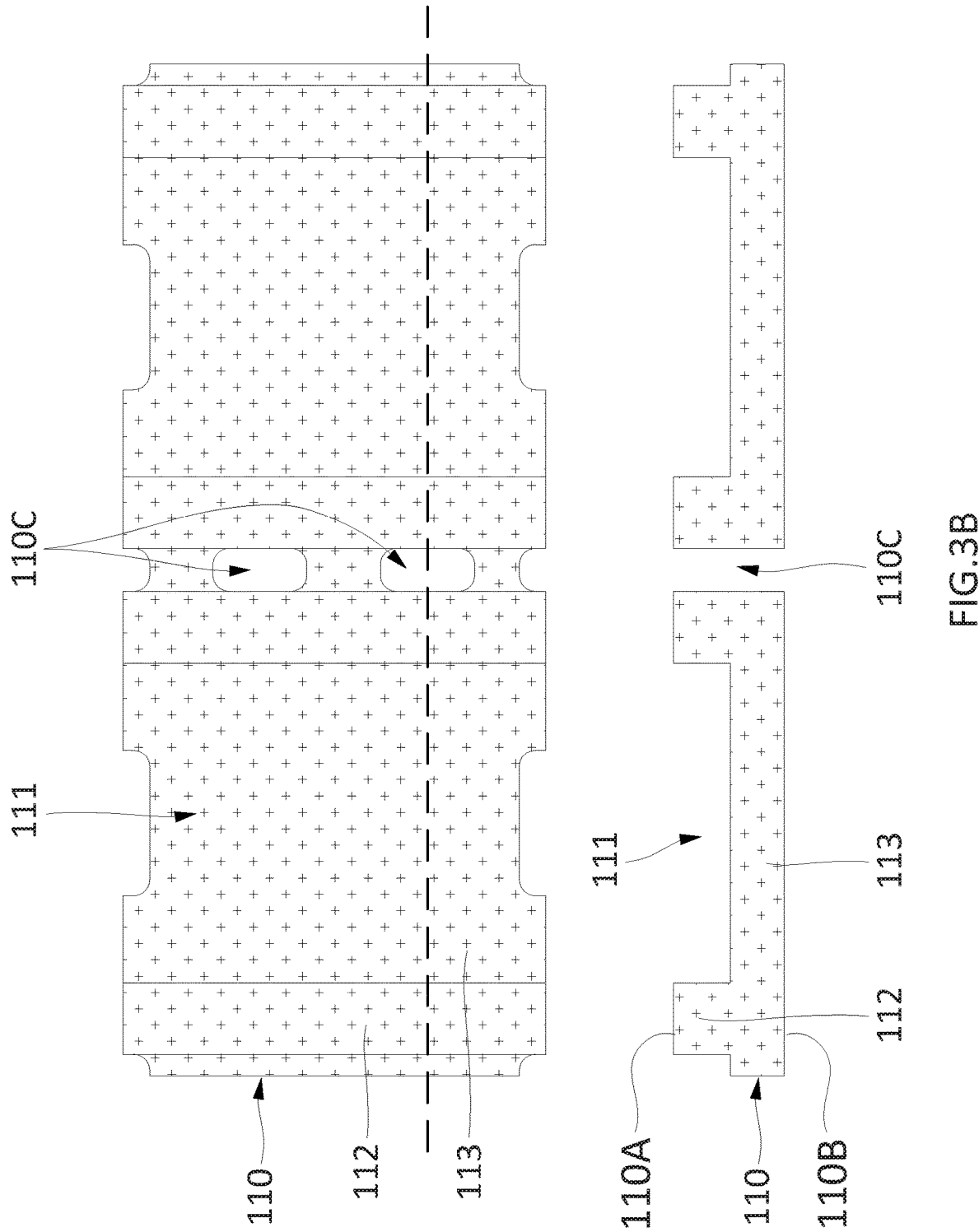

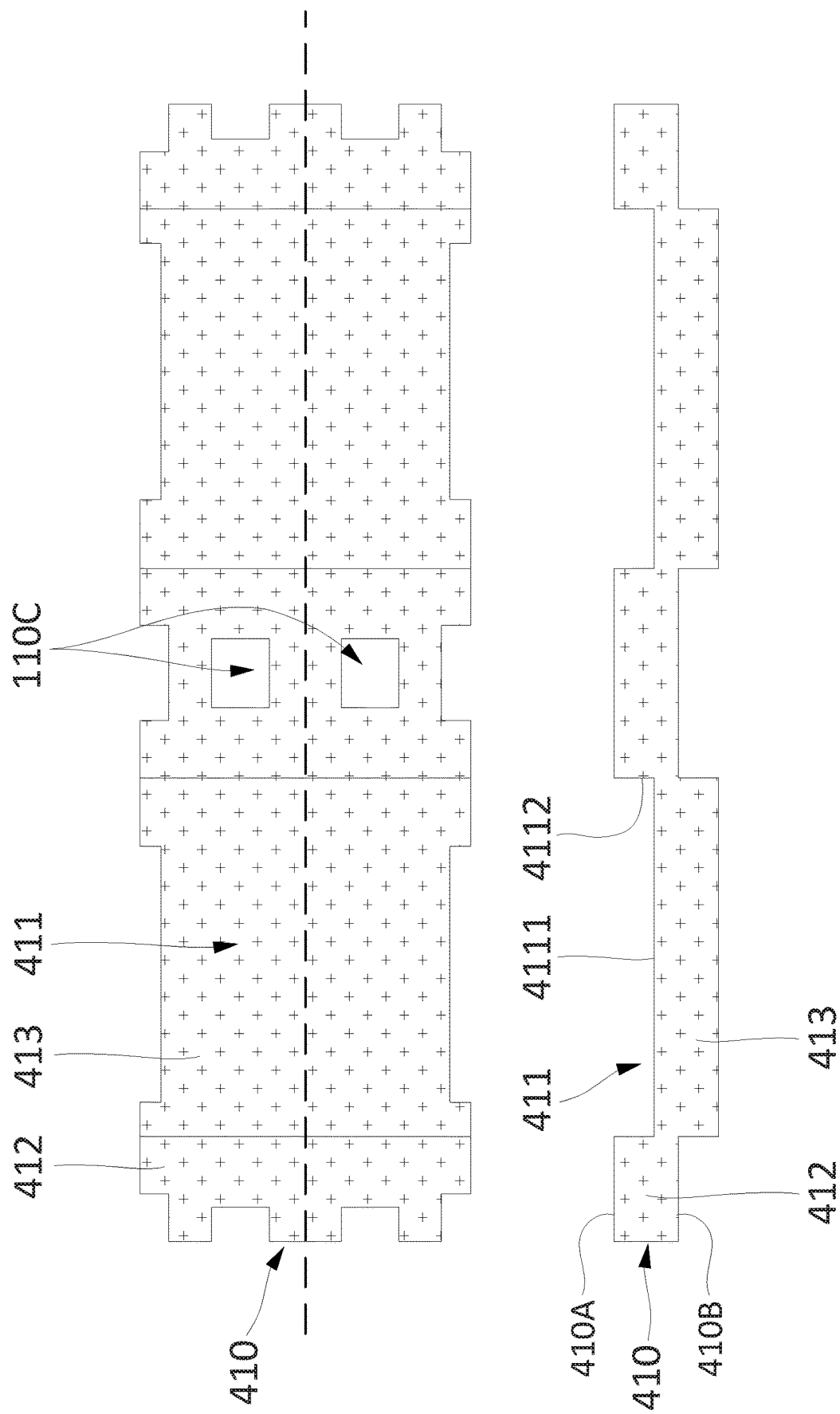

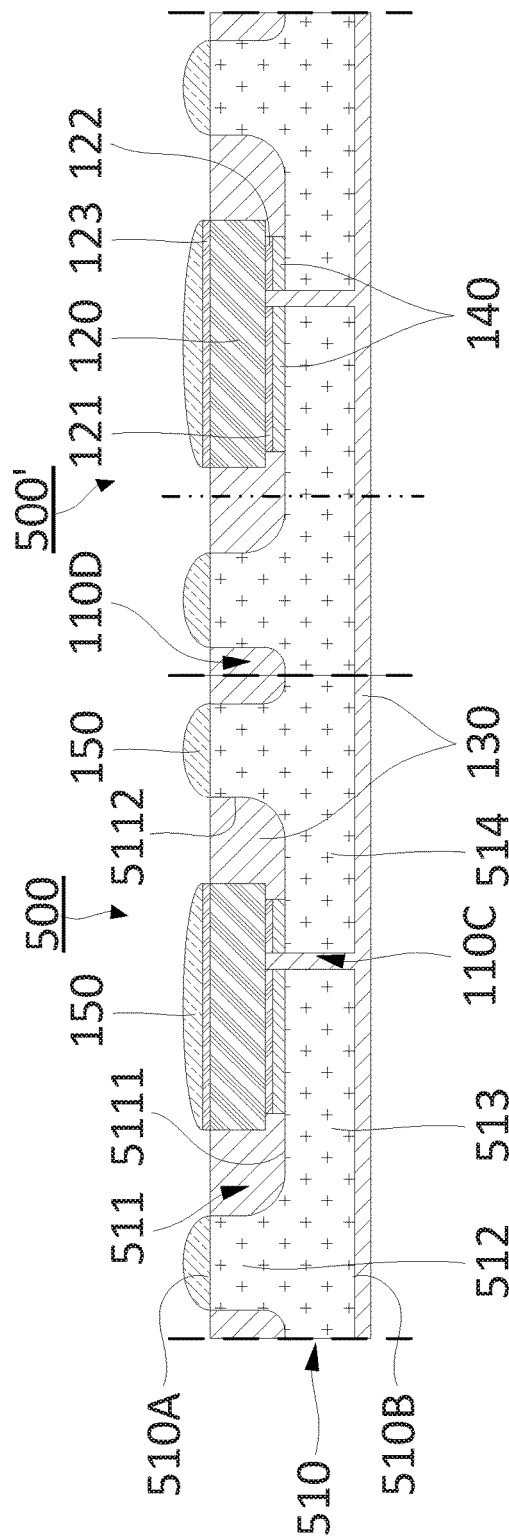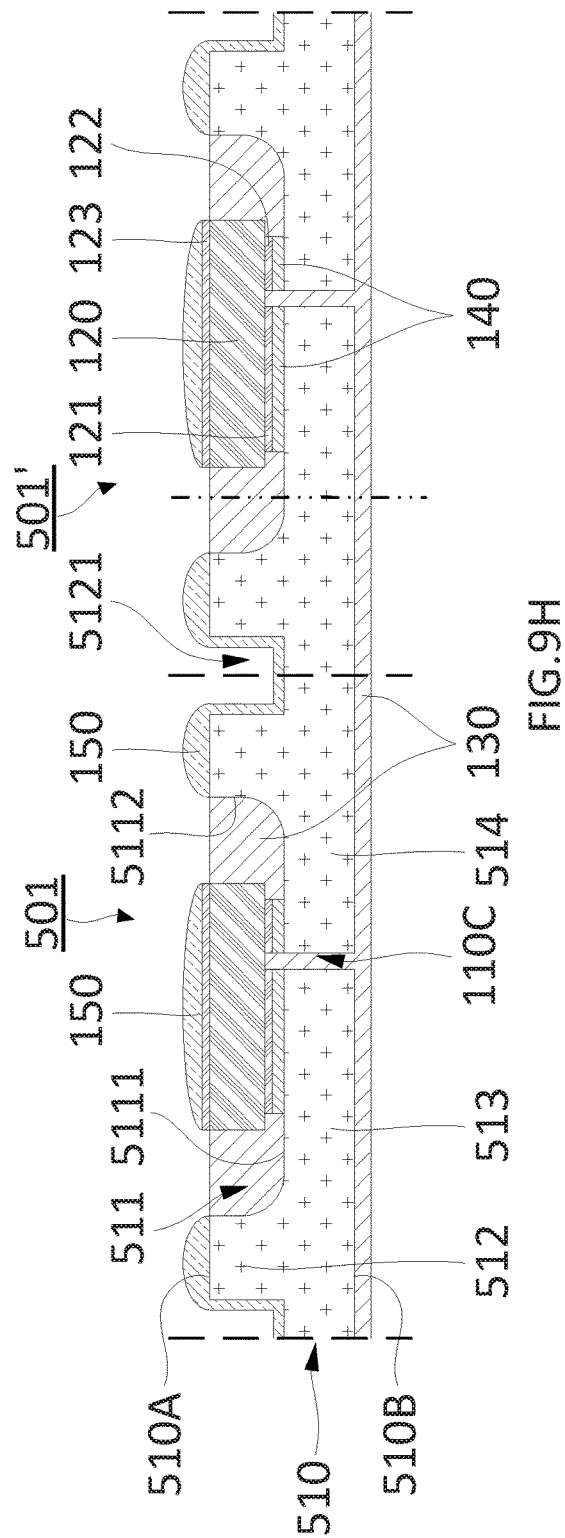

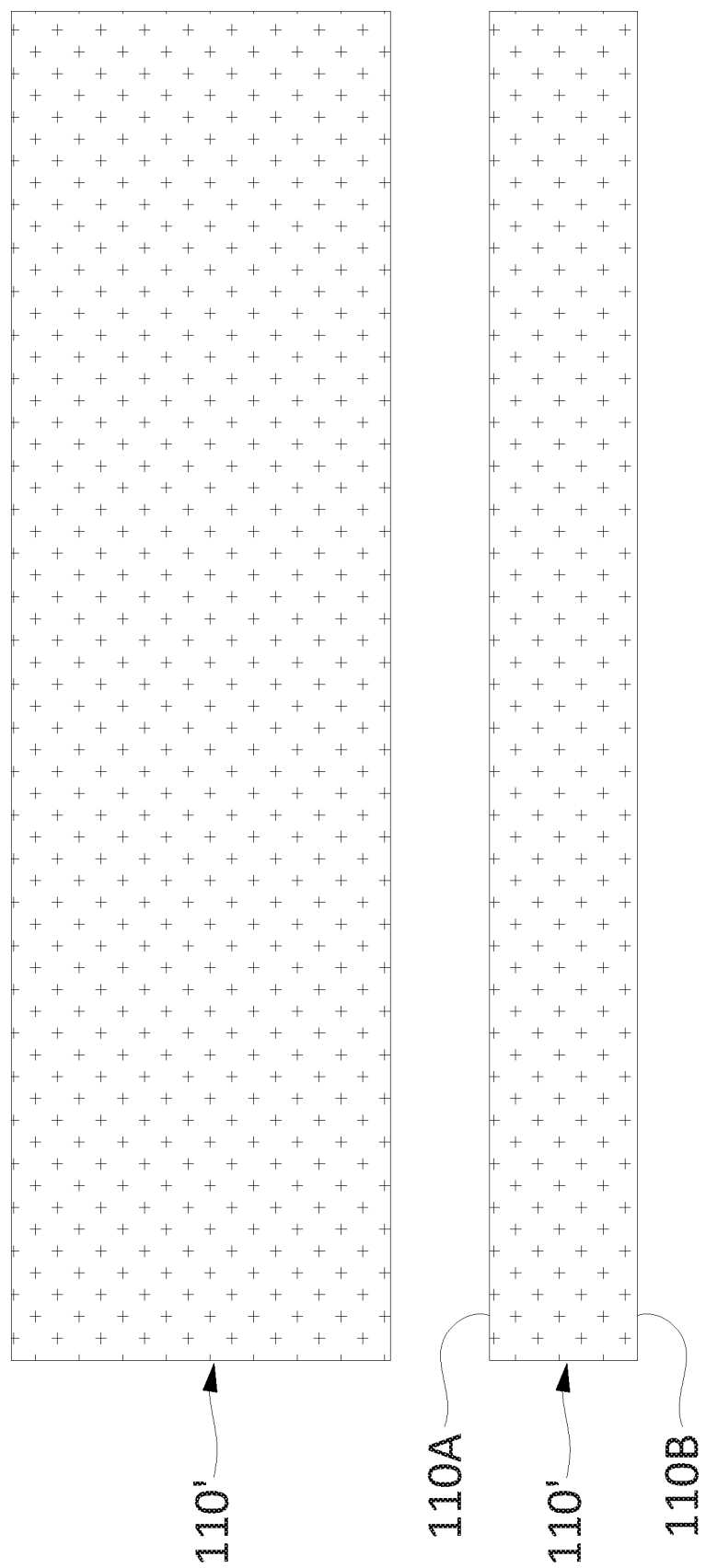

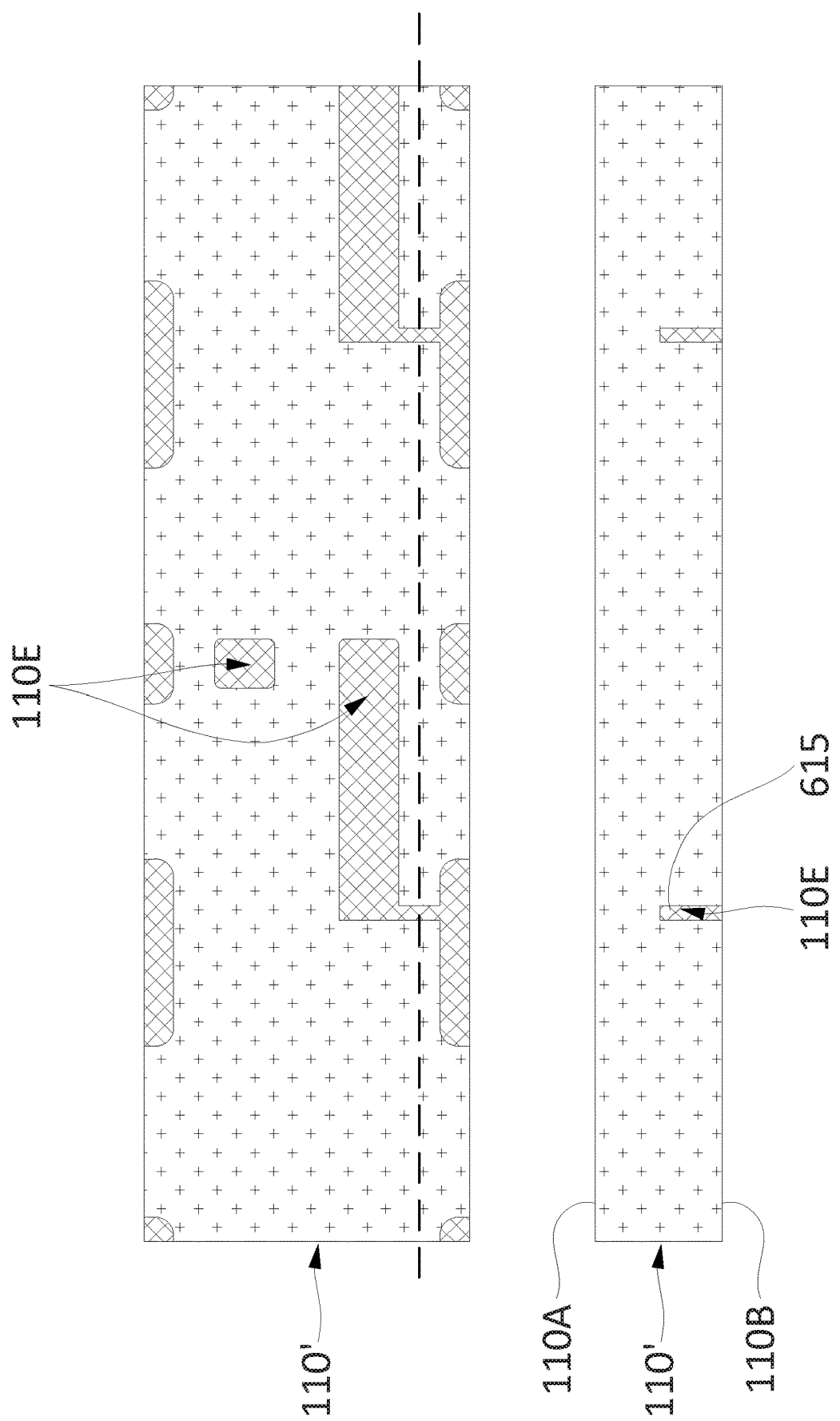

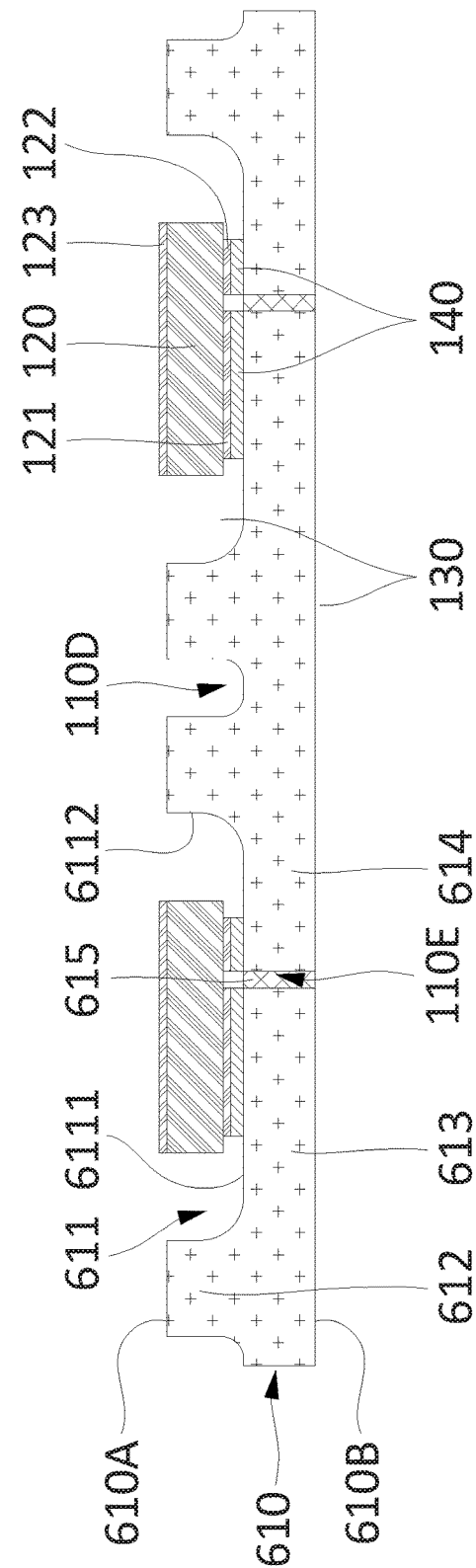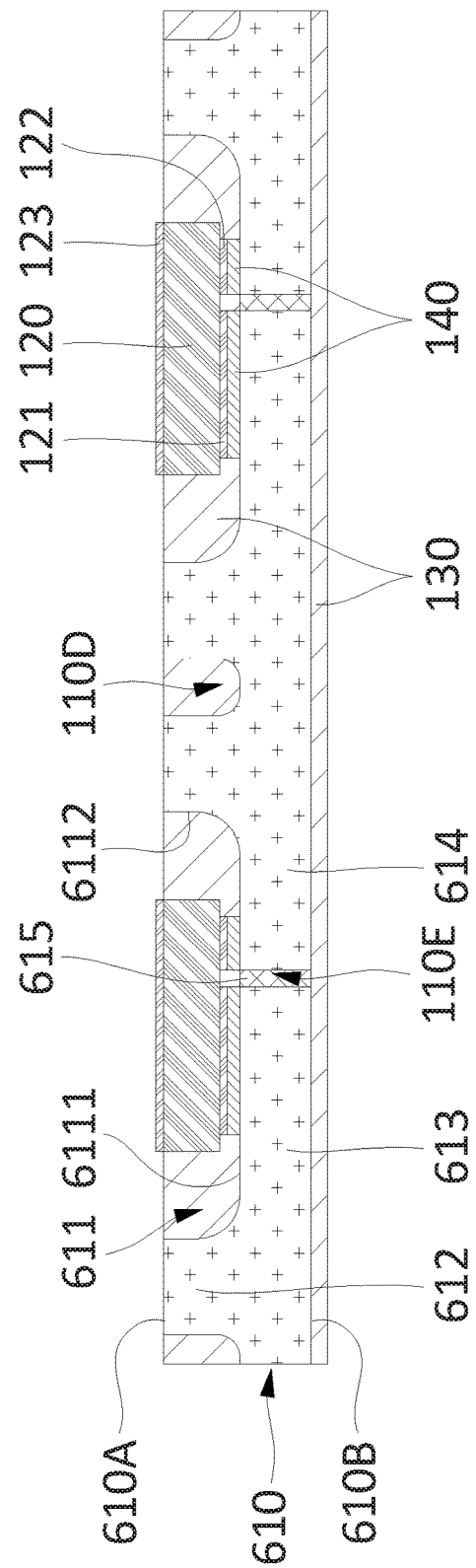

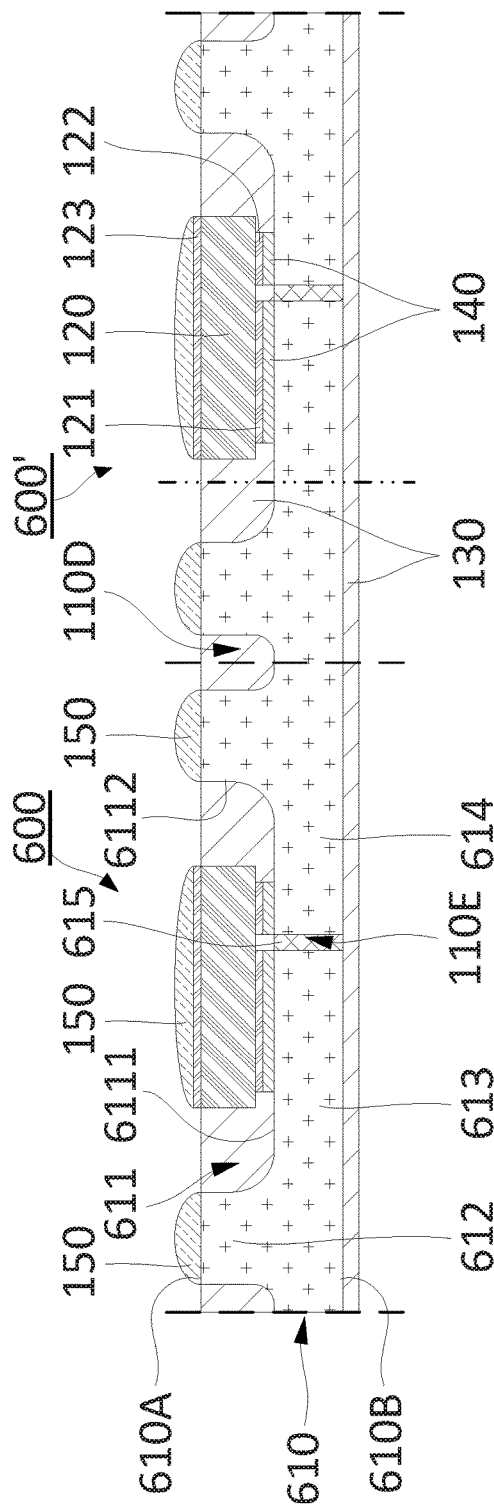
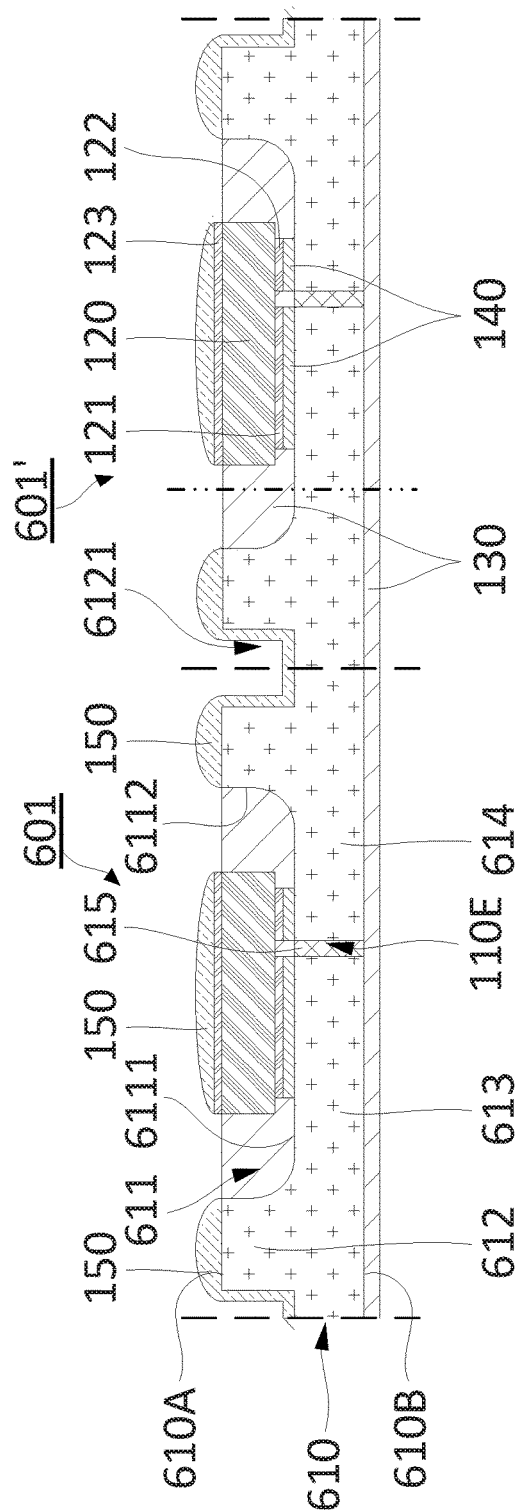
FIG.11H
FIG.11I

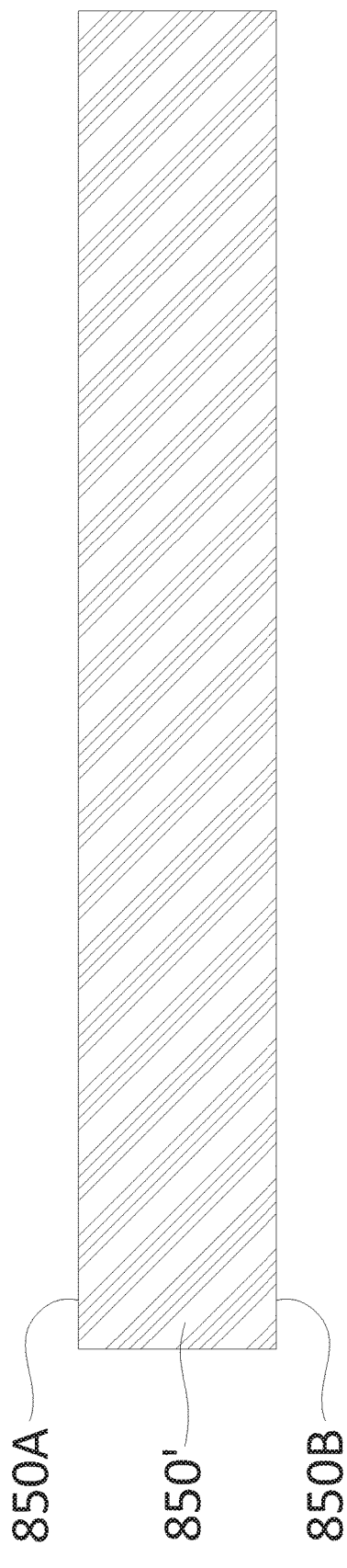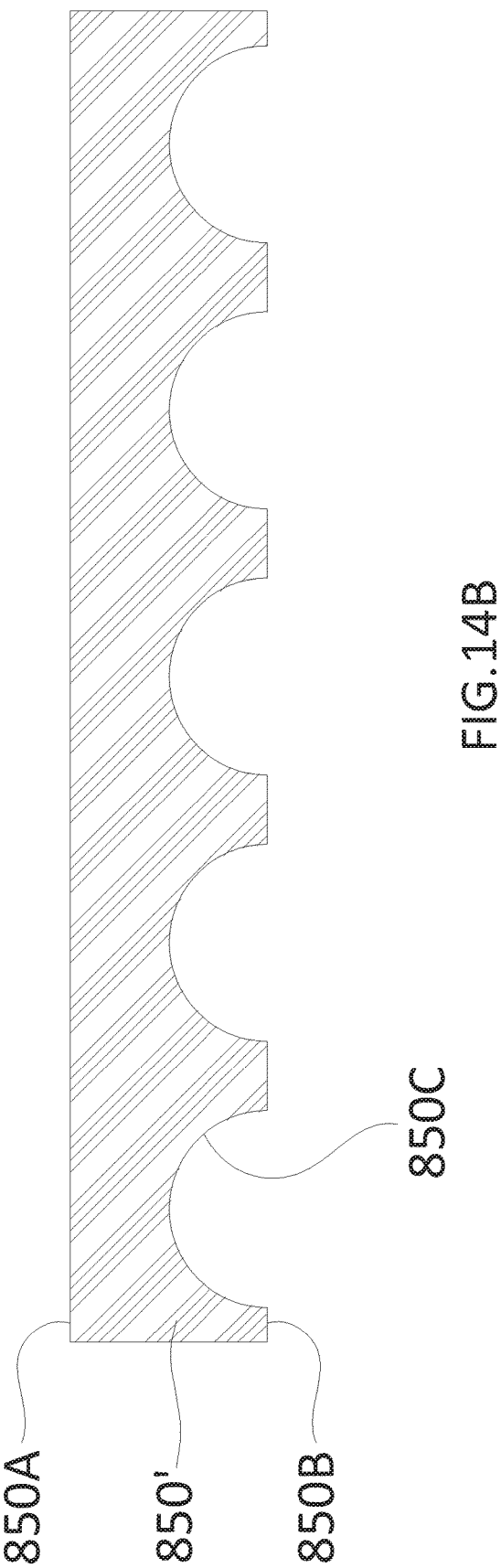

SEMICONDUCTOR DEVICES AND METHODS OF MANUFACTURING SEMICONDUCTOR DEVICES

CROSS-REFERENCE TO RELATED APPLICATIONS

The present application claims the benefit of U.S. Application No. 63/091,021 filed Oct. 13, 2020 titled "Innovative Chip Scale Power Transistor Packaging". Said Application No. 63/091,021 is hereby incorporated by reference in its entirety.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A to 2J show cross-sectional views or plan views of an example method for manufacturing an example electronic device.

FIGS. 3A to 3B show cross-sectional views or plan views of an example method for manufacturing an example electronic device.

FIGS. 7A to 7H show cross-sectional views or plan views of an example method for manufacturing an example electronic device.

FIGS. 9A to 9J show cross-sectional views or plan views of an example method for manufacturing an example electronic device.

FIGS. 11A to 11K show cross-sectional views or plan views of an example method for manufacturing an example electronic device.

FIGS. 14A to 14E show cross-sectional views of an example method for manufacturing an example lead frame cube.

Figure 1:
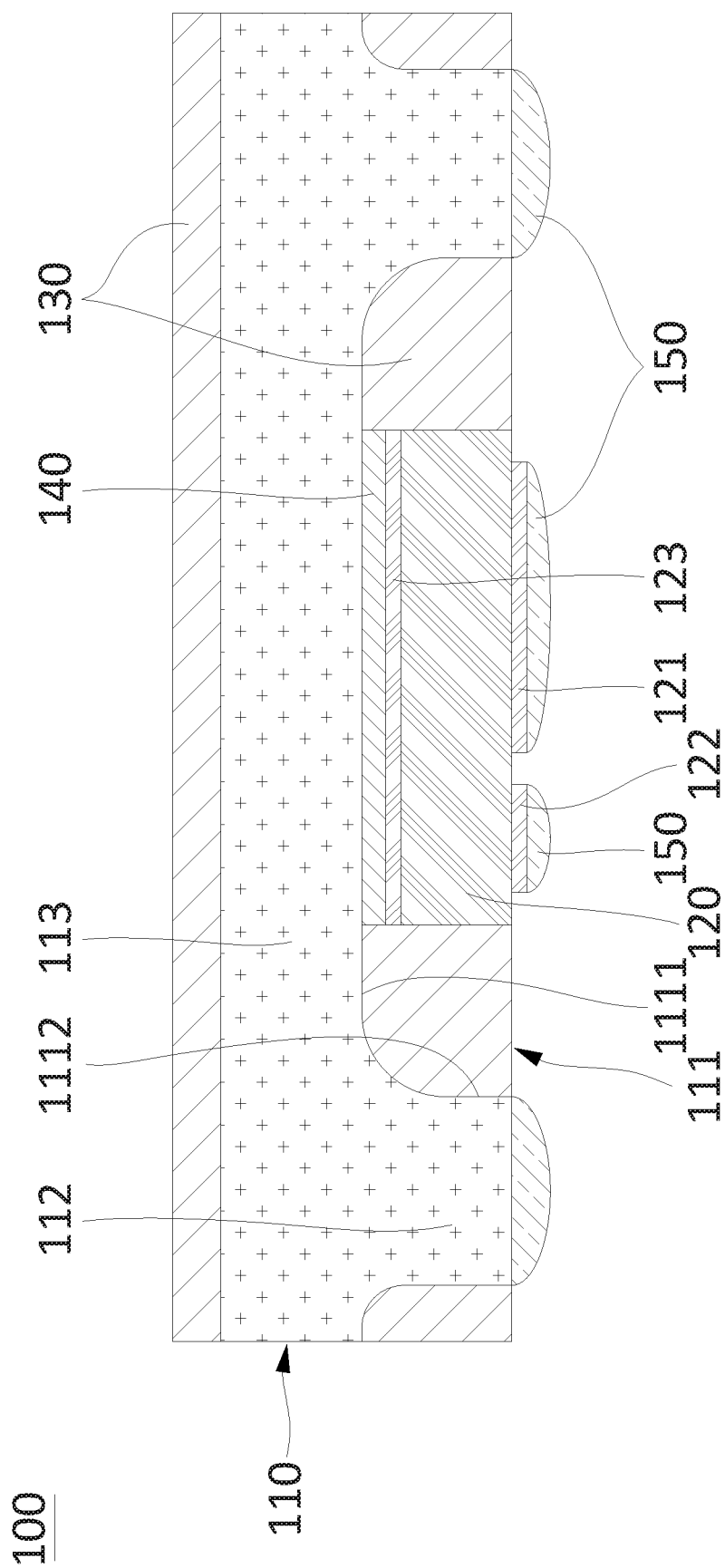
FIG. 1 shows a cross-sectional view of an example electronic device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly connected to element B, or indirectly connected to element B by an intervening element C. Similarly, the terms "over" or "on" may be used to describe two elements directly contacting each other or describe two elements indirectly connected by one or more other elements.

DESCRIPTION

In one example, an electronic device comprises a substrate comprising a first side and a second side, a first a lead on the second side, and a cavity in the second side adjacent to the first lead, an electronic component in the cavity and comprising a first terminal, a second terminal, and a third terminal, and a device encapsulant in the cavity and contacting a lateral side of the electronic component, and contacting a lateral side of the first lead opposite to the cavity.

In another example, a method comprises providing a substrate comprising a first side and a second side, a cavity in the second side, and a first a lead and a second lead on the second side, wherein the cavity is between the first lead and the second lead, providing an electronic component in the cavity, wherein the electronic component comprises a first terminal, a second terminal, and a third terminal, and providing a device encapsulant in the cavity and contacting a lateral side of the electronic component, and contacting lateral sides of the first lead and of the second lead. The substrate comprises a groove on the first lead opposite to the cavity.

In a further example, a substrate comprises a conductive structure, an electronic device coupled with the substrate, an encapsulant contacting the substrate and a lateral side of the electronic device, and a vertical interconnect in the encapsulant and coupled with the conductive structure. The electronic device comprises an electronic device substrate comprising a first side and a second side, a first lead and a second lead on the second side, and a cavity in the second side between the first lead and the second lead, an electronic component in the cavity and comprising a first terminal, a second terminal, and a third terminal, and a device encapsulant in the cavity, contacting a lateral side of the electronic component, and contacting lateral sides of the first lead and of the second lead.

Other examples are included in the present disclosure. Such examples may be found in the figures, in the claims, and/or in the description of the present disclosure.

FIG. 1 shows a cross-sectional view of an example electronic device 100. In the example shown in FIG. 1, electronic device 100 can comprise substrate 110, electronic component 120, device encapsulant 130, and interface 140 and plating 150.

Substrate 110 can comprise cavity 111, leads 112, and paddle 113. Cavity 111 can comprise cavity base 1111 and cavity wall 1112. In some examples, cavity 111 can comprise a curved transition from cavity base 1111 to cavity wall 1112. Electronic component 120 can comprise first terminal 121, second terminal 122, and third terminal 123, which in some examples can be respectively referred as source terminal 121, gate terminal 122, and drain terminal 123. A gate-down configuration is presented for electronic device 100, where gate 122 of electronic component 120 faces downward or away from substrate 110 as shown in FIG. 1. In some examples, gate-down configuration can be referred as exposed-gate configuration, or external-gate configuration, or gate-on-PCB (printed circuit board) configuration. In some examples, cavity 111 can be between leads 112, and electronic component 120 can be in cavity 111. Device encapsulant 130 can be in cavity 111 contacting a lateral side of electronic component 120. In some examples, electronic component 120 can comprise a semiconductor die fabricated from silicon (Si), gallium nitride (GaN), gallium arsenide (GaAs) or silicon carbide (SiC). In some examples, electronic component 120 can comprise a passive component such as a resistor, capacitor, or inductor, or can comprise a passive network. Device encapsulant 130 further can contact the lateral sides of leads 112 opposite to cavity 111. In some examples, device encapsulant 130 can contact a side of substrate 110 opposite to cavity 111. In some examples, first terminal 121 and second terminal 122 can be exposed at the cavity side of substrate 110, and third terminal 123 can be coupled with leads 112 via substrate 110. In some examples, interface 140 can be on a cavity base 1111, and third terminal 123 can be coupled with substrate 110 via interface 140.

Substrate 110, device encapsulant 130, and platings 140 and 150 can be referred to as a semiconductor package or a package, and can provide protection for electronic component 120 from external elements and/or environmental exposure. The semiconductor package can provide an electrical coupling between an external component and electronic component 120.

Figure 2A:
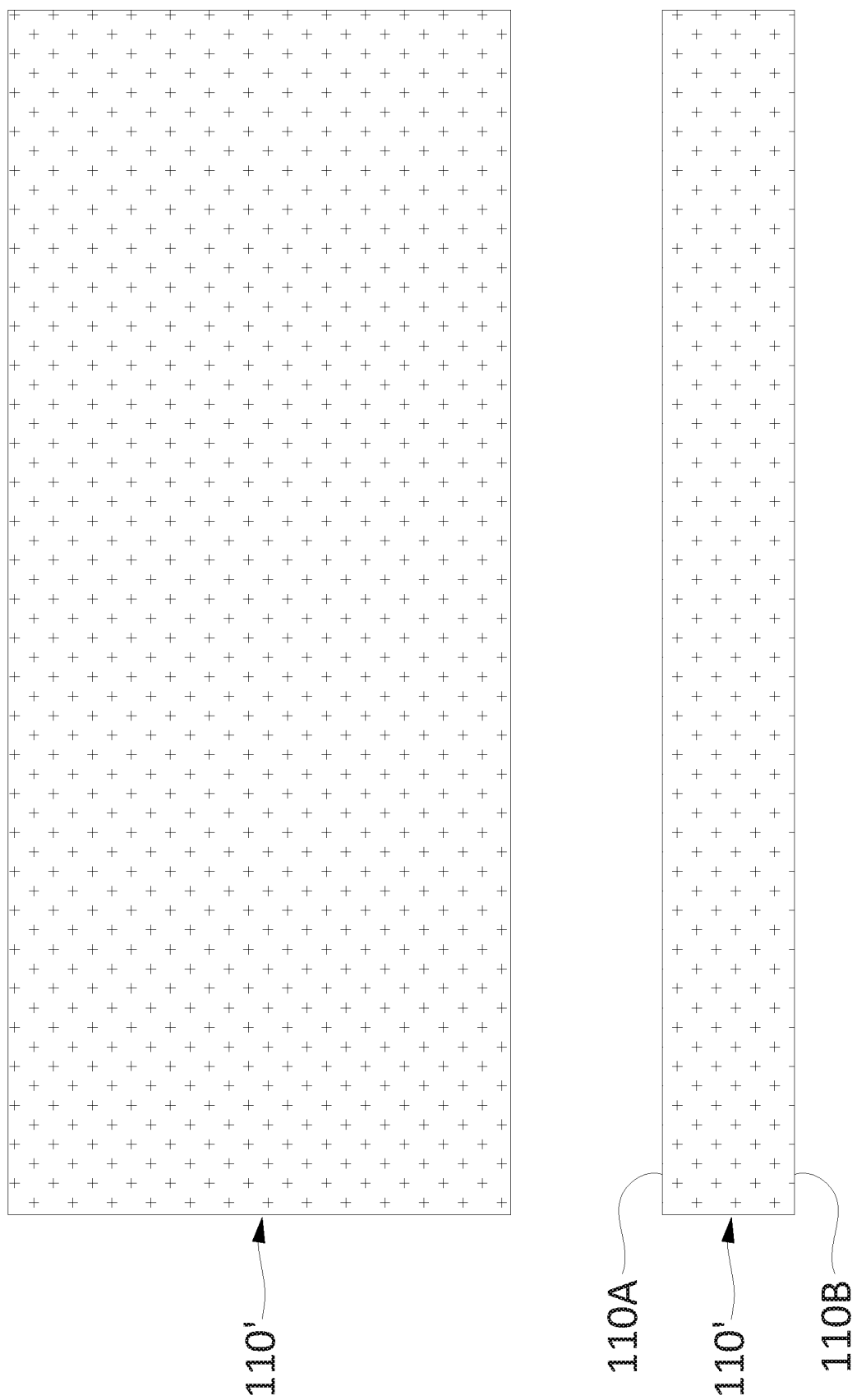

FIGS. 2A to 2J show cross-sectional views or plan views of an example method for manufacturing an example electronic device 100. FIG. 2A shows a plan view and a cross-sectional view of electronic device 100 at an early stage of manufacture. In the example shown in FIG. 2A, raw substrate 110' having side 110A and side 110B opposite to side 110A can be prepared. Raw substrate 110' can be made of a metal, such as copper, nickel, aluminum, or alloys thereof. Raw substrate 110' can be a base constituent from which individual substrates 110 can be formed. Raw substrate 110' can be in the form of a plate or strip larger than an individual device substrate for simultaneously producing multiple individual substrates 110. Raw substrate 110' can be transitioned to or referred as substrate 110 through subsequent processing. In some examples, raw substrate 110' can comprise a thickness of about 100 μm to about 500 μm.

FIG. 2B shows a plan view and a cross-sectional view of electronic device 100 at a later stage of manufacture. In the example shown in FIG. 2B, openings 110C can be formed in raw substrate 110', such as through a patterning process or a punching process. In some examples, openings 110C can comprise or be referred to as holes or apertures. Openings 110C can be formed to pass through raw substrate 110' from side 110A to side 110B. In some examples, in order to facilitate handling of subsequent processes, openings 110C can be formed along boundary lines between individual substrates 110 eventually separated from raw substrate 110'. Openings 110C can be formed along such boundary lines, and thus can facilitate by speeding up singulation or preventing tool wear during singulation. Openings 110C can be spaced from each other so as to prevent raw substrate 110' from being completely separated into substrates 110, to permit transferring of raw substrate 110' as a whole to a subsequent process. In some examples, openings 110C can be formed by etching portions of raw substrate 110'. In some examples, openings 110C can be formed through a dry etching process such as plasma etching, reactive ion etching (RIE), or sputter etching, or wet etching process such as immersion or spraying. In some examples, openings 110C can be formed by partial-etching side 110B of raw substrate 110' and then partial-etching side 110A of raw substrate 110' positioned to correspond to side 110B. In some examples, openings 110C can be formed by punching or cutting through raw substrate 110'.

Figure 2C:
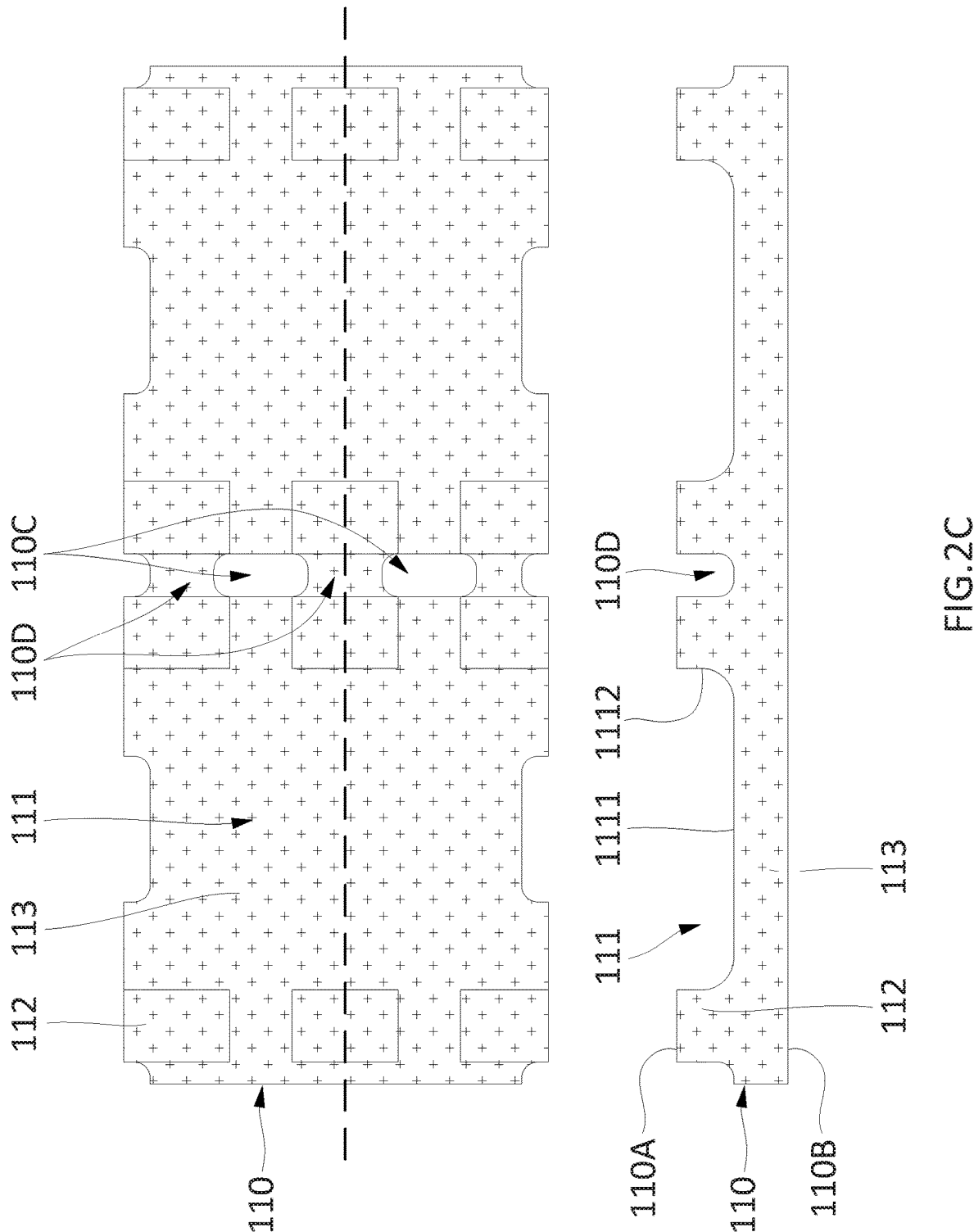

FIG. 2C shows a plan view and a cross-sectional view of electronic device 100 at a later stage of manufacture. In the example shown in FIG. 2C, cavities 111 can be formed on side 110A of substrate 110. In some examples, cavities 111 can be formed by partial-etching through side 110A of substrate 110. In some examples, cavities 111 can be formed through a dry etching process such as plasma etching, reactive ion etching (RIE), or sputter etching, or wet etching process such as immersion or spraying. Cavities 111 can provide a space where electronic component 120 can be positioned. Cavities 111 can comprise cavity base 1111 and cavity wall 1112. Cavity base 1111 can be a surface of paddle 113 where electronic component 120 can be mounted. Cavity wall 1112 can be defined by lateral sides of leads 112 facing cavity base 1111. Cavities 111 can be formed as grooves, each having a depth from side 110A of substrate 110 to cavity base 1111. The depth of each of the cavities 111 can be about 40% to about 70% of the thickness of substrate 110.

In some examples, grooves 110D can be formed by partial-etching substrate 110 along the boundary lines between individual substrates 110. In some examples, grooves 110D can be simultaneously formed with cavities 111. The width of each groove 110D can be smaller than the width of each cavity 111. In some examples, grooves 110D can define lateral sides of leads 112. In some examples, grooves 110D can facilitate a singulation process.

In some examples, the patterning process shown in FIG. 2B and the partial-etching process shown in FIG. 2C by which openings 110C, cavities 111, and grooves 110D are formed can be performed by partial-etching. For example, portions of side 110B of substrate 110 corresponding to openings 110C can be partial-etched, and portions of side 110A of substrate 110 corresponding to openings 110C, cavities 111, and grooves 110D, can also be partial-etched. Accordingly, openings 110C, cavities 111 and grooves 110D can be simultaneously formed in some examples.

In the example shown in FIG. 2C, substrate 110 including cavities 111, leads 112 and paddles 113 can be formed by partial-etching substrate 110. Leads 112 and paddles 113 can be formed by cavities 111 and grooves 110D. Leads 112 and paddles 113 can be electrically coupled to each other. In some examples, substrate 110 can comprise or be referred to as a lead frame or an etched lead frame.

Leads 112 can protrude from paddles 113. In some examples, leads 112 can comprise or be referred to as legs or lead fingers. Leads 112 can be provided as electrically coupling paths between substrate 110 and an external component. Leads 112 can be positioned along the perimeter of cavities 111 where electronic component 120 can be mounted. Leads 112 can be formed by cavities 111 and grooves 110D. In some examples leads 112 can comprise a minimum width of about 100 μm and a maximum width can be optimized as needed. In some examples lead 112 can comprise a height, from cavity base 1111 to side 110A of substrate 110, of about 40% to 70% of the thickness of substrate 110, such as about 50% of the thickness of substrate 110. In some examples, the height of leads 112 can be similar to the depth of cavity 111. In some examples, the lateral sides of leads 112 can be defined by the lateral sides of cavity wall 1112 and of grooves 110D.

Paddles 113 can comprise or be referred to as flags, islands, die paddles, or die pads. Electronic component 120 can be mounted on one side of each of paddles 113. In some examples, one side of each of paddles 113 can comprise cavity base 1111. In some examples, a difference in the thickness between paddles 113 and leads 112 can correspond to a depth of each of cavities 111. In some examples paddle 113 can comprise a thickness, from cavity base 1111 to side 110B of substrate 110, of about 40% to 70% of the thickness of substrate 110, such as about 50% of the thickness of substrate 110. Paddles 113 and leads 112 can be integral with each other or monolithic, defined by a single piece of material of substrate 110.

Figure 2D:
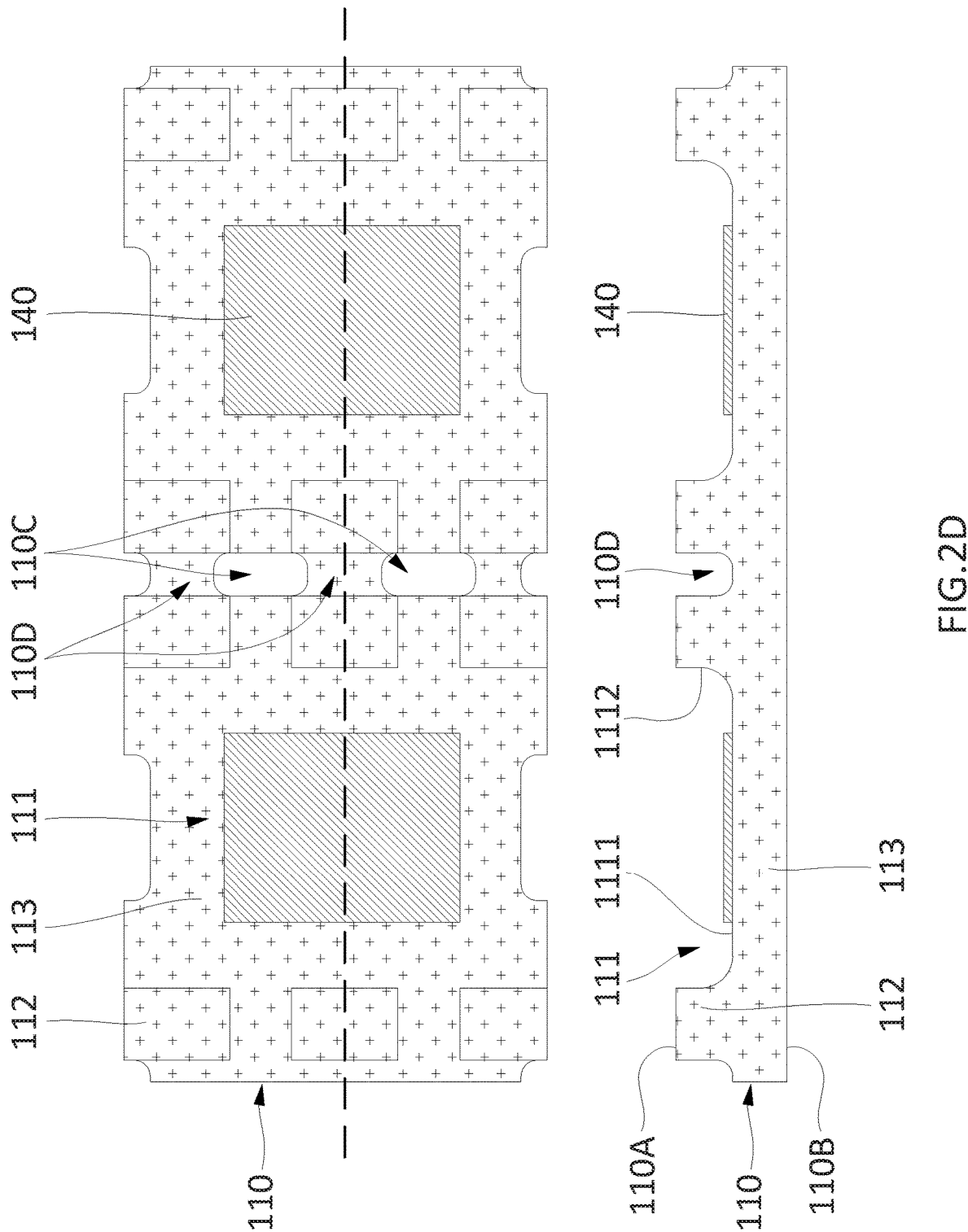

FIG. 2D shows a plan view and a cross-sectional view of electronic device 100 at a later stage of manufacture. In the example shown in FIG. 2D, interface 140 can be provided as one or more layers on paddles 113 positioned within each of cavities 111, such as on cavity base 1111. In some examples, interface 140 can be formed by electroless plating or electroplating, or can be deposited by injection or application. In some examples, interface 140 can comprise an electrically conductive material, such as silver, gold, copper, platinum, tin, nickel, palladium, titanium, or tungsten. In some examples, interface 140 can comprise one or more layers of plating, solder material, conductive die-attach paste or film, conductive adhesive, or sintering material. For instance, interface 140 can comprise a layer of plating (such as silver plating) on cavity base 1111, covered by a layer of solder or of sintering material (such as gold or copper particles dispersed in a sacrificial bonder such as acetone or alcohol). Interface 140 can provide an electrical contact between electronic component 120 and substrate 110.

Figure 2E:
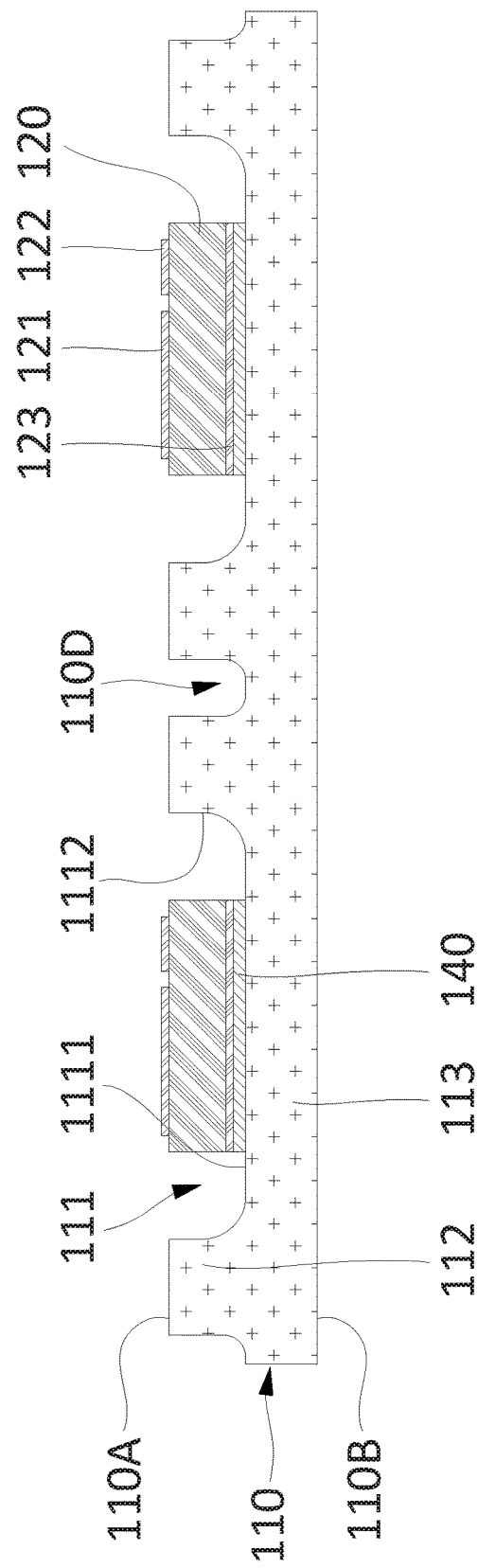

FIG. 2E shows a cross-sectional view of electronic device 100 at a later stage of manufacture. In the example shown in FIG. 2E, electronic component 120 can be coupled with substrate 110 through interface 140. Electronic component 120 can be received in each of cavities 111. Electronic component 120 can comprise a front side having first terminal 121 and second terminal 122, and a back side having third terminal 123. Electronic component 120 can be attached on paddle 113, with third terminal 123 coupled to cavity base 1111 through interface 140. In some examples, such as where third terminal 123 and cavity base 1111 comprise a same metal type, interface 140 can represent a direct metal-to-metal junction (such as copper-copper junction) where the metals of third terminal 123 and of cavity base 1111 diffuse into each other. Electronic component 120 can be attached onto paddles 113 to allow first terminal 121 and second terminal 122 to face upward. In some examples, first terminal 121 and second terminal 122 can be exposed.

Electronic component 120 can comprise or be referred to as one or more dies, chips, or packages. In some examples, electronic component 120 can comprise a semiconductor die, a semiconductor chip, or a semiconductor package such as a chip scale package. Electronic component 120 can comprise, for example, a semiconductor material such as silicon. Electronic component 120 can comprise passive elements or active elements such as one or more transistors. In some examples electronic component 120 can comprise a power device. In some examples, electronic component 120 can comprise a memory device, a digital signal processor (DSP), a microprocessor, a network processor, a power management processor, an audio processor, a radio-frequency (RF) circuit, a wireless baseband system-on-chip (SoC) processor, a sensor, or an application specific integrated circuit (ASIC).

In some examples, a height of electronic component 120 can correspond to or can be similar to a depth of cavity 111. In some examples, first terminal 121 and second terminal 122 of electronic component 120 can be substantially coplanar with leads 112 or with side 110A of substrate 110. In some examples, first terminal 121 and second terminal 122 of electronic component 120 can protrude past leads 112 or side 110A of substrate 110.

First terminal 121 can be located at the front side of electronic component 120, and can comprise or be referred to as a pad, a bond pad, a land, a wiring layer, or a metal layer. In some examples, first terminal 121 can be referred to as a source terminal. First terminal 121 can comprise an electrically conductive material, such as copper (Cu), aluminum (Al), palladium (Pd), titanium (Ti), tungsten (W), titanium/tungsten, nickel (Ni), gold (Au), or silver (Ag). First terminal 121 can be provided as an electrical contact between electronic component 120 and an external component.

Second terminal 122 can be located at the front side of electronic component 120, and can be laterally be spaced apart from first terminal 121. Second terminal 122 can comprise or be referred to as a pad, a bond pad, a land, a wiring layer, or a metal layer. In some examples, second terminal 122 can be referred to as a gate terminal. Second terminal 122 can comprise an electrically conductive material, such as copper (Cu), aluminum (Al), palladium (Pd), titanium (Ti), tungsten (W), titanium/tungsten, nickel (Ni), gold (Au), or silver (Ag). Second terminal 122 can be provided as an electrical contact between electronic component 120 and an external component.

Third terminal 123 can be located the back side of electronic component 120. In some examples, third terminal 123 can comprise or be referred as a back metal, and can cover most of the back side of electronic component 120. Third terminal 123 can comprise or be referred to as a pad, a bond pad, a land, a wiring layer, or a metal layer. In some examples, third terminal 123 can be referred to as a drain terminal. In some examples, drain 123 of electronic component 120 can be electrically coupled to paddle 113 and leads 112. Third terminal 123 can comprise one or more layers of electrically conductive material, such as copper (Cu), aluminum (Al), palladium (Pd), titanium (Ti), tungsten (W), titanium/tungsten, nickel (Ni), gold (Au), silver (Ag), or chromium (Cr), vanadium (V), or combinations such as Ti/Ni/Ag, Ti/Ni/Au, or Cr/NiV/Ag. Third terminal 123 can be provided as an electrical contact between electronic component 120 and substrate 110.

Figure 2F:
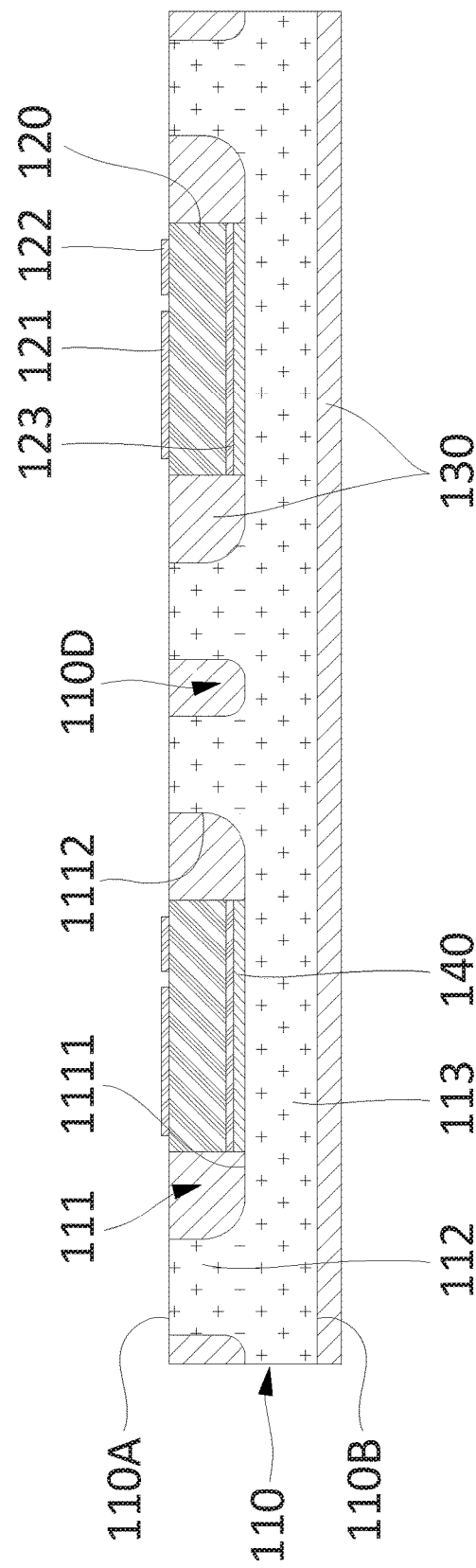

FIG. 2F shows a cross-sectional view of electronic device 100 at a later stage of manufacture. In the example shown in FIG. 2F, device encapsulant 130 can encapsulate side 110A or side 110B of substrate 110. In some examples, device encapsulant 130 can fill cavities 111 or grooves 110D at side 110A of substrate 110. Device encapsulant 130 can leave leads 112 exposed. In some examples, device encapsulant 130 can be substantially coplanar with leads 112. Device encapsulant 130 can cover lateral sides of electronic component 120 mounted within each of cavities 111 while exposing the front side of electronic component 120. Device encapsulant 130 can expose first terminal 121 and second terminal 122 at the front side of electronic component 120. In some examples, a device encapsulant 130 can be substantially coplanar with the front side of electronic component 120. In some examples, device encapsulant 130 can entirely encapsulate side 110B of substrate 110. In some examples, device encapsulant 130 does not encapsulate side 110B of substrate 110.

Device encapsulant 130 can comprise or be referred to as a mold material, a mold compound, prepreg material, or a resin. In some examples, device encapsulant 130 can comprise filler-reinforced polymer, a polymer composite material, an epoxy resin, an epoxy resin having fillers, an epoxy acrylate having fillers, or a silicone resin. Device encapsulant 130 can be formed by any of a variety of processes including, for example, a compression molding process, a vacuum lamination process, a liquid phase encapsulant molding process, or a lamination process. In some examples, device encapsulant 130 can provide protection for electronic component 120 from external elements or environmental exposure.

Figure 2G:
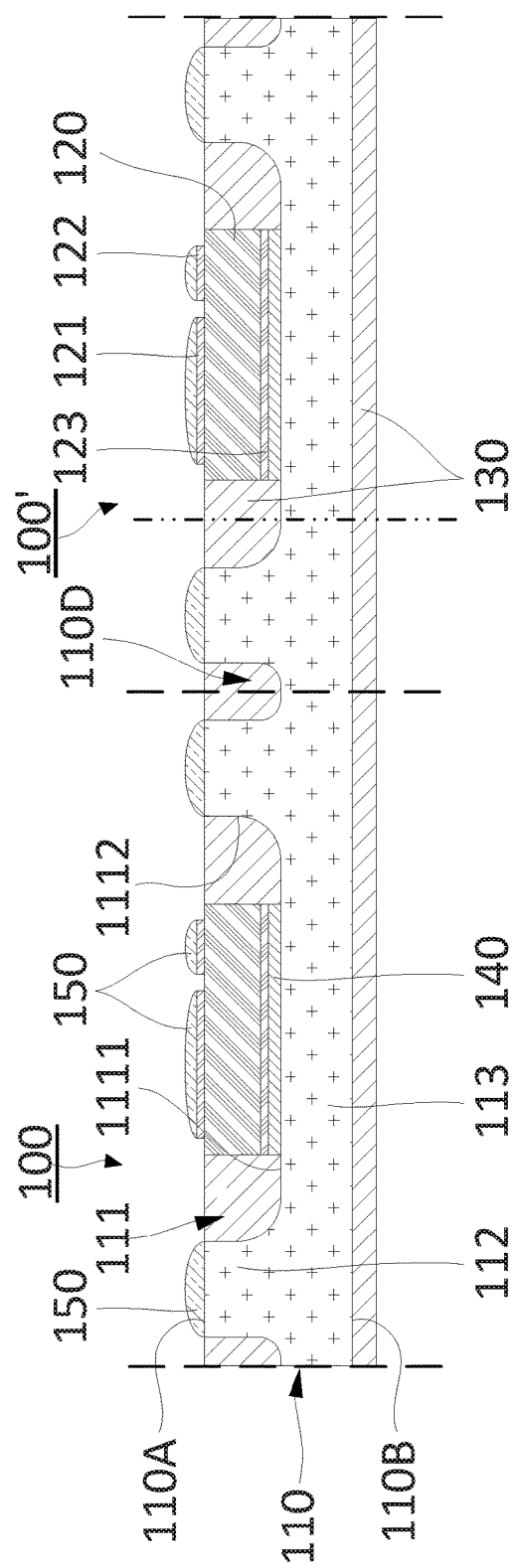

FIG. 2G shows a cross-sectional view of electronic device 100 at a later stage of manufacture. FIG. 2I shows a cross-sectional view and a bottom view of electronic device 100. In the example shown in FIG. 2G, plating 150 can be provided on leads 112, or on first terminal 121 and second terminal 122 of electronic component 120. In some examples, plating 150 can be formed on leads 112, first terminal 121, and second terminal 122, and can be exposed by device encapsulant 130. Plating 150 can be formed using, for example, electroless plating or electroplating. In some examples, plating 150 can comprise an electrically conductive material such as tin, nickel, palladium, titanium, or tungsten. In some examples, plating 150 can prevent exposed portions of leads 112 from being oxidized. In some examples, external interconnects or an external component can be electrically coupled to plating 150. Plating 150 can be provided as electrical contacts between leads 112 and the external interconnects or the external component. Plating 150 can also be provided as electrical contacts between first and second terminals 121 and 122 and the external interconnects or the external component.

In the example shown in FIG. 2G, a singulation process for separating substrates 110 can be performed. In some examples, the singulation process can be performed to separate substrates 110 from each other using a tool such as a sawing blade or laser beam. In some examples, the tool can cut device encapsulant 130 and substrate 110 along the boundary lines shown as dashed lines. The singulation tool can cut device encapsulant 130 and substrate 110 while passing through grooves 110D, and as shown in FIG. 2I, the lateral sides of paddles 113 can be exposed. In the example shown in FIG. 2I, electronic device 100, comprising substrate 110, electronic component 120, device encapsulant 130, and platings 140 and 150, can be completed. In some examples, the singulation tool can cut through substrate 110 along groove 110D and openings 110C, which can facilitate the singulation process since less substrate material is required to be cut through by the singulation tool along groove 110D and openings 110C.

In some examples, singulation can be performed at the dashed line through grooves 110D, resulting in individual electronic devices 100 as shown in FIG. 2I with leads 112 at opposite sides of each electronic device 100 (e.g., one or more leads 112 at one side electronic component 120 and another one or more leads 112 at the opposite side of electronic component 120).

In some examples, singulation can be performed at the dashed line through cavity 111, adjacent to electronic component 120, resulting in individual electronic devices 100' as shown in FIG. 2J with one or more leads 112 at one side of electronic device 100' but no lead 112 at the opposite side of electronic device 100'. In some examples yielding electronic devices 100', leads 112 or groove 110D do not need to be formed between the two electronic components 120 of FIG. 2G, and instead the two electronic components 120 can be provided in a single cavity 111 with encapsulant 130 in cavity 111 between the two electronic components 120.

Figure 2H:
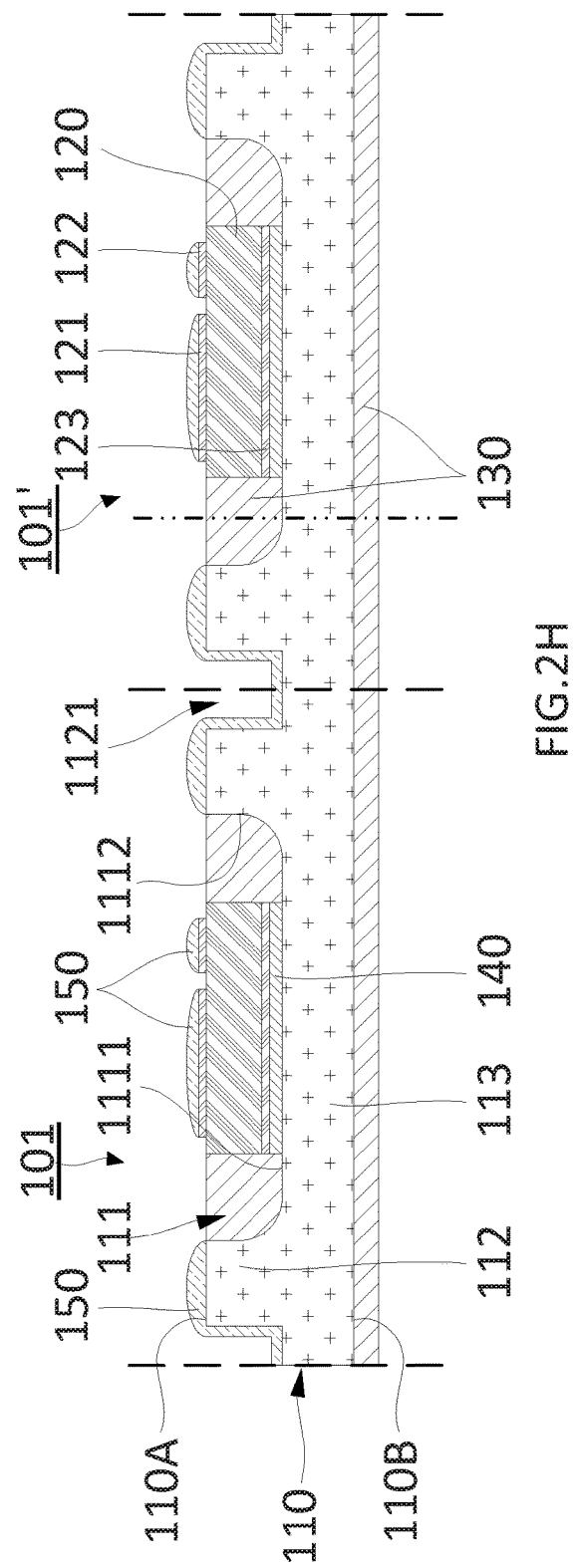
Figure 2I:
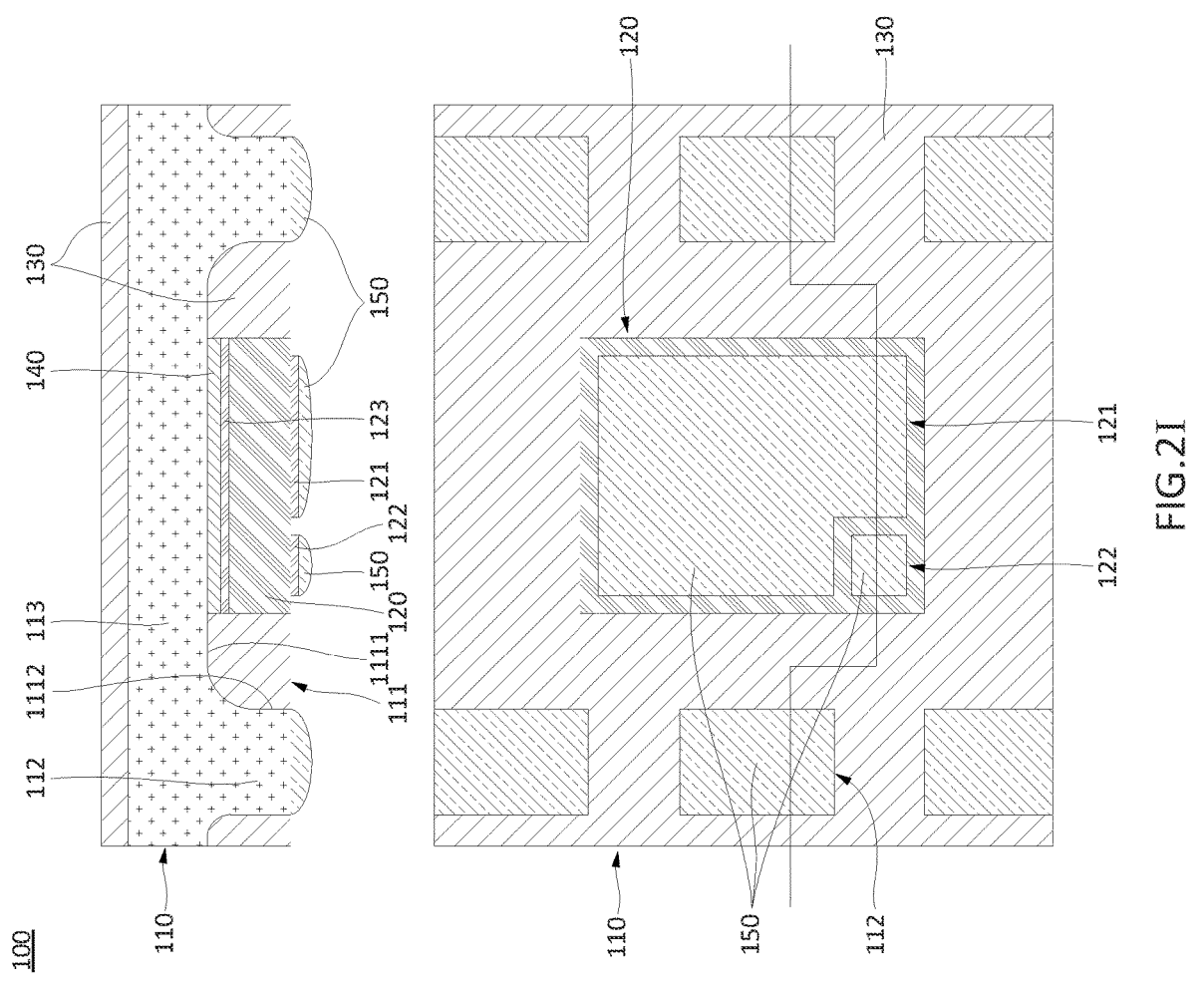

Optionally, as shown at FIG. 2H, substrate 110 can include wettable flank 1121, and the singulation process can be performed along wettable flank 1121. A wettable flank such as wettable flank 1121 can comprise or be referred as a groove or be similar to a groove, such as groove 110D, and comprises a wettable material, such as plating 150, coating its exposed surface. In some examples, wettable flank 1121 can be formed by exposing portions of lateral sides of leads 112. When wettable flank 1121 is formed, a portion of device encapsulant 130 between leads 112 can be removed. In some examples, wettable flank 1121 can be formed by removing portions of the lateral sides of leads 112 or the portion of device encapsulant 130 between leads 112 using etching. In some examples, wettable flank 1121 can be formed at leads 112 located at edges of substrate 110, as well as at leads 112 located at the boundary lines. In some examples, platings 150 can extend to the lateral sides of leads 112 exposed by wettable flank 1121. In some examples, wettable flank 1121 can include a vertical flank portion and a horizontal flank portion. Plating 150 can cover an end of a lead 112 that is exposed and free of device encapsulant 130 adjacent to wettable flank 1121, including covering the vertical flank portion and the horizontal flank portion.

Similar to FIG. 2G, in some examples, singulation can be performed at the dashed line through wettable flank 1121 resulting in individual electronic devices 101 with one or more leads 112 at opposite sides of electronic device 101 (e.g., one or more leads 112 at one side electronic component 120 and another one or more leads 112 at the opposite side of electronic component 120.

In some examples, singulation can be performed at the dashed line through cavity 111, adjacent to electronic component 120, resulting in individual electronic devices 101' with one or more leads 112 at one side of electronic device 101' but no lead 112 at the opposite side of electronic device 101'. In some examples yielding electronic device 101', leads 112 or wettable flank 1121 do not need to be formed between the two electronic components 120 of FIG. 2H, and instead the two electronic components 120 can be provided in a single cavity 111 with encapsulant 130 in cavity 111 between the two electronic components 120.

FIG. 2J shows a cross-section view and a plan view of an example electronic device 100'. The example shown in FIG. 2J shows how electronic device 100' having one or more leads 112 at one side of electronic device 100' but not at the opposite side, can be achieved by singulating along the dashed singulation line of FIG. 2G or FIG. 2H through encapsulant 130 in cavity 111. The resulting electronic device 100' can be smaller sized than the version of electronic device 100 shown in FIG. 2I.

Figure 3A:
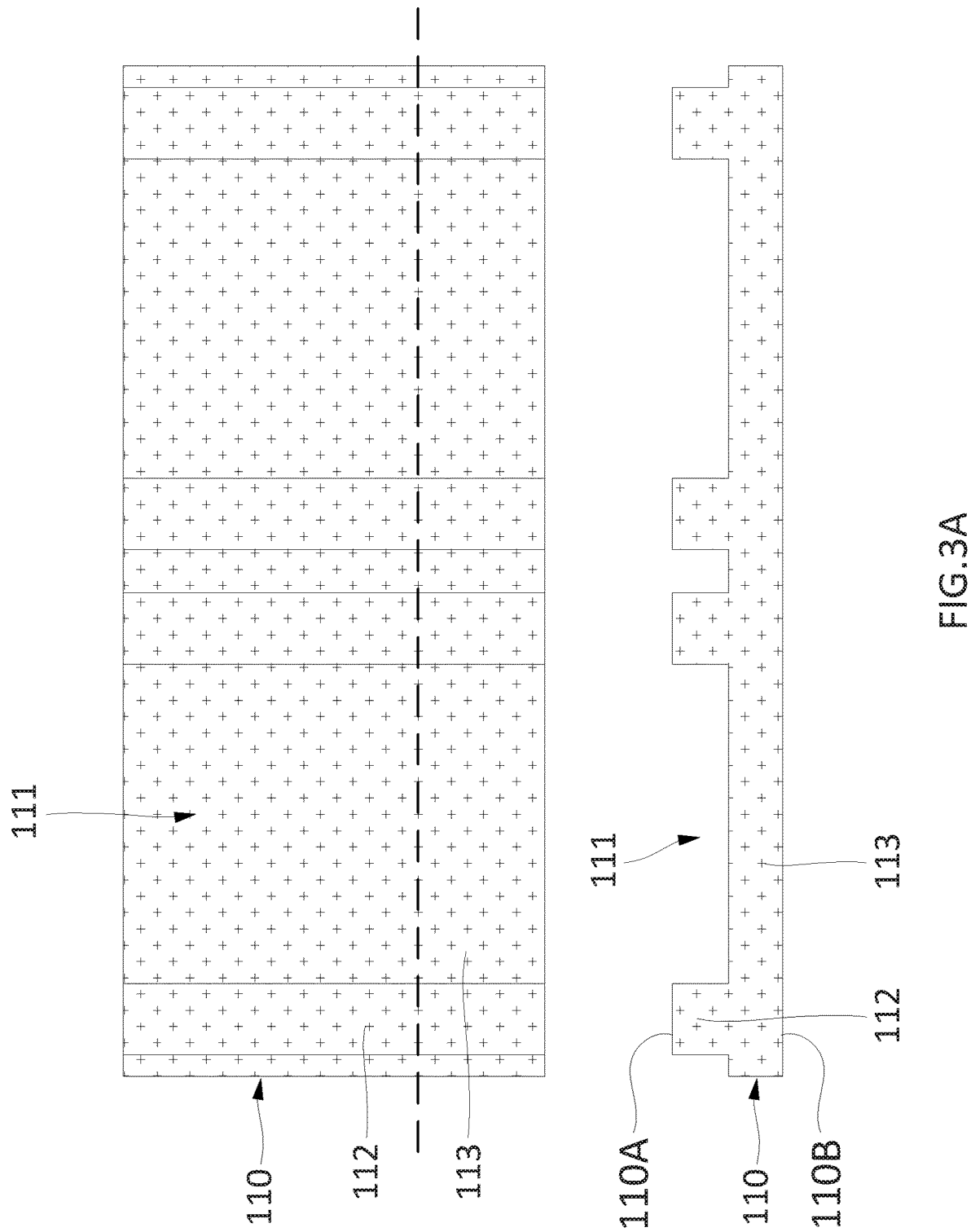

FIGS. 3A to 3B show cross-sectional views or plan views of an example method for manufacturing an example electronic device 100. In some examples, FIGS. 3A-3B can correspond to or can replace the stages of FIGS. 2A-2C, and an assembly process similar to that described for FIGS. 2D-2I can continue from FIG. 3B.

FIG. 3A shows a plan view and a cross-sectional view of electronic device 100 at an initial stage of manufacture. In the example shown in FIG. 3A, substrate 110 comprising cavities 111, leads 112 and paddles 113 can be prepared. In some examples, substrate 110 can be formed to have various thicknesses through extrusion forming or by stamping. For example, portions of substrate 110 where leads 112 can be formed to have larger thickness, and portions of substrate 110 where paddles 113 can be formed to have smaller thickness. In some examples, substrate 110 can be formed to have leads 112, paddles 113 and cavities 111 by pushing a substrate material, for example a metallic material such as copper, a copper alloy, nickel, a nickel alloy, iron or an iron-nickel alloy, through a die hole having a section of a desired shape. Cavities 111 can be defined by top portions of paddles 113 and lateral sides of leads 112. In some examples, substrate 110 can comprise or be referred to as a lead frame or a dual gauge lead frame. Substrate 110 formed through extrusion forming allows a process for forming cavities 111 to be skipped, and thus can simplify the manufacturing process.

FIG. 3B shows a cross-sectional view of electronic device 100 at a later stage of manufacture. In the example shown in FIG. 3B, openings 110C can be formed in substrate 110 through a patterning or punching process. Openings 110C can be formed to pass through substrate 110. In some examples, after performing the patterning process of FIG. 3B, electronic device 100 can be formed by performing processes shown in FIGS. 2D to 2I.

Figure 4:
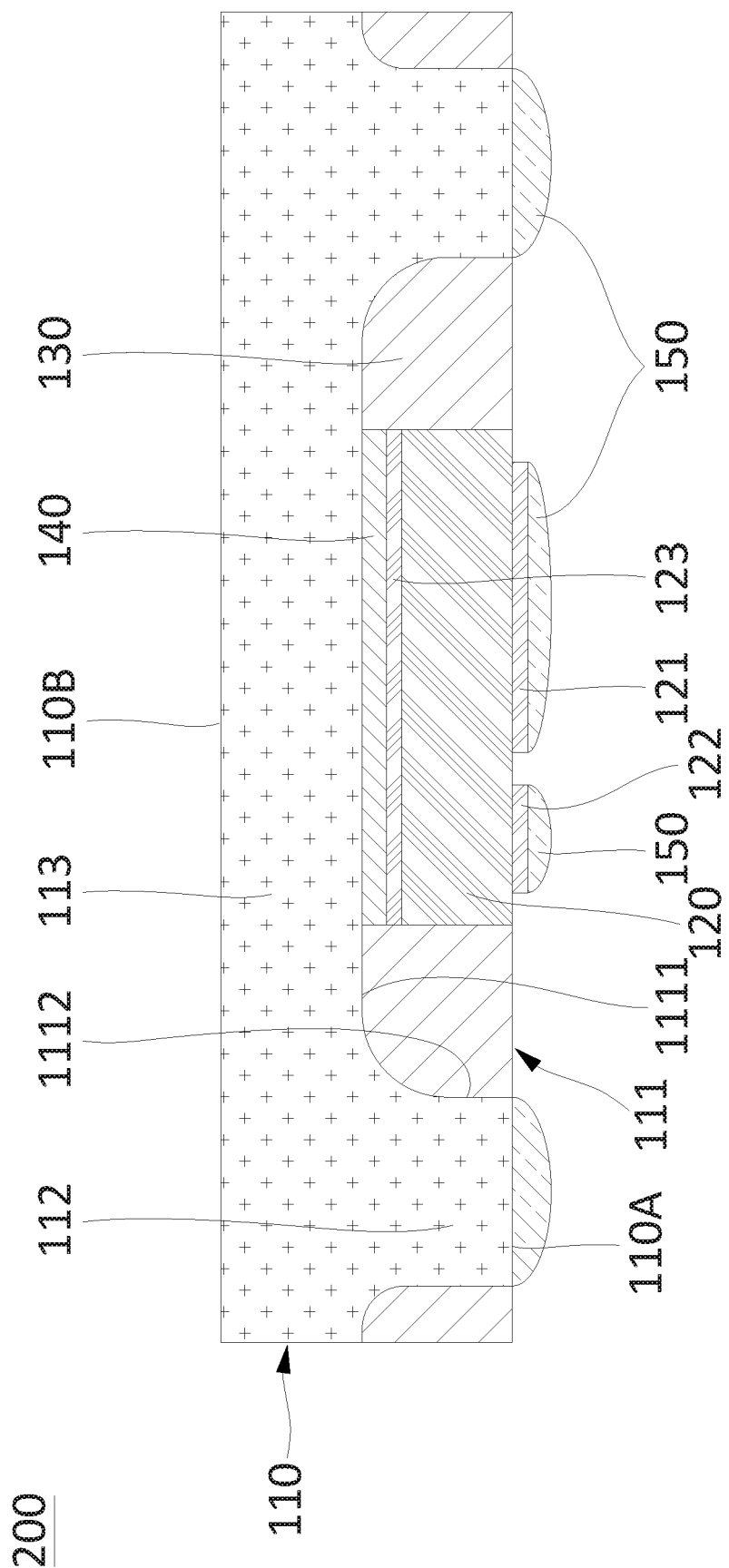
FIG. 4 shows a cross-sectional view of an example electronic device.

FIG. 4 shows a cross-sectional view of an example electronic device 200. In the example shown in FIG. 4, electronic device 200 can comprise substrate 110, electronic component 120, device encapsulant 130, and platings 140 and 150.

In the present example, device encapsulant 130 can expose side 110B of substrate 110. In some examples, device encapsulant 130 is formed without ever covering side 110B of substrate 110. In some examples, electronic device 200 can be formed by removing encapsulant 130 covering side 110B of substrate 110 from electronic device 100 shown in FIG. 1. In some examples, encapsulant 130 located on side 110B of substrate 110 can be removed by etching or grinding. In some examples, device encapsulant 130 can be located in cavities 111 of substrate 110 to encapsulate the lateral sides of electronic component 120, while exposing sides 110A and 110B of substrate 110 and the front side of electronic component 120. In some examples, side 110B of substrate 110 can remain exposed to release heat generated from electronic component 120.

Figure 5:
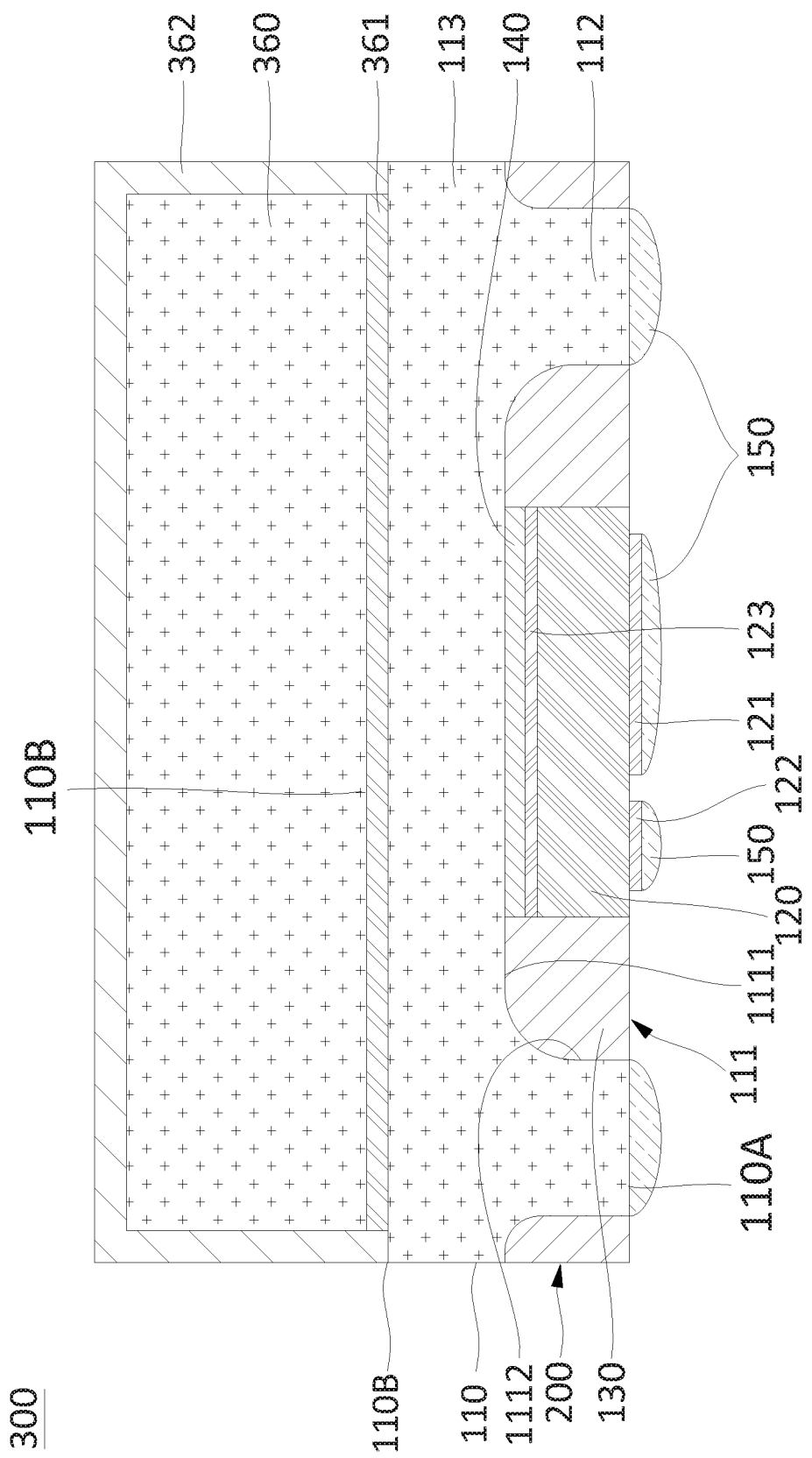
FIG. 5 shows a cross-sectional view of an example electronic device.

FIG. 5 shows a cross-sectional view of an example electronic device 300. In the example shown in FIG. 5, electronic device 300 can comprise substrate 110, electronic component 120, device encapsulant 130, platings 140 and 150, and heat sink 360.

In some examples, electronic device 300 can comprise corresponding elements, features, materials, or formation processes similar to those of electronic device 200 previously described. In the present example, electronic device 300 can comprise electronic device 200 and heat sink 360 coupled to electronic device 200.

In some examples, heat sink 360 can comprise or be referred to as a heat spreader, and can comprise a highly thermally conductive material such as copper or aluminum. Heat sink 360 can increase the thermal capacity of electronic device 300 to be operable at elevated temperatures, such as above 175° C. In some examples, an area of heat sink 360 can substantially correspond to an area of substrate 110, such that sidewalls of heat sink 360 can be adjacent to or substantially coplanar to the perimeter or sidewalls of electronic device 200. In some examples, the area of heat sink 360 can be less than the area of substrate 110, such that one or more sidewalls of heat sink 360 can be recessed within the perimeter of electronic device 200, or such that one or more sidewalls of heat sink 360 can form a step with side 110B of substrate 110. In some examples, heat sink 360 can serve to release the heat generated from electronic component 120 to the environment. Heat sink 360 can be attached to side 110B of substrate 110. In some examples, heat sink 360 can be attached to side 110B of substrate 110 using interface material 361. Heat sink 360 can have a thickness of about 200 μm or more.

In some examples, interface material 361 can comprise or be referred to as an adhesive, a thermal interface material, an adhesion film, or an adhesion tape. In some examples, interface material 361 can comprise a thermocurable adhesive, a photocurable adhesive, or a non-curable adhesive, for example a rubber-based adhesive, an acryl-based adhesive, a vinyl alkyl ether-based adhesive, a silicon-based adhesive, a polyester-based adhesive, a polyimide-based adhesive, or an urethan-based adhesive. In some examples, interface material 361 can comprise conductive material, for example solder, a paste containing metal, or a sintered material. In some examples, interface material 361 can be similar in terms of material or structure to interface 140. In some examples, interface material 361 can transfer the heat generated from substrate 110 to heat sink 360.

In some examples, heat sink 360 can be coupled with side 110B of substrate 200 opposite to cavity 111, and optionally coating 362 can be included to cover a portion of heat sink 360. In some examples, coating 362 can cover the sidewalls of heat sink 360. In some examples, coating 362 can cover the top side of heat sink 360. In some examples, coating 362 can extend to cover a portion of side 110B of substrate 200. In some examples, coating 362 can comprise a conductive material or an insulating material. For example, coating 362 can comprise a conductive material such as tin, nickel, palladium, titanium, or tungsten, or an insulating material such as mold compound, epoxy, a polymer, polyimide (PI), polypropylene (PP), or polyethylene (PE). In some examples, coating 362 can prevent heat sink 360 from being oxidized. In some examples, coating 362 can prevent heat sink 360 and an external component from electrically contacting each other. In some examples, coating 362 can be formed using plating, chemical vapor deposition (CVD), physical vapor deposition (PVD), atomic layer deposition (ALD), low pressure chemical vapor deposition (LPCVD), plasma enhanced chemical vapor deposition (PECVD), sheet lamination, printing, molding, spin coating, spray coating, sintering, or evaporating.

Figure 6:
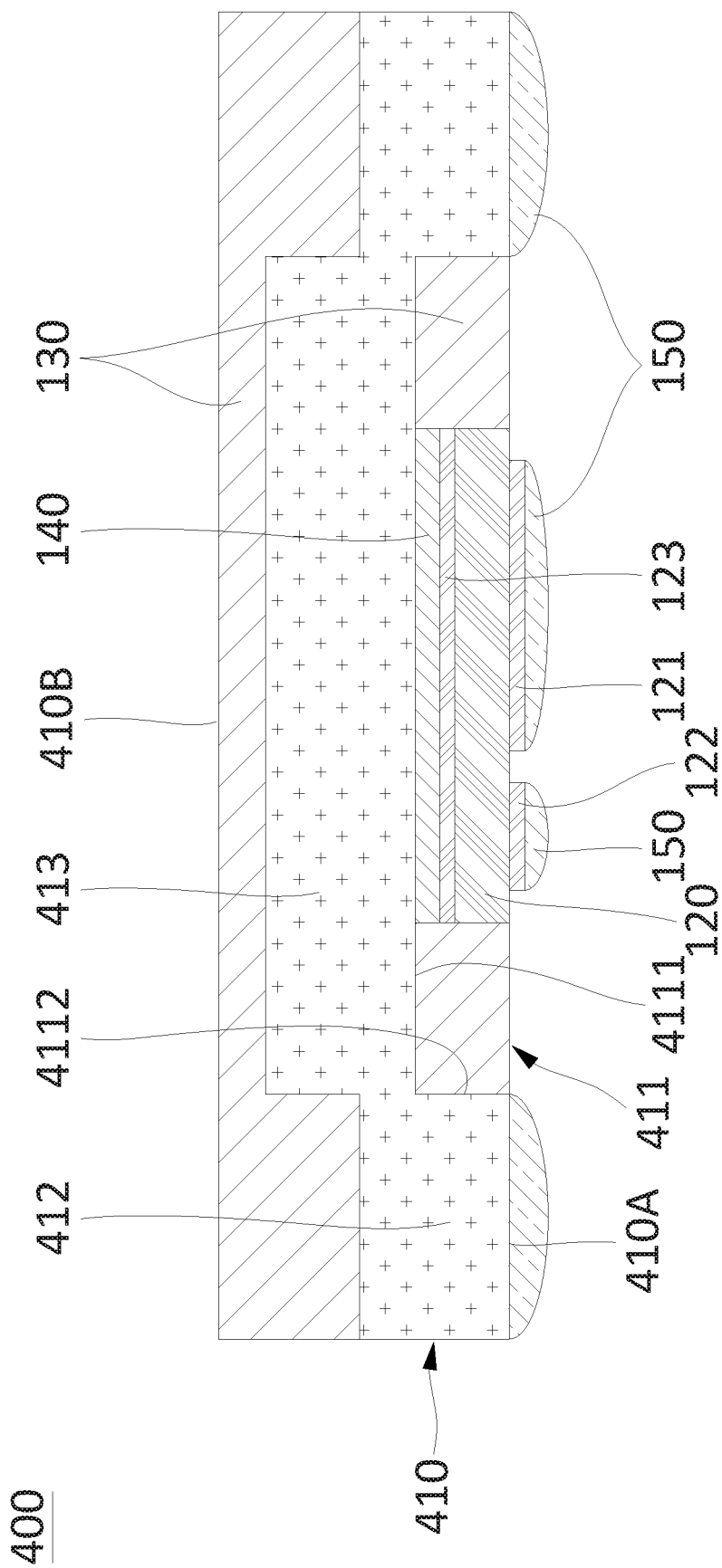
FIG. 6 shows a cross-sectional view of an example electronic device.

FIG. 6 shows a cross-sectional view of an example electronic device 400. In the example shown in FIG. 6, electronic device 400 can comprise substrate 410, electronic component 120, device encapsulant 130, and platings 140 and 150.

Substrate 410 can comprise cavity 411, leads 412, and paddle 413. Cavity 411 can comprise cavity base 4111 and cavity wall 4112. A gate-down configuration is presented for electronic device 100, where gate 122 of electronic component 120 faces downward or away from substrate 410 as shown in FIG. 6. In some examples, cavity 411 can comprise an angular or cornered transition from cavity base 4111 to cavity wall 4112.

Substrate 410, device encapsulant 130, and platings 140 and 150 can be referred to as a semiconductor package or a package, and can provide protection for electronic component 120 from external elements or environmental exposure. The semiconductor package can provide an electrical coupling between an external component and electronic component 120.

Figure 7A:
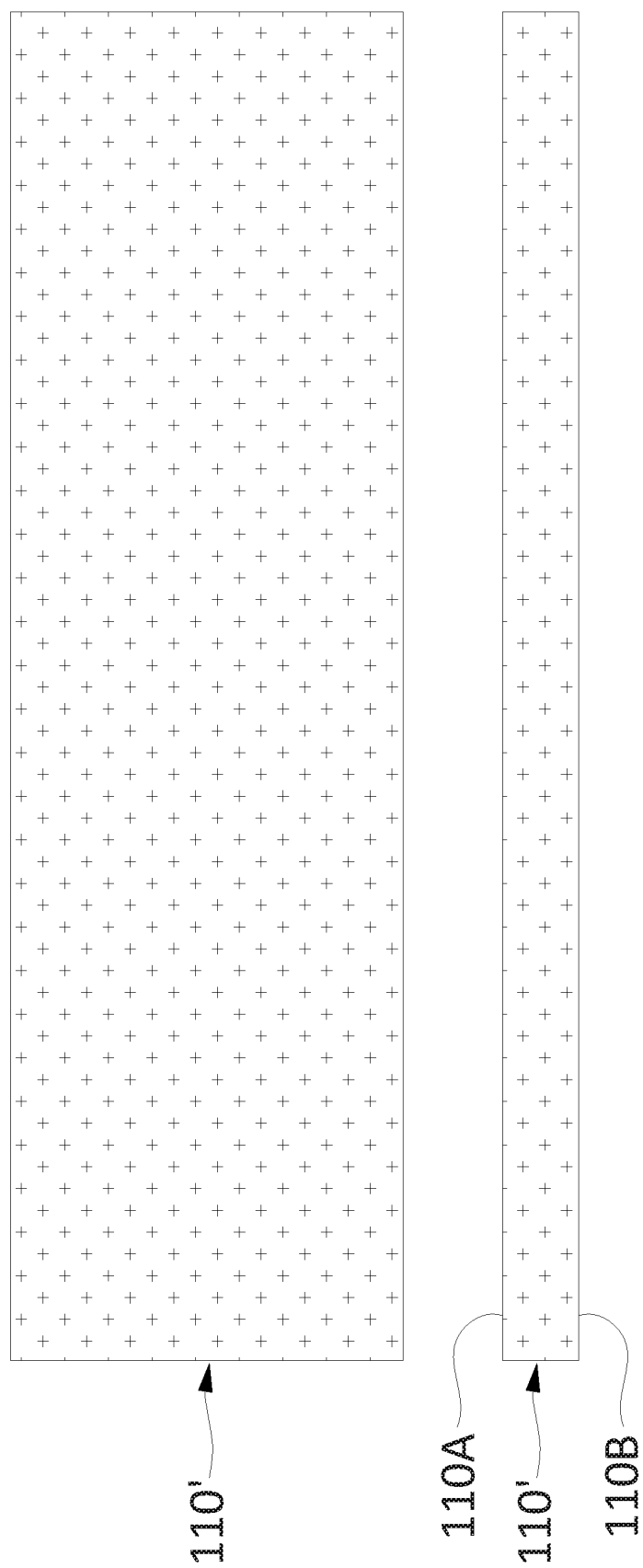

FIGS. 7A to 7H show cross-sectional views or plan views of an example method for manufacturing an example electronic device 400. FIG. 7A shows a plan view and a cross-sectional view of electronic device 400 at an early stage of manufacture. In some examples, features or elements in the stage of FIG. 7A can be similar to corresponding ones in the stage of FIG. 2A. In the example shown in FIG. 7A, raw substrate 110' having side 110A and second side 110B opposite to side 110A can be prepared. Raw substrate 110' can be transitioned to or referred as substrate 410 through subsequent processing.

Figure 7B:
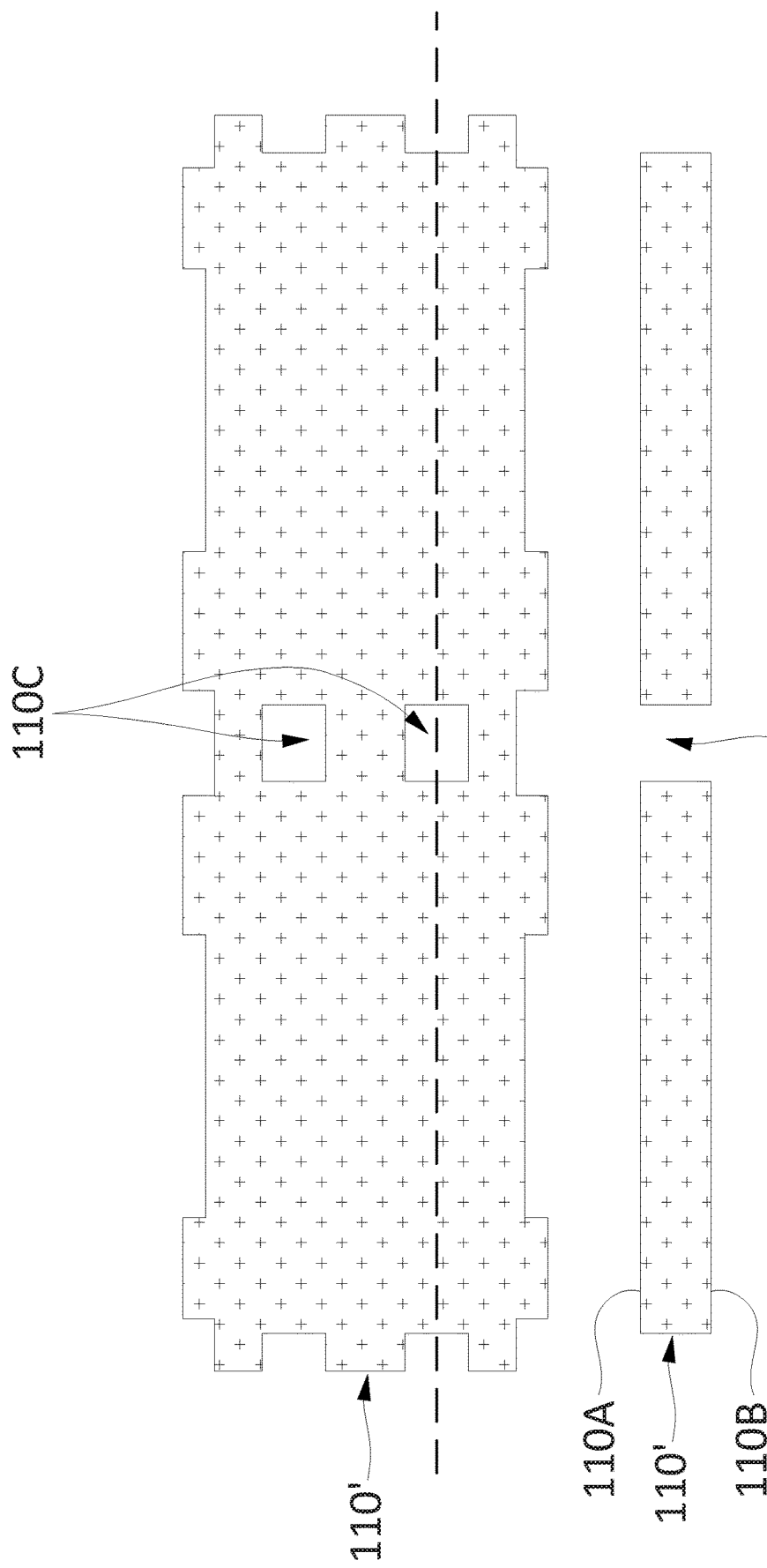

FIG. 7B shows a plan view and a cross-sectional view of electronic device 400 at a later stage of manufacture. In some examples, features or elements in the stage of FIG. 7B can be similar to corresponding ones in the stage of FIG. 2B. In the example shown in FIG. 7B, openings 110C can be formed in raw substrate 110' through a patterning process or a punching or stamping process. In some examples, openings 110C can be formed by removing portions of raw substrate 110' by stamping or punching raw substrate 110' with a punch tool or die.

FIG. 7C shows a plan view and a cross-sectional view of electronic device 400 at a later stage of manufacture. In some examples, features or elements in the stage of FIG. 7C can be similar to corresponding ones in the stage of FIG. 2C. In the example shown in FIG. 7C, cavities 411 can be formed at side 410A of substrate 410. In some examples, cavities 411 can be formed by stamping or partial-punching side 410A of substrate 410. For example, substrate 410 can be placed on a stamping die and then stamped using a punch, so portions of substrate 410 are displaced downward to form cavities 411. Each of the cavities 411 can provide for a space where electronic component 120 can be mounted. Cavity 411 can comprise cavity base 4111 and cavity wall 4112. Cavity base 4111 can be a side where electronic component 120 is mounted. In some examples, cavity base 4111 can be a surface of paddle 413. Cavity wall 4112 can be defined by lateral sides of leads 412 facing cavity base 4111. In some examples, cavity wall 4112 can be defined while the portions of substrate 410 are displaced downward as the result of the action of the punch. In some examples, cavity wall 4112 can be substantially perpendicular to cavity base 4111, or can form an obtuse angle with respect to cavity base 4111.

In the example shown in FIG. 7C, substrate 410 comprising cavities 411, leads 412 and paddles 413 can be formed by stamping or partial-punching substrate 410. In some examples, leads 412, paddles 413 and cavities 411 can be simultaneously formed by stamping or partial-punching. Leads 412 and paddles 413 can be electrically coupled to each other. In some examples, substrate 410 can comprise or be referred to as a lead frame or a stamped lead frame.

Leads 412 can protrude from paddle 413. Leads 412 can be made of the same material as substrate 410, for example, copper. Leads 412 can be provided as electrically coupling paths between substrate 410 and an external component. Leads 412 can be positioned outside cavity 411 where electronic component 120 is mounted. Leads 412 can be simultaneously formed with cavities 411 and paddles 413. In some examples, leads 412 can be portions and are not pressed by a punch. In some examples, leads 412 can have a thickness similar to the thickness of paddle 413. In some examples, a difference in the height between paddles 413 and leads 412 can correspond to a depth of each of cavities 411. Paddles 413 and leads 412 can be integral with each other, defined by a single piece of material of substrate 410.

Figure 7D:
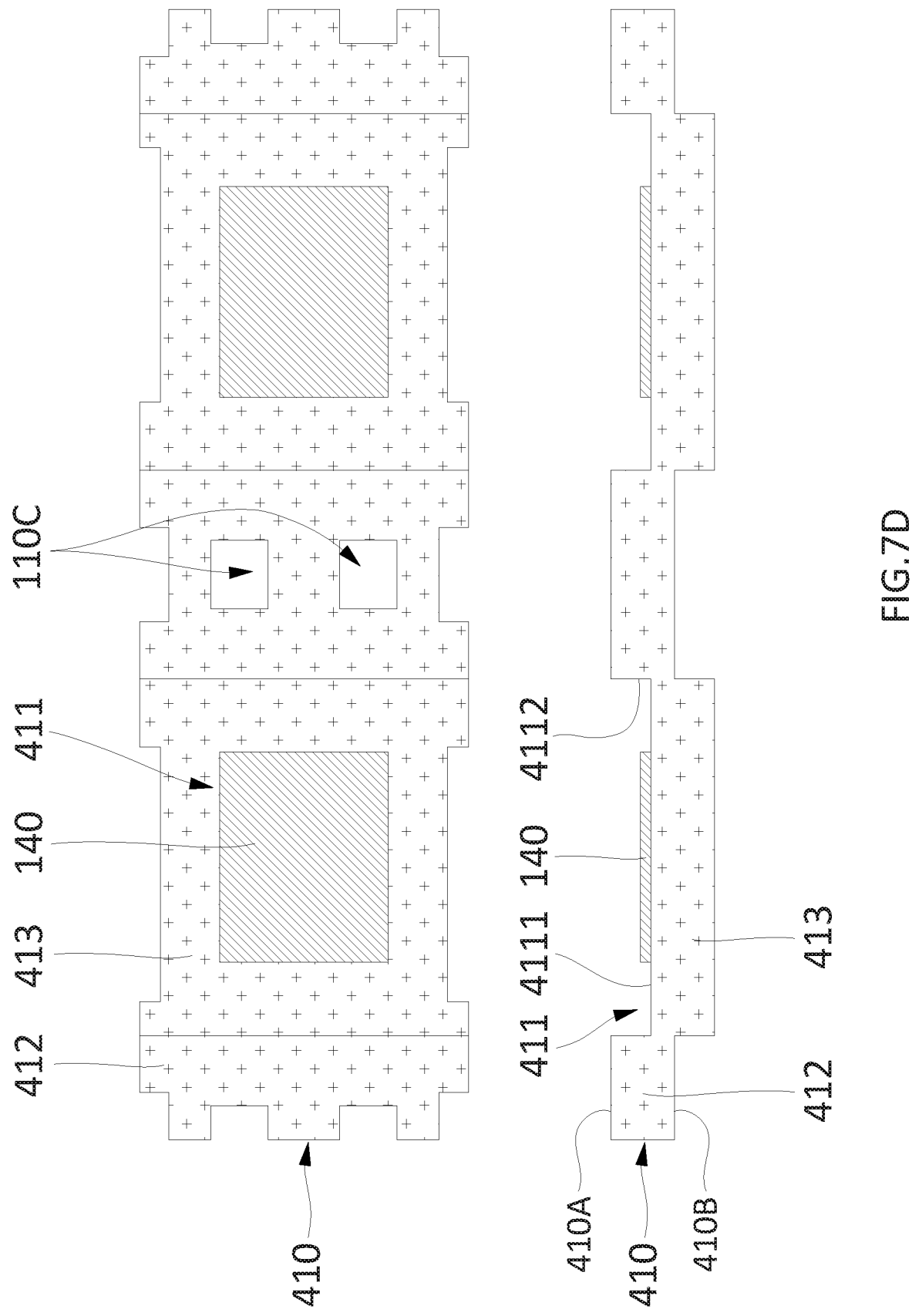

FIG. 7D shows a plan view and a cross-sectional view of electronic device 400 at a later stage of manufacture. In some examples, features or elements in the stage of FIG. 7D can be similar to corresponding ones in the stage of FIG. 2D. In the example shown in FIG. 7D, interface 140 can be provided on paddles 413 within cavities 411, such as on cavity base 4111.

Figure 7E:
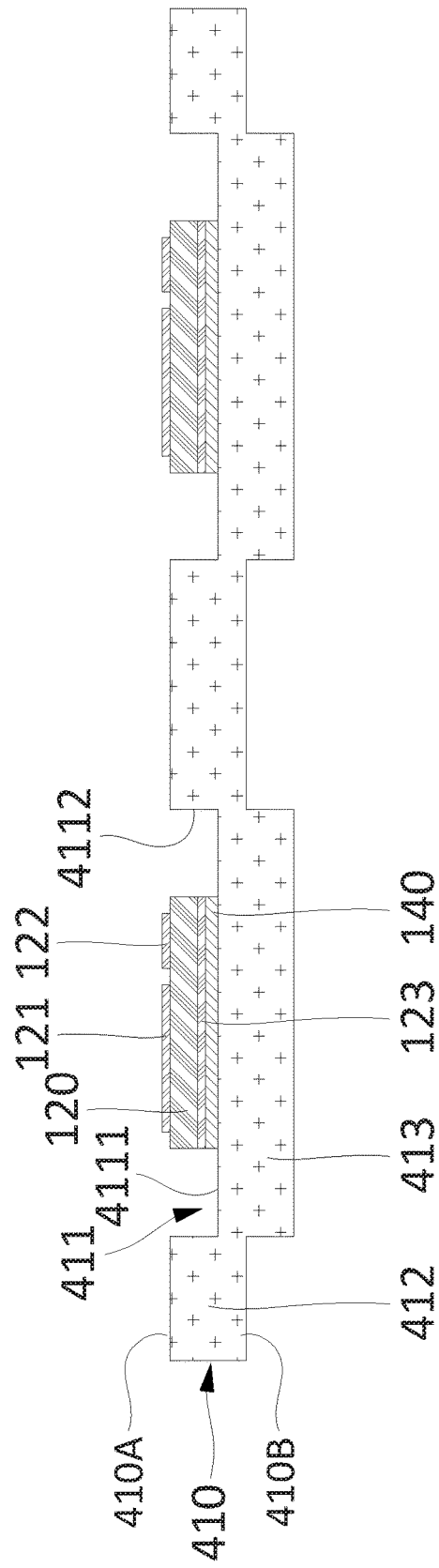

FIG. 7E shows a cross-sectional view of electronic device 100 at a later stage of manufacture. In some examples, features or elements in the stage of FIG. 7E can be similar to corresponding ones in the stage of FIG. 2E. In the example shown in FIG. 7E, electronic component 120 can be coupled with substrate 410 through interface 140. Electronic component 120 can be received in each of cavities 411. Electronic component 420 can comprise a front side having first terminal 121 and second terminal 122, and a back side having third terminal 123. Electronic component 120 can be attached on paddle 413, with third terminal 123 coupled to interface 140. Electronic component 120 can be attached onto paddles 113 to allow first terminal 121 and second terminal 122 to face upward. In some examples, first terminal 121 and second terminal 122 can be exposed.

Figure 7F:
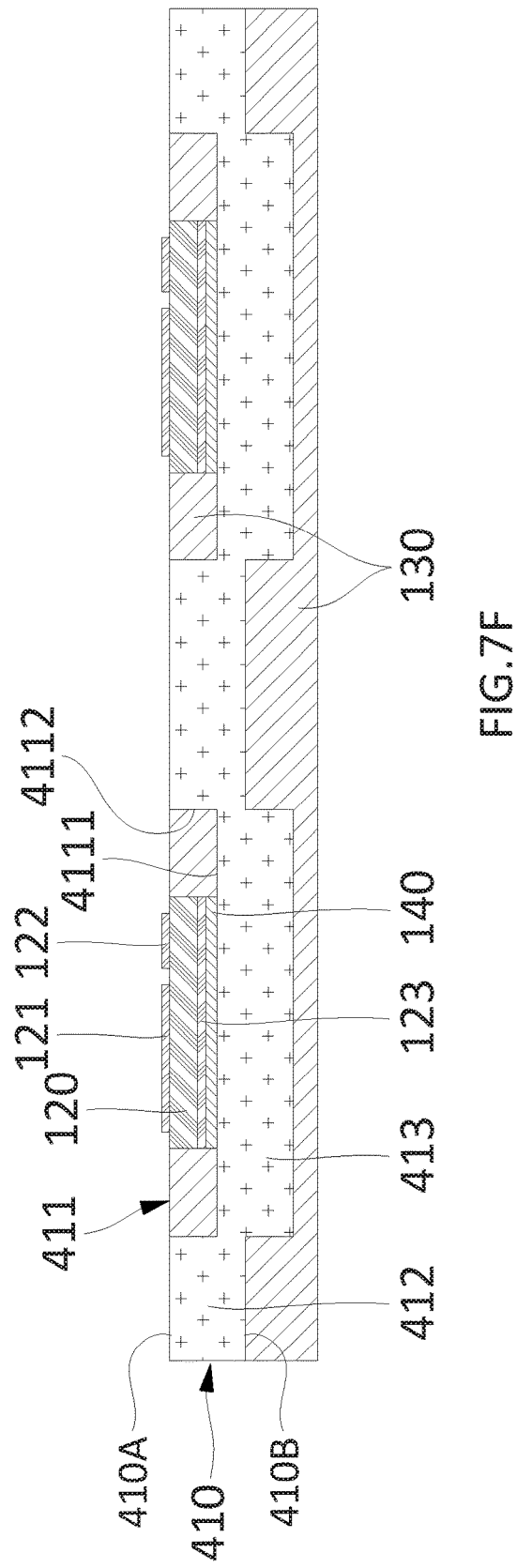

FIG. 7F shows a cross-sectional view of electronic device 400 at a later stage of manufacture. In some examples, features or elements in the stage of FIG. 7F can be similar to corresponding ones in the stage of FIG. 2F. In the example shown in FIG. 7F, device encapsulant 130 can encapsulate sides 410A and 410B of substrate 410. In some examples, device encapsulant 130 can fill cavities 411 at side 410A of substrate 410. Device encapsulant 130 can leave leads 412 exposed at side 410A of substrate 410. In some examples, device encapsulant 130 can be substantially coplanar with leads 412 at side 410A of substrate 410. Device encapsulant 130 can cover lateral sides of electronic component 120 mounted within each of cavities 411 while exposing the front side of electronic component 120. In some examples, device encapsulant 130 can entirely encapsulate the side 410B of substrate 410.

Figure 7G:
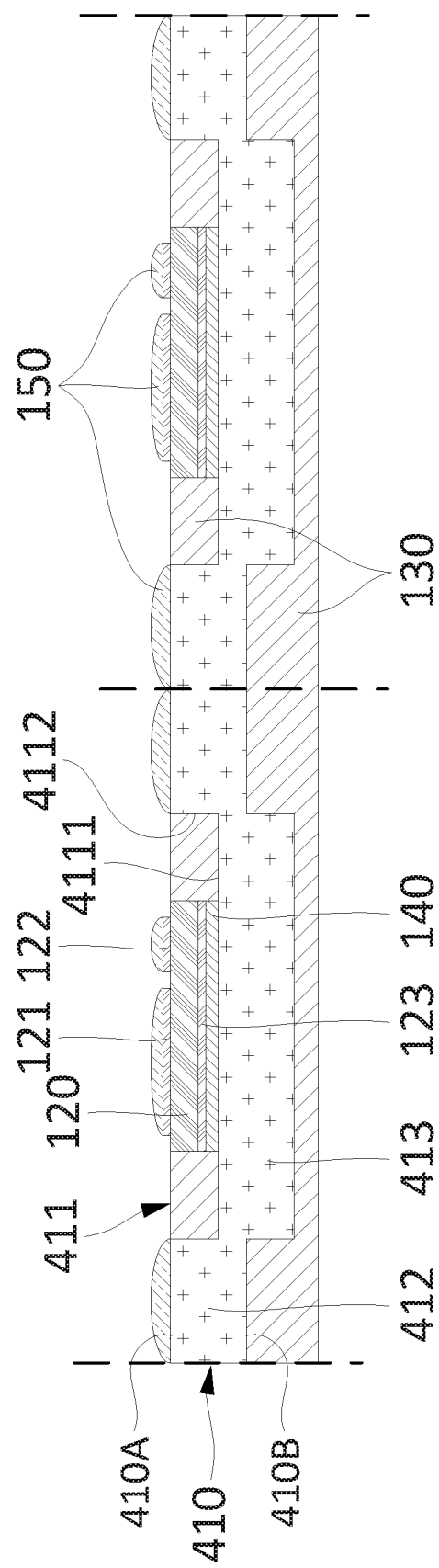
Figure 7H:
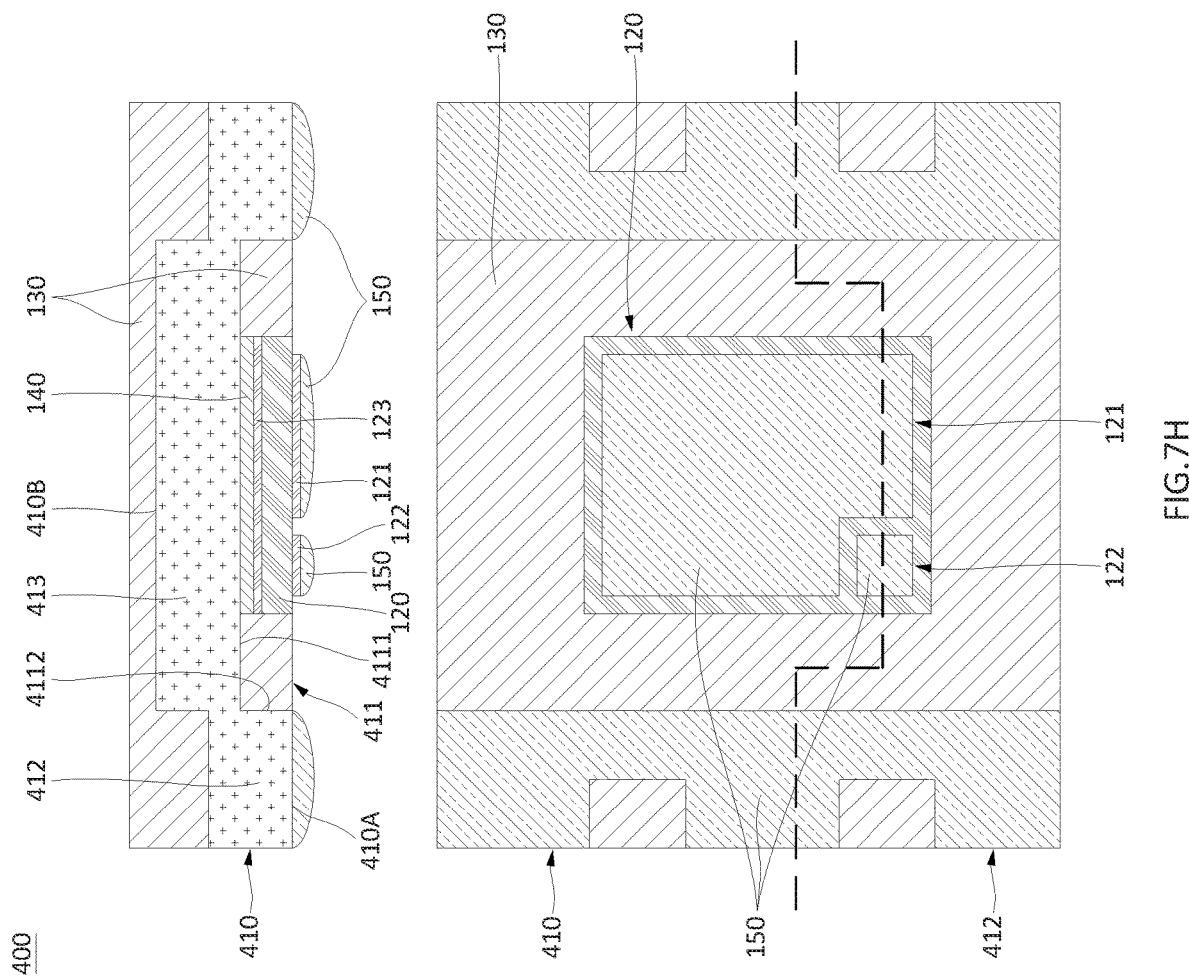

FIG. 7G shows a cross-sectional view of electronic device 400 at a later stage of manufacture. FIG. 7H shows a cross-sectional view and a bottom view of electronic device 400. In some examples, features or elements in the stages of FIGS. 7G-7H can be similar to corresponding ones in the stages of FIGS. 2G-2I. In the example shown in FIG. 7G, plating 150 can be formed on leads 412, or on first terminal 121 and second terminal 122 of electronic component 120. In some examples, plating 150 can prevent exposed portions of leads 412 from being oxidized. In some examples, plating 150 can be provided as electrical contacts between leads 412 and external interconnects or the external component.

In the example shown in FIG. 7G, a singulation process for separating substrates 410 can be performed. In some examples, the singulation process can be performed to separate substrates 410 from each other using a sawing tool such as a diamond blade or laser beam. In some examples, the sawing tool can cut device encapsulant 130 and substrate 410 along the boundary lines, for example the dashed lines. As shown in FIG. 7H, lateral sides of leads 412 can be exposed. In some examples, a process similar to that described with respect to FIG. 2H can be used to provide wettable flanks 1121 for electronic device 400. In the example shown in FIG. 7H, electronic device 400 comprising substrate 410, electronic component 120, device encapsulant 130, and platings 140 and 150 can be completed.

Figure 8:
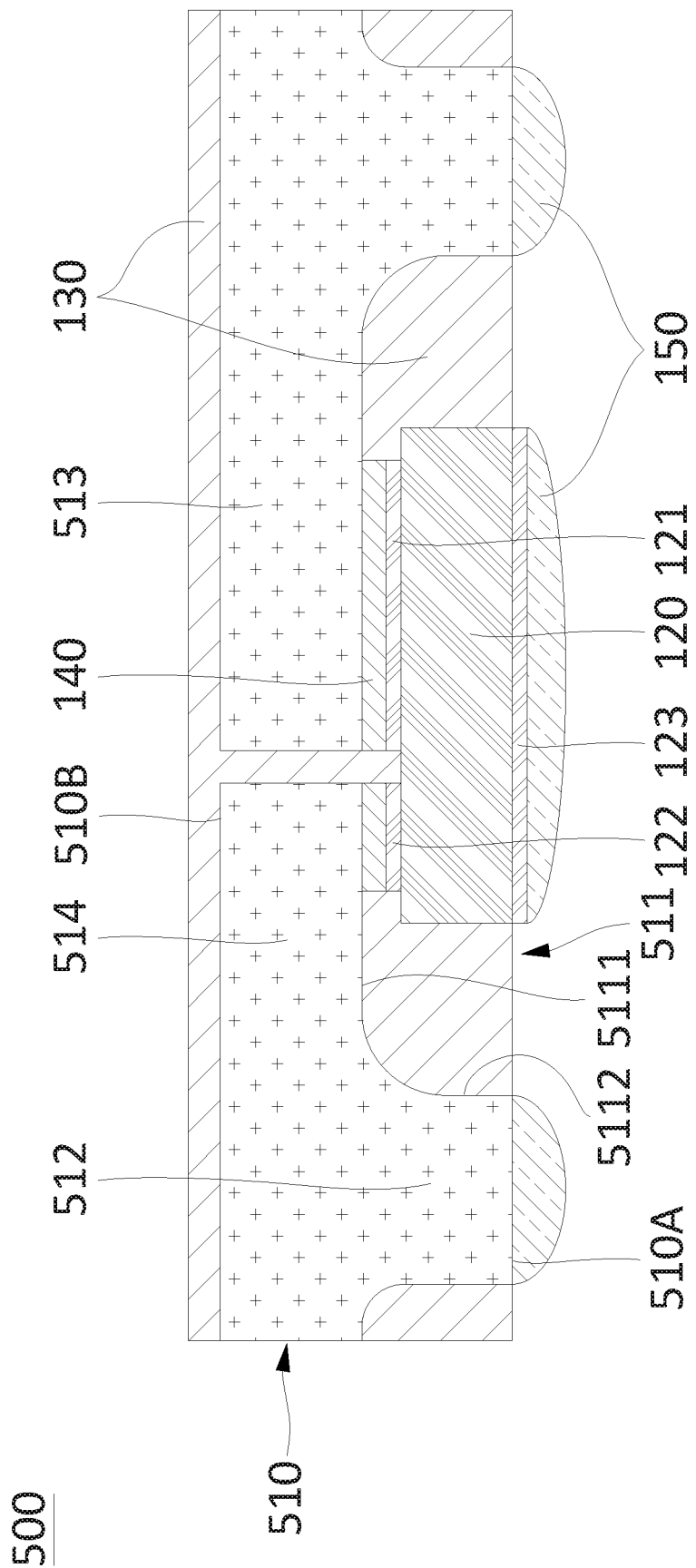
FIG. 8 shows a cross-sectional view of an example electronic device.

FIG. 8 shows a cross-sectional view of an example electronic device 500. In the example shown in FIG. 8, electronic device 500 can comprise substrate 510, electronic component 120, device encapsulant 130, and platings 140 and 150.

Substrate 510 can comprise cavity 511, leads 512, paddle 513, and traces 514. Cavity 511 can comprise cavity base 5111 and cavity wall 5112. A gate-up configuration is presented for electronic device 500, where gate 122 of electronic component 120 faces upward or towards substrate 510 as shown in FIG. 5. In some examples, gate-up configuration can be referred as internal-gate configuration. In some examples, paddle 513 can be coupled with terminal 121, and trace 514 can be coupled with terminal 122. Terminal 123 can be exposed at the cavity side of substrate 510. In some examples, device encapsulant 130 can be between trace 514 and paddle 513.

Substrate 510, device encapsulant 130, and platings 140 and 150 can be referred to as a semiconductor package or a package, and can provide protection for electronic component 120 from external elements or environmental exposure. The semiconductor package can provide an electrical coupling between an external component and electronic component 120.

FIGS. 9A to 9J show cross-sectional views or plan views of an example method for manufacturing an example electronic device 500. In some examples, features or elements in the stages of FIG. 9 can be similar to corresponding ones in the stages of FIG. 2.

Figure 9A:
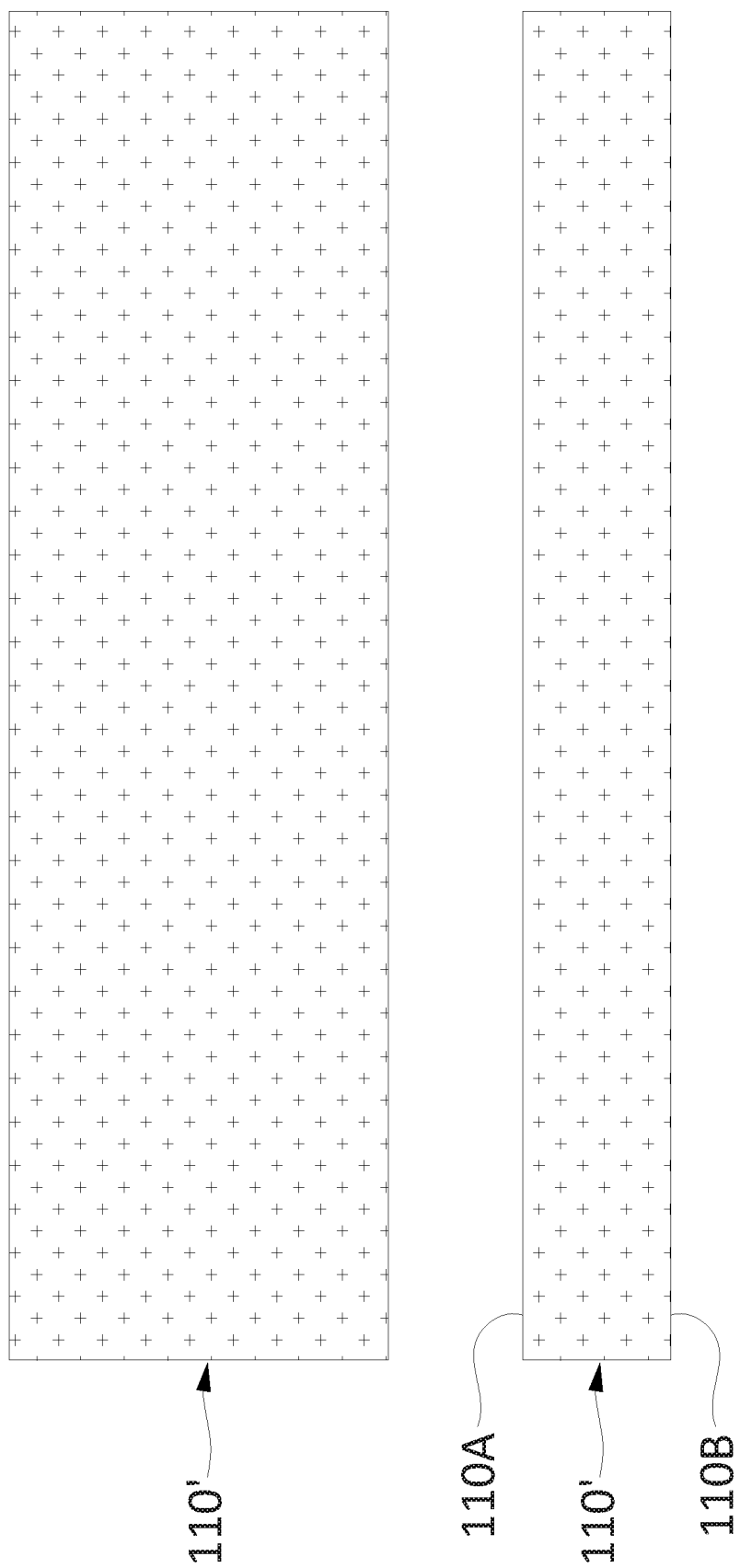

FIG. 9A shows a plan view and a cross-sectional view of electronic device 500 at an initial stage of manufacture. In some examples, features or elements in the stage of FIG. 9A can be similar to corresponding ones in the stage of FIG. 2A. In the example shown in FIG. 9A, raw substrate 110' having first side 110A and second side 110B opposite to first side 110A can be prepared. Raw substrate 110' can be transitioned to or referred as substrate 510 through subsequent processing.

Figure 9B:
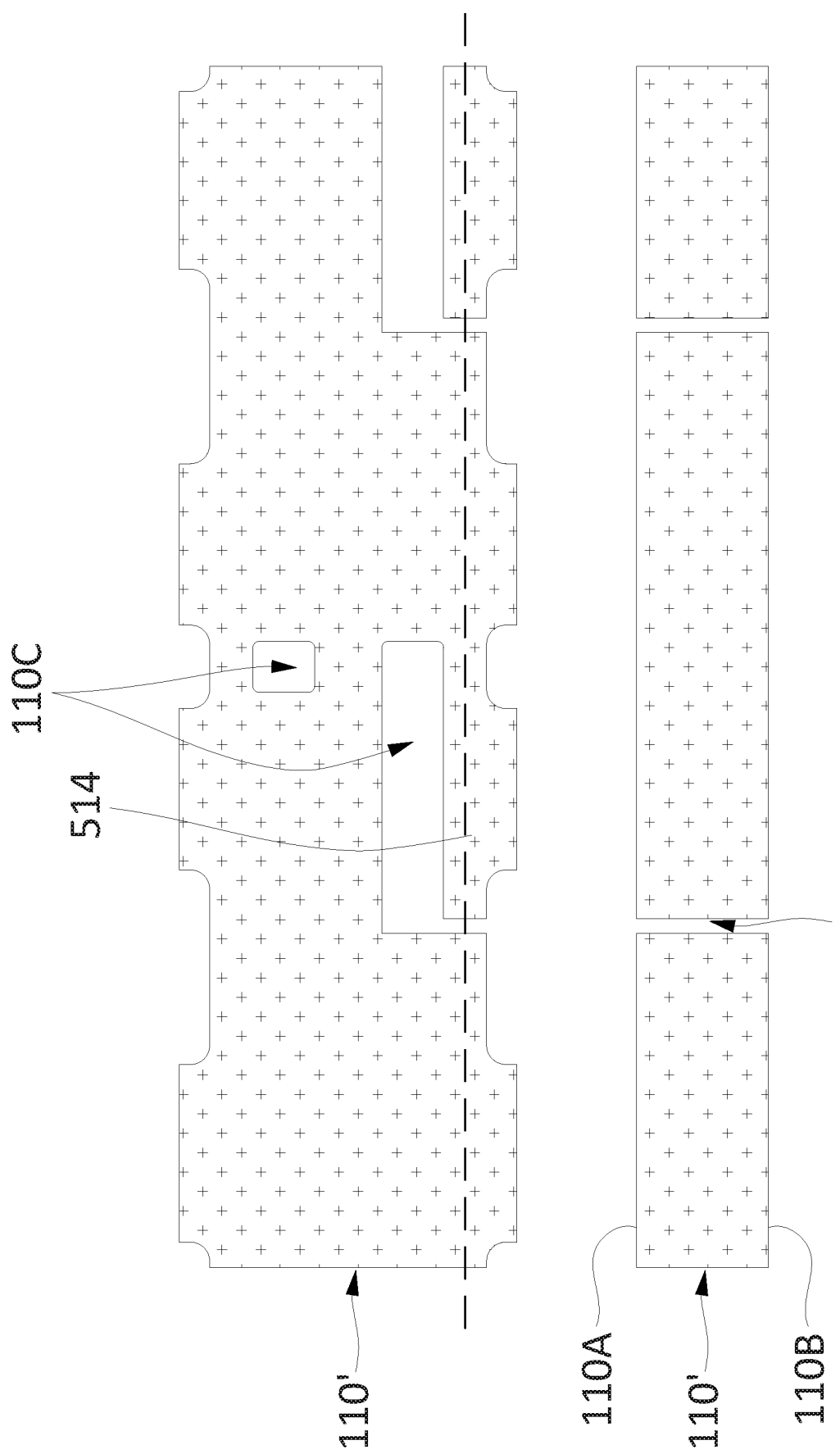

FIG. 9B shows a plan view and a cross-sectional view of electronic device 500 at a later stage of manufacture. In some examples, features or elements in the stage of FIG. 9B can be similar to corresponding ones in the stage of FIG. 2B. In the example shown in FIG. 9B, openings 110C can be formed in raw substrate 110'. In some examples, openings 110C can be formed by etching portions of raw substrate 110'. In some examples, one or more openings 110C can be patterned to isolate adjacent portions of substrate 510, or to define conductive paths, such as traces 514.

Figure 9C:
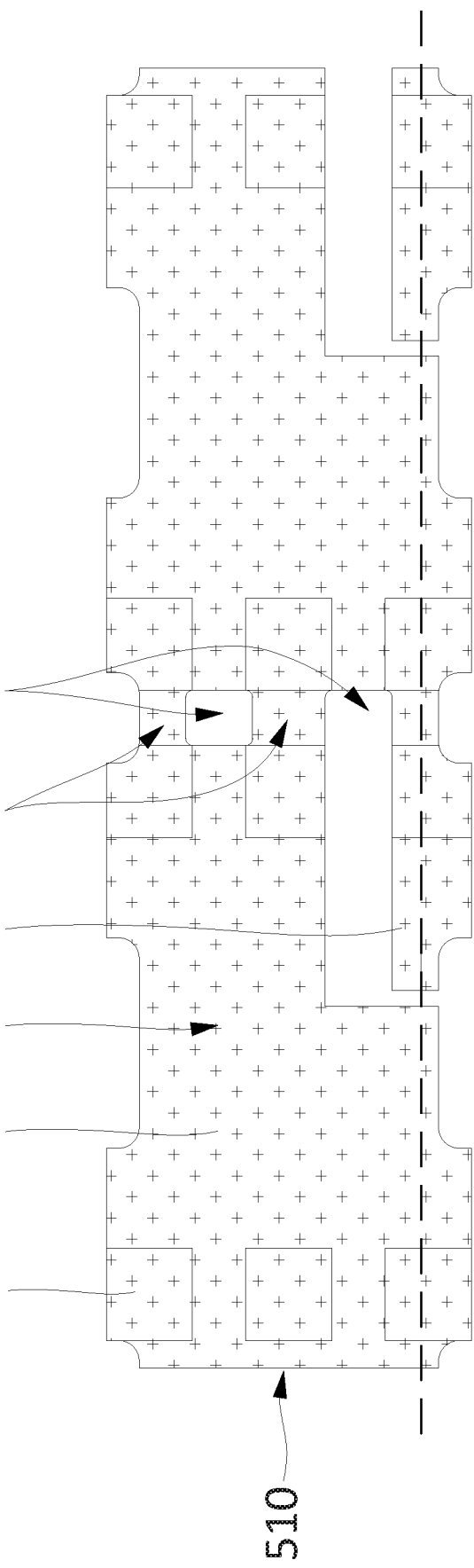
Figure 9C:
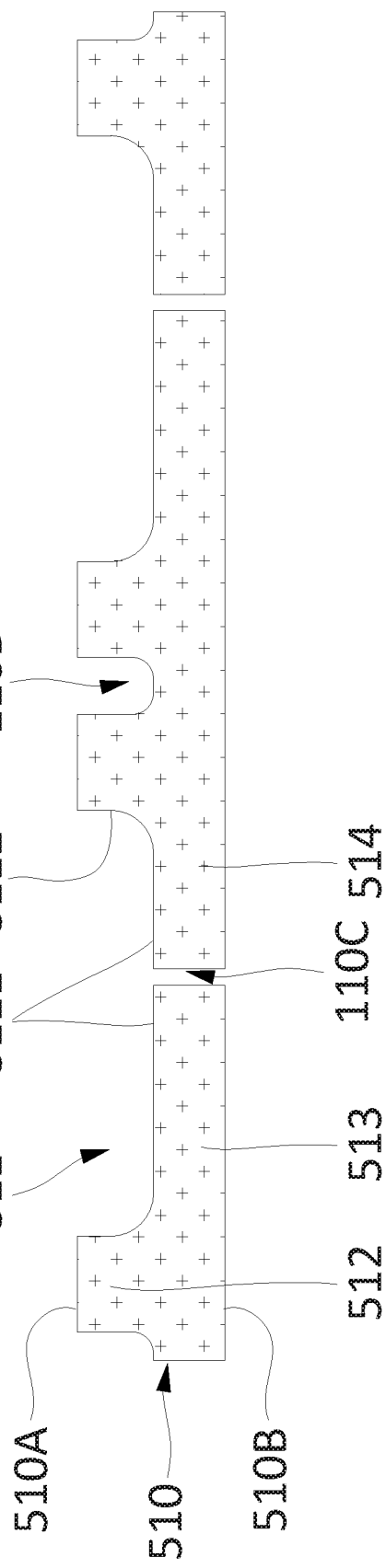

FIG. 9C shows a plan view and a cross-sectional view of electronic device 500 at a later stage of manufacture. In some examples, features or elements in the stage of FIG. 9C can be similar to corresponding ones in the stage of FIG. 2C. In the example shown in FIG. 9C, cavities 511 can be formed at side 110A of substrate 510. In some examples, cavities 511 can be formed by partial-etching side 110A of substrate 510. In some examples, cavities 511 can comprise corresponding elements, features, materials, or formation processes similar to those of cavities 111 previously described. Cavities 511 can be formed on paddles 513 and traces 514. In some examples, each of cavities 511 can comprise cavity base 5111 and cavity wall 5112. Cavity base 5111 can be a surface where electronic component 120 is mounted. In some examples, cavity base 5111 can define a surface of paddle 513 and a surface of trace 514. Cavity wall 5112 can be defined by lateral sides of leads 512 facing cavity base 5111.

In some examples, grooves 110D can be formed by partial-etching substrate 510. In some examples, grooves 110D can be simultaneously formed with cavities 511. In some examples, grooves 110D can define lateral sides of leads 512. In some examples, grooves 110D can facilitate a singulation process.

In the example shown in FIG. 9C, substrate 510 comprising cavities 511, leads 512, paddles 513, and traces 514, can be formed by partial-etching substrate 510. In some examples, substrate 510 can comprise or be referred to as a lead frame or an etched lead frame.

In some examples, leads 512 can comprise corresponding elements, features, materials, or formation processes similar to those of leads 112 previously described. Leads 512 can protrude from paddles 513 and traces 514. In some examples, leads 512 located on paddles 513 and leads 512 located on traces 514 can be electrically disconnected from each other. Leads 512 can be provided as electrically coupling paths between substrate 510 and an external component. In some examples, substrate 510 can include a lead 512 coupled with trace 514 on one side of cavity 511, and multiple leads 512 coupled with paddle 513 on another side of cavity 511, or on the same side of cavity 511. When electronic component 120 is in cavity 511 as shown for example in FIG. 9E, lead 512 coupled with trace 514 and multiple leads 512 coupled with paddle 513 can be at different lateral sides of electronic component 120, or at the same lateral side of electronic component.

In some examples, paddles 513 can comprise corresponding elements, features, materials, or formation processes similar to those of paddles 113 previously described. A portion of electronic component 120 can be mounted on paddle 513. In some examples, a portion of paddle 513 can define a portion of cavity base 5111. Paddle 513 can be separated from trace 514 by openings 110C. In some examples, areas of paddles 513 can be larger than those of traces 514.

In some examples, traces 514 can comprise or be referred to as islands. A portion of electronic component 120 can be mounted on trace 514. A portion of trace 514 can define a portion of cavity base 5111. Traces 514 can be separated from paddles 513 by openings 110C. One or more leads 512 can be formed on each of traces 514. In some examples, to shorten paths of openings 110C patterned, traces 514 can be formed at edges of substrate 510. In some examples, an area of each of traces 514 can be smaller than each of paddles 513.

Figure 9D:
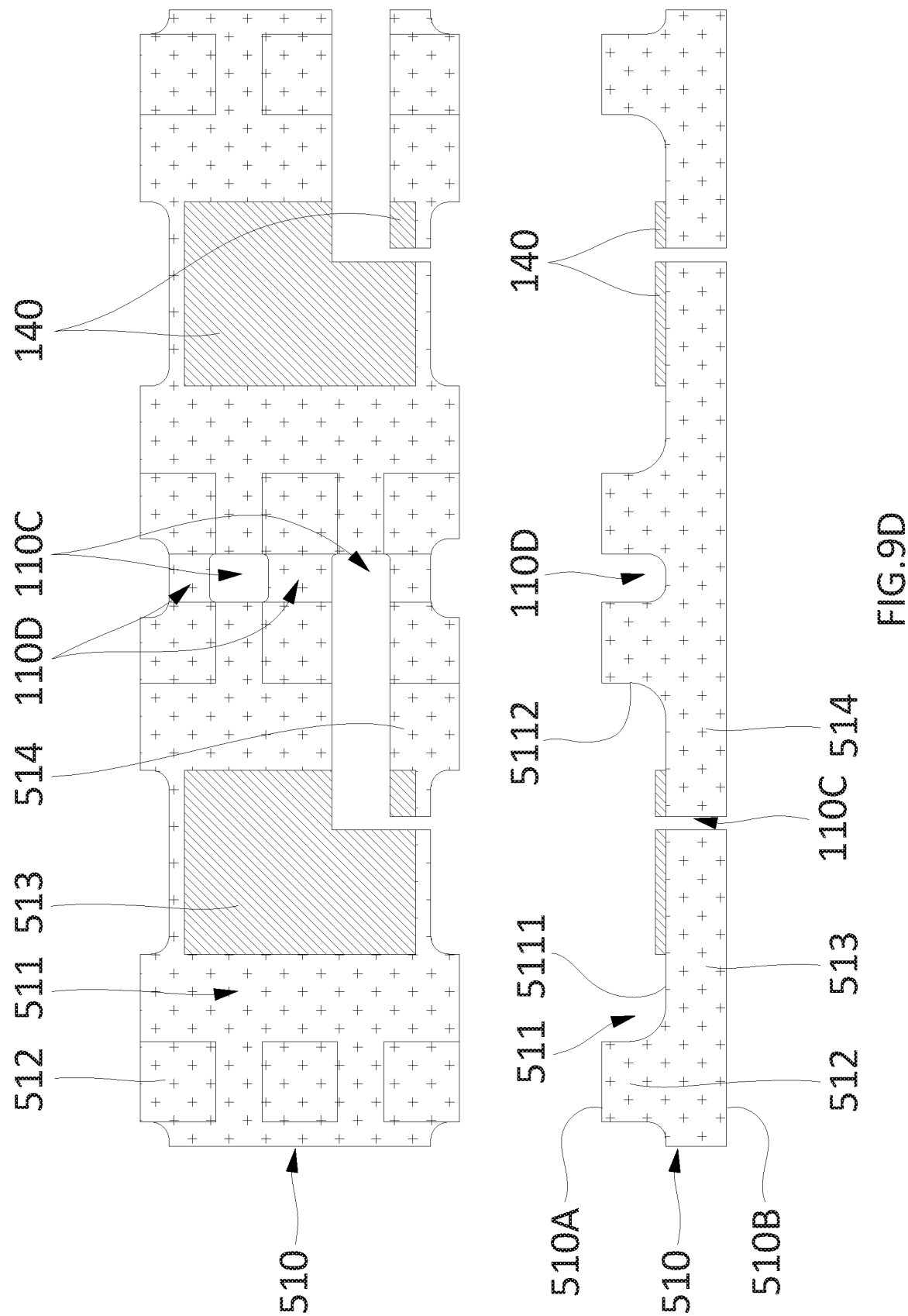

FIG. 9D shows a plan view and a cross-sectional view of electronic device 500 at a later stage of manufacture. In some examples, features or elements in the stage of FIG. 9D can be similar to corresponding ones in the stage of FIG. 2D. In the example shown in FIG. 9D, interface 140 can be formed on paddles 513 and traces 514 located within cavities 511. In some examples, interface 140 can be formed on cavity base 5111. Since each of openings 110C is formed between each of paddles 513 and each of traces 514, an area of interface 140 can be smaller than electronic component 120.

Figure 9E:
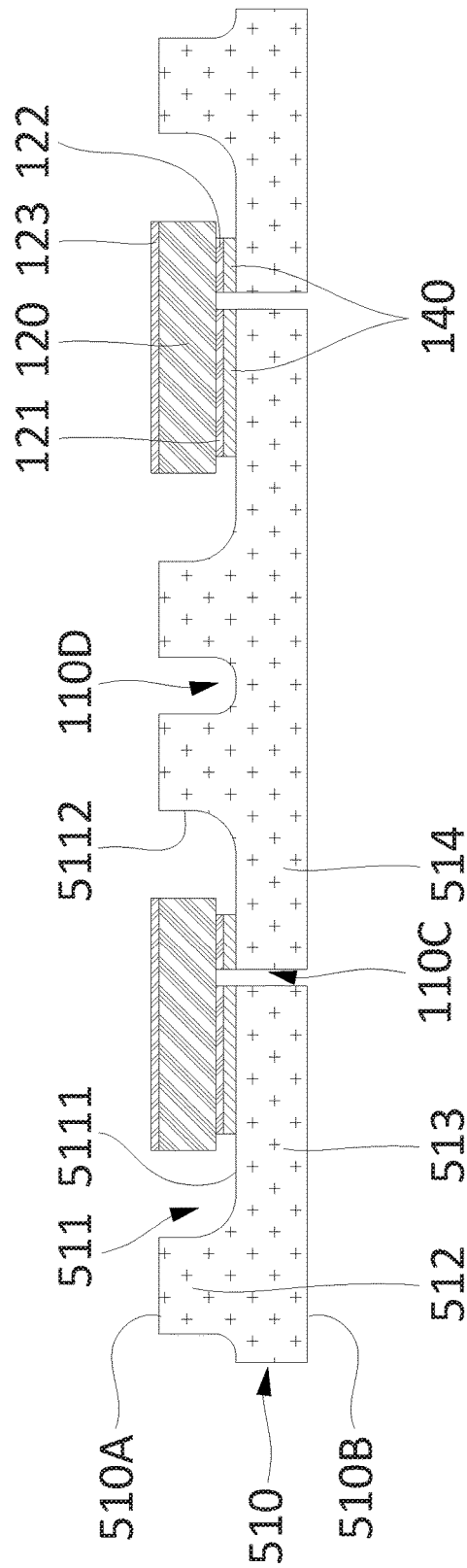

FIG. 9E shows a cross-sectional view of electronic device 500 at a later stage of manufacture. In some examples, features or elements in the stage of FIG. 9E can be similar to corresponding ones in the stage of FIG. 2E. In the example shown in FIG. 9E, electronic component 120 can be attached to interface 140. In some examples, electronic component 120 can be attached to interface 140 through an interface material. Electronic component 120 can be mounted on paddle 513 and trace 514, and can be received in cavity 511. In some examples, most of electronic component 120 can be positioned on paddle 513 and a portion of electronic component 120 can be positioned on trace 514 across opening 110C.

Electronic component 120 can be received in cavity 511 to such that first terminal 121 and second terminal 122 to contact interface 140, and such that third terminal 123 faces away from substrate 510. First terminal 121 can be electrically coupled to interface 140 of paddle 513. In some examples, source 121 of electronic component 120 can be electrically coupled to paddle 513. In some examples, first terminal 121 can be provided as an electrical contact between electronic component 120 and substrate 510. Second terminal 122 can be electrically coupled to interface 140 of trace 514. In some examples, gate 122 of electronic component 120 can be electrically coupled to trace 514. In some examples, second terminal 122 can be provided as an electrical contact between electronic component 120 and substrate 510. Third terminal 123 can be exposed from substrate 510. In some examples, third terminal 123 can be provided as an electrical contact between electronic component 120 and an external component.

Figure 9F:
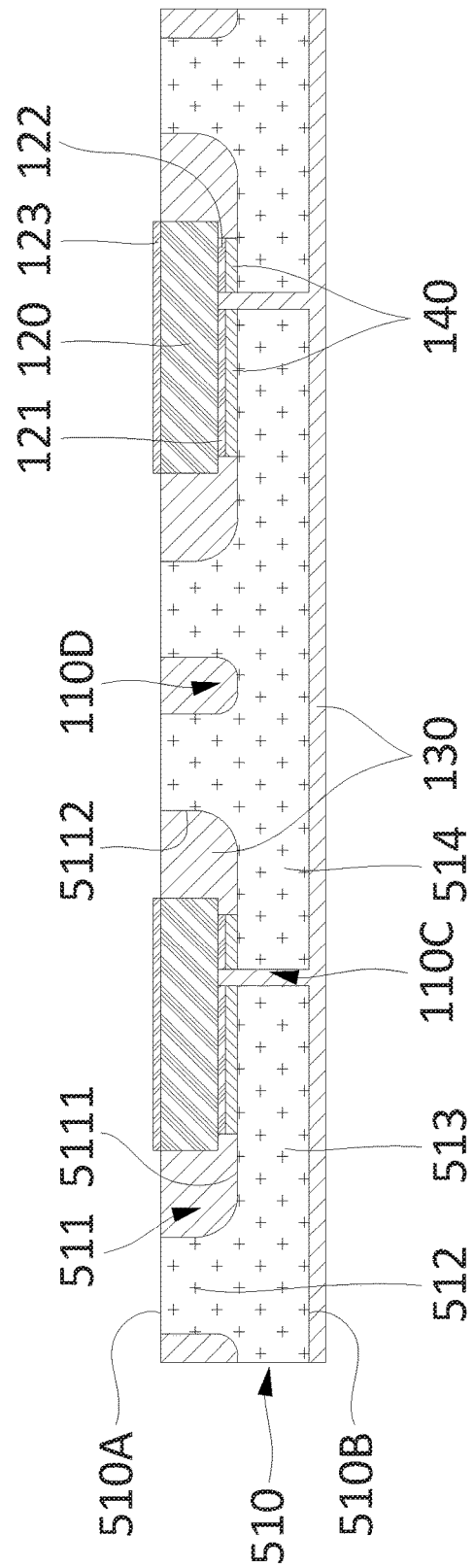

FIG. 9F shows a cross-sectional view of electronic device 500 at a later stage of manufacture. In some examples, features or elements in the stage of FIG. 9F can be similar to corresponding ones in the stage of FIG. 2F. In the example shown in FIG. 9F, device encapsulant 130 can encapsulate sides 510A or 510B of substrate 510. In some examples, device encapsulant 130 can fill cavities 511, openings 110C, and grooves 110D formed on substrate 110. Device encapsulant 130 can leave leads 512 exposed. In some examples, device encapsulant 130 can be substantially coplanar with leads 512. Device encapsulant 130 can cover lateral sides of electronic component 120 mounted within each of cavities 511 while exposing the back side of electronic component 120. Device encapsulant 130 can expose third terminal 123 at the back side of electronic component 120. In some examples, device encapsulant 130 can be substantially coplanar with the back side of electronic component 120. In some examples, device encapsulant 130 can entirely encapsulate side 510B of substrate 110. In some examples, device encapsulant 130 does not encapsulate side 510B of substrate 110.

FIGS. 9G-9J show cross-sectional views of electronic device 500 at a later stage of manufacture. In some examples, features or elements in the stages of FIGS. 9G-9J can be similar to corresponding ones in the stages of FIGS. 2G-2J. In the example shown in FIG. 9G, plating 150 can be formed on leads 512 and third terminal 123. In some examples, plating 150 can be formed on leads 512 and third terminal 123, and are exposed by device encapsulant 130. In some examples, plating 150 can prevent exposed portions of leads 512 from being oxidized. Plating 150 can be provided as electrical contacts between leads 512 and external interconnects or the external component. Plating 150 can be provided as electrical contacts between third terminal 123 and the external interconnects or the external component.

Figure 9I:
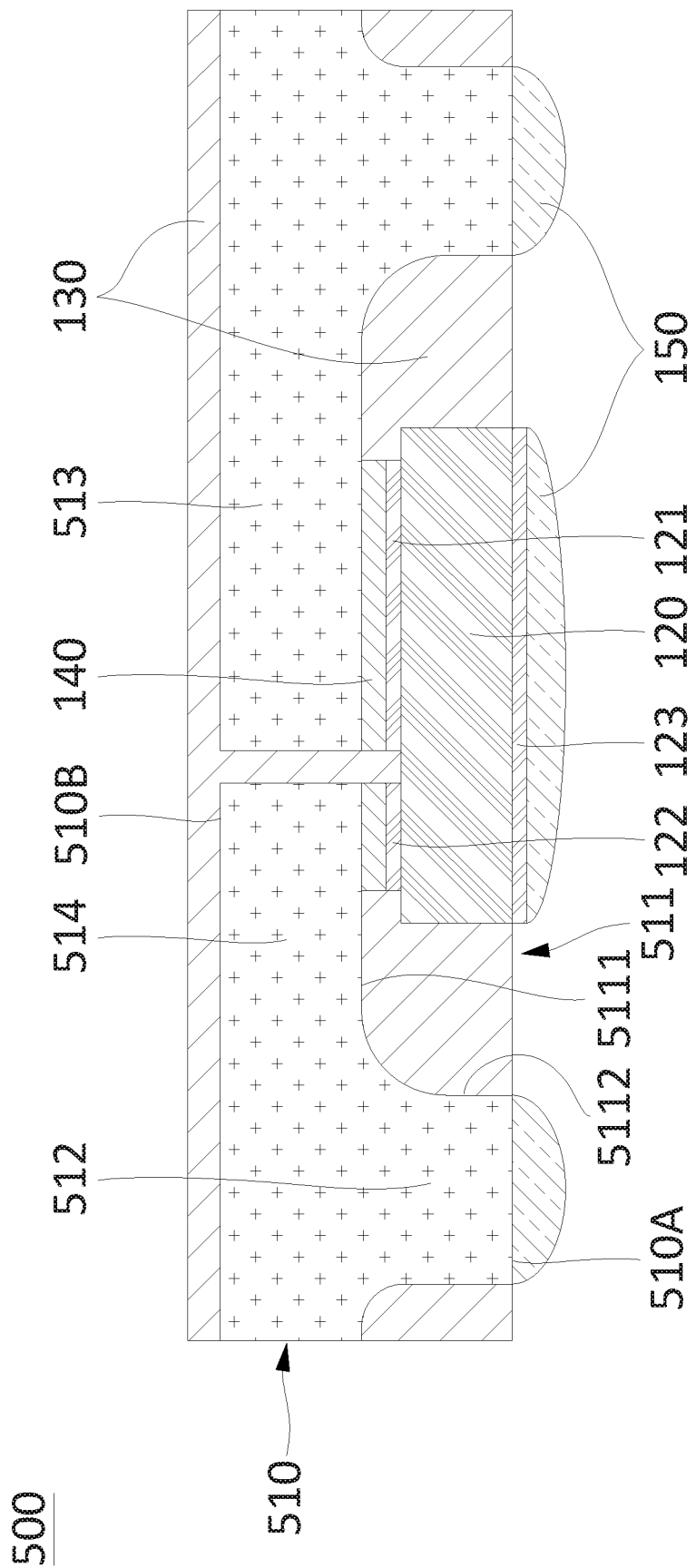

In the example shown in FIG. 9G, a singulation process for separating substrates 510 can be performed. In some examples, a sawing tool can cut device encapsulant 130 and substrate 510 along the boundary lines, for example the dashed lines. The sawing tool can cut device encapsulant 130 and substrate 510 while passing through grooves 110D, and as shown in FIG. 9I, lateral sides of paddles 513 and lateral sides of traces 514 can be exposed. Accordingly, electronic device 500 comprising substrate 510, electronic component 120, device encapsulant 130, and platings 140 and 150, can be completed.

In some examples, singulation can be performed at the dashed line through groove 110D, resulting in individual electronic devices 500 as shown in FIG. 9I with leads 512 at opposite sides of electronic device 500 (e.g., one or more leads 512 at one side electronic component 120 and another one or more leads 512 at the opposite side of electronic component 120).

Figure 9J:
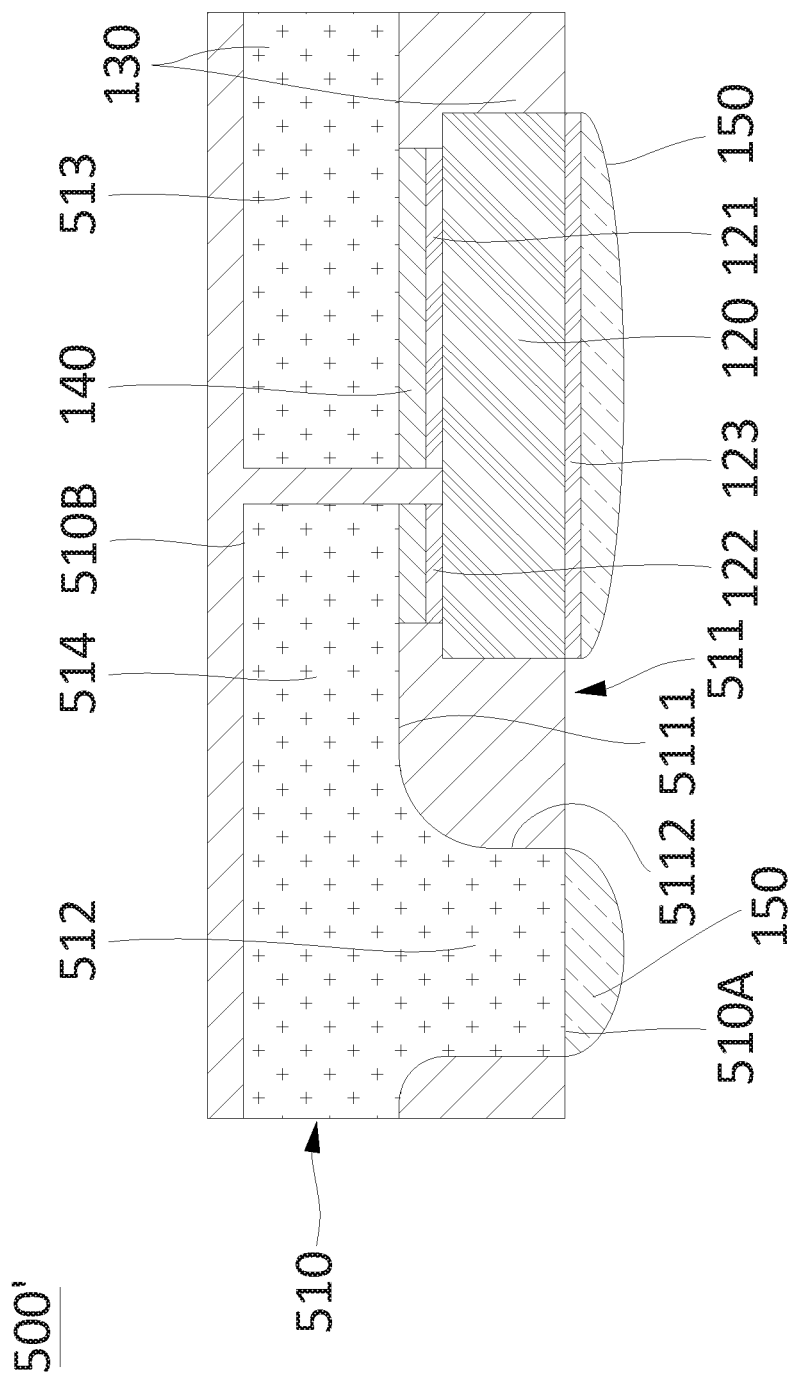

In some examples, singulation can be performed at the dashed line through encapsulant 130 in cavity 511, adjacent to electronic component 120, resulting in individual electronic devices 500' as shown in FIG. 9J with one or more leads 510 at one side of electronic component 120 but not at the opposite side. In some examples yielding electronic device 500', leads 512 or groove 110D do not need to be formed between the two electronic components 120 of FIG. 9G, and instead the two electronic components 120 can be provided in a single cavity 511 with encapsulant 130 in cavity 511 between the two electronic components 120.

Optionally, as shown in FIG. 9H, the singulation process can be performed after forming wettable flank 5121. In some examples, wettable flank 5121 can comprise corresponding elements, features, materials, or formation processes similar to those of wettable flank 1121 previously described. In some examples, plating 150 can be formed on the lateral sides of leads 512 exposed by wettable flank 5121.

Similar to FIG. 9G, in some examples, singulation can be performed at the dashed line through wettable flank 5121, resulting in individual electronic devices 501 with leads 512 at opposite sides of electronic device 501 (e.g., one or more leads 512 at one side electronic component 120 and another one or more leads 512 at the opposite side of electronic component 120.

In some examples, singulation can be performed at the dashed line through encapsulant 130 in cavity 511, adjacent to electronic component 120, resulting in individual electronic devices 501' with one or more leads 512 at one side of electronic device 501' but no lead 512 at the opposite side of electronic device 501'. In some examples yielding electronic device 501', leads 512 or wettable flank 5121 do not need to be formed between the two electronic components 120 of FIG. 9H, and instead the two electronic components 120 can be provided in a single cavity 511 with encapsulant 130 in cavity 511 between the two electronic components 120.

FIG. 9J shows a cross-section view of an example electronic device 500'. The example shown in FIG. 9J shows how electronic device 500' having one or more leads 512 at one side of electronic device 500', but not at the opposite side (similar to device 100' of FIG. 2J), can be achieved by singulating along the dashed singulation line of FIG. 9G or FIG. 9H through encapsulant 130 in cavity 511. The resulting electronic device 500' can be smaller sized than the version of electronic device 500 shown in FIG. 9I.

Figure 10:
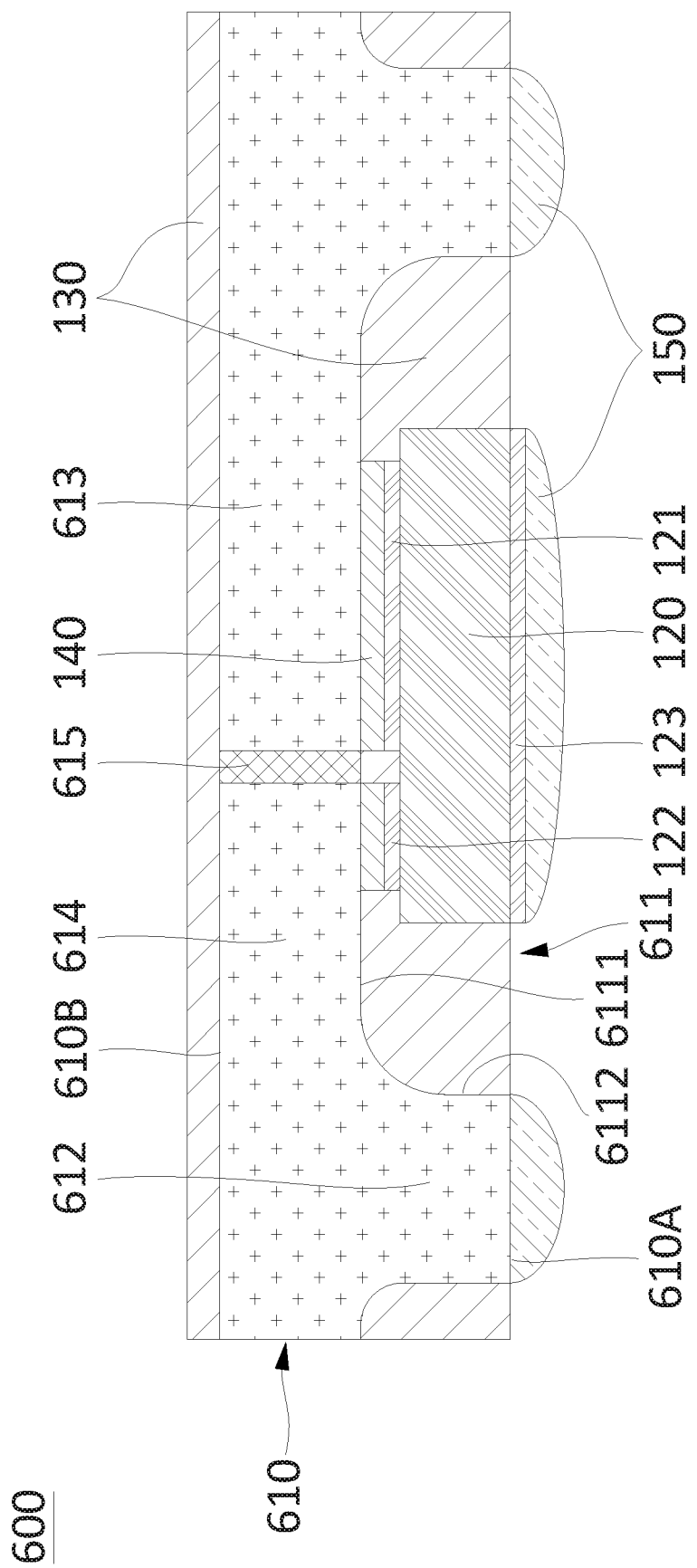
FIG. 10 shows a cross-sectional view of an example electronic device.

FIG. 10 shows a cross-sectional view of an example electronic device 600. In the example shown in FIG. 10, electronic device 600 can comprise substrate 610, electronic component 120, device encapsulant 130, and platings 140 and 150.

Substrate 610 can comprise cavities 611, leads 612, paddles 613, traces 614, and substrate encapsulant 615. Cavity 611 can comprise cavity base 6111 and cavity wall 6112. A gate-up configuration is presented for electronic device 600, where gate 122 of electronic component 120 faces upward or towards substrate 610 as shown in FIG. 6. In some examples, substrate encapsulant 615 can be between trace 614 and paddle 613. Device encapsulant 130 can contact the side of substrate 610 opposite to cavity 611 and contacts substrate encapsulant 615.

In some examples, substrate 610 can comprise corresponding elements, features, materials, or formation processes similar to those of substrate 510 previously described. In the present example, substrate 610 can comprise substrate encapsulant 615 located in openings of substrate 510, such as between paddle 613 and trace 614.

Substrate 610, device encapsulant 130, and platings 140 and 150 can be referred to as a semiconductor package or a package, and can provide protection for electronic component 120 from external elements and/or environmental exposure. The semiconductor package can provide an electrical coupling between an external component and electronic component 120.

FIGS. 11A to 11K show cross-sectional views or plan views of an example method for manufacturing an example electronic device 600. In some examples, features or elements in the stages of FIG. 11 can be similar to corresponding ones in the stages of FIG. 2.

FIG. 11A shows a plan view and a cross-sectional view of electronic device 600 at an initial stage of manufacture. In some examples, features or elements in the stage of FIG. 11A can be similar to corresponding ones in the stage of FIG. 2A or FIG. 9A. In the example shown in FIG. 11A, raw substrate 110' having first side 110A and second side 110B opposite to first side 110A can be prepared. Raw substrate 110' can be transitioned to or referred as substrate 610 through subsequent processing.

Figure 11B:
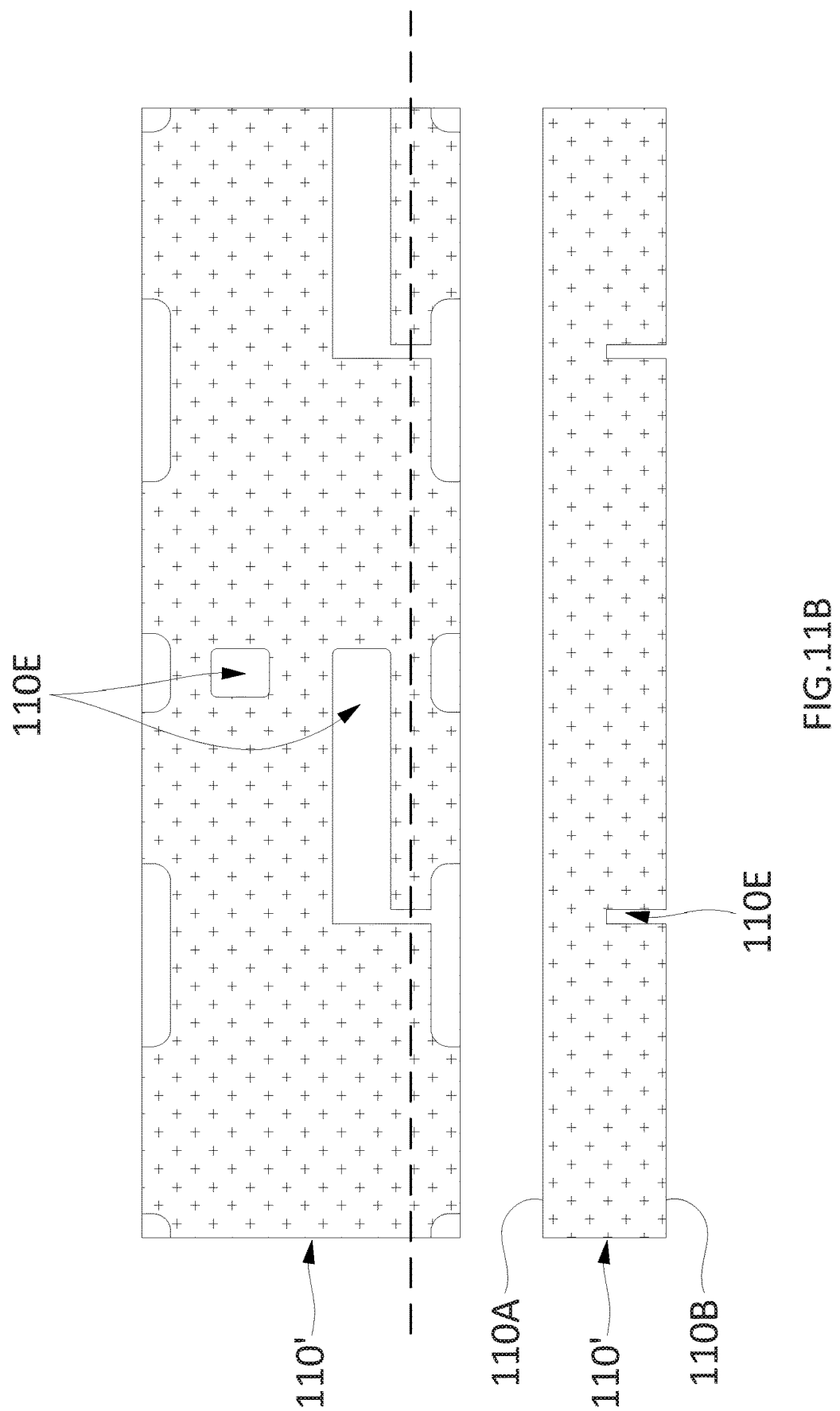

FIG. 11B shows a plan view and a cross-sectional view of electronic device 600 at a later stage of manufacture. In some examples, features or elements in the stage of FIG. 11B can be similar to corresponding ones in the stage of FIG. 2B or FIG. 9B. In the example shown in FIG. 11B, openings 110E can be formed at side 110B of raw substrate 110' through a patterning process. Openings 110E can be formed as grooves by partial-etching into side 110B of raw substrate 110'. In some examples, openings 110E can comprise corresponding elements, features, materials, or formation processes similar to those of grooves 110D previously described. In some examples, openings 110E can comprise a similar layout as openings 110C described with respect to FIG. 9B.

FIG. 11C shows a plan view and a cross-sectional view of electronic device 600 at a later stage of manufacture. In the example shown in FIG. 11C, substrate encapsulant 615 can be formed in openings 110E. Substrate encapsulant 615 can fill openings 110E. In some examples, substrate encapsulant 615 can comprise corresponding elements, features, materials, or formation processes similar to those of device encapsulant 130 previously described. In some examples, substrate encapsulant can be the same or similar material as encapsulant 130. In some example, substrate encapsulant 615 can comprise an organic dielectric leadframe resin and encapsulant 130 can comprise a mold compound. In some examples, encapsulant 130 and substrate encapsulant 615 can be formed in separate, independent processes using different dielectric materials. In some examples, a substrate encapsulant 615 can be substantially coplanar with side 110B of raw substrate 110', or substrate encapsulant 615 can expose side 110B of raw substrate 110'. In some examples, substrate encapsulant 615 can extend to cover side 110B of raw substrate 110'.

Figure 11D:
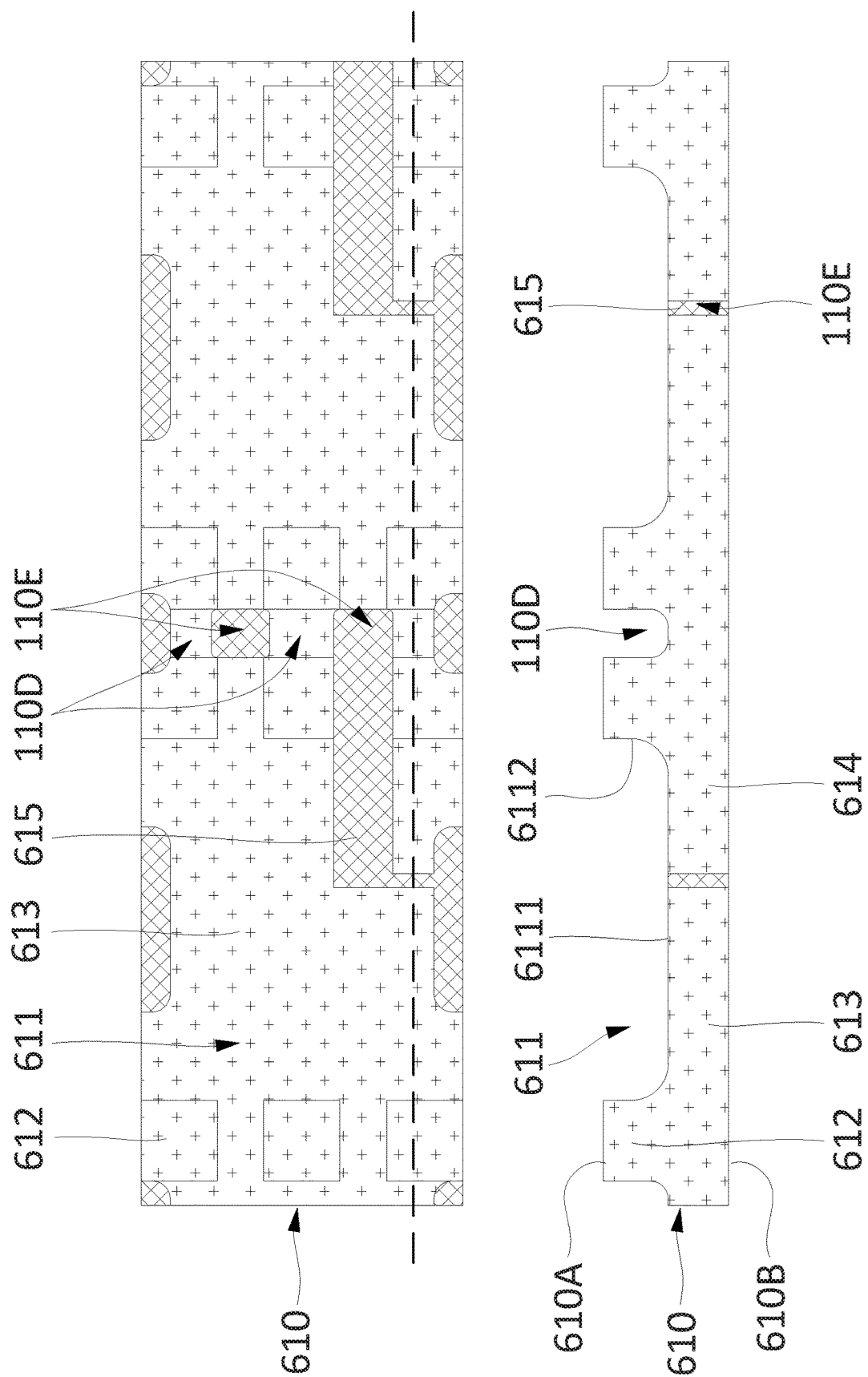

FIG. 11D shows a plan view and a cross-sectional view of electronic device 600 at a later stage of manufacture. In some examples, features or elements in the stage of FIG. 11D can be similar to corresponding ones in the stage of FIG. 2C or FIG. 9C. In the example shown in FIG. 11D, cavities 611 can be formed at side 610A of substrate 610. In some examples, cavities 611 can be formed by partial-etching side 610A of substrate 610. Portions of cavities 611, vertically aligned with openings 110E, can expose substrate encapsulant 615 formed in openings 110E. In some examples, substrate encapsulant 615 can be coplanar with cavity base 6111.

In some examples, grooves 110D can be formed by partial-etching substrate 610. In some examples, grooves 110D can be simultaneously formed with cavities 611. In some examples, grooves 110D can define lateral sides of leads 612. In some examples, grooves 110D can facilitate a singulation process.

In the example shown in FIG. 11D, substrate 610 comprising cavities 611, leads 612, paddles 613, traces 614, openings 110E, grooves 110D, and substrate encapsulant 615 can be formed by partial-etching substrate 610. In some examples, substrate 610 can comprise or be referred to as a lead frame, an etched lead frame, or a pre-molded lead frame.

In some examples, leads 612 can comprise corresponding elements, features, materials, or formation processes similar to those of leads 112 or 512 previously described. Leads 612 can protrude from paddles 613 and traces 614. In some examples, leads 612 located on paddles 613 and leads 612 located on traces 614 can be electrically disconnected from each other. Leads 612 can be provided as electrically coupling paths between substrate 610 and an external component.

In some examples, paddles 613 can comprise corresponding elements, features, materials, or formation processes similar to those of paddles 113 or 513 previously described. In some examples, a portion of paddle 613 can define a portion of cavity base 6111. Paddle 613 can be separated from trace 614 by substrate encapsulant 615 or opening 110E. In some examples, areas of paddles 613 can be larger than those of traces 614.

In some examples, traces 614 can comprise corresponding elements, features, materials, or formation processes similar to those of traces 514 previously described. A portion of trace 614 can define a portion of cavity base 6111. Traces 614 can be separated from paddles 613 by substrate encapsulant 615 or opening 110E.

Figure 11E:
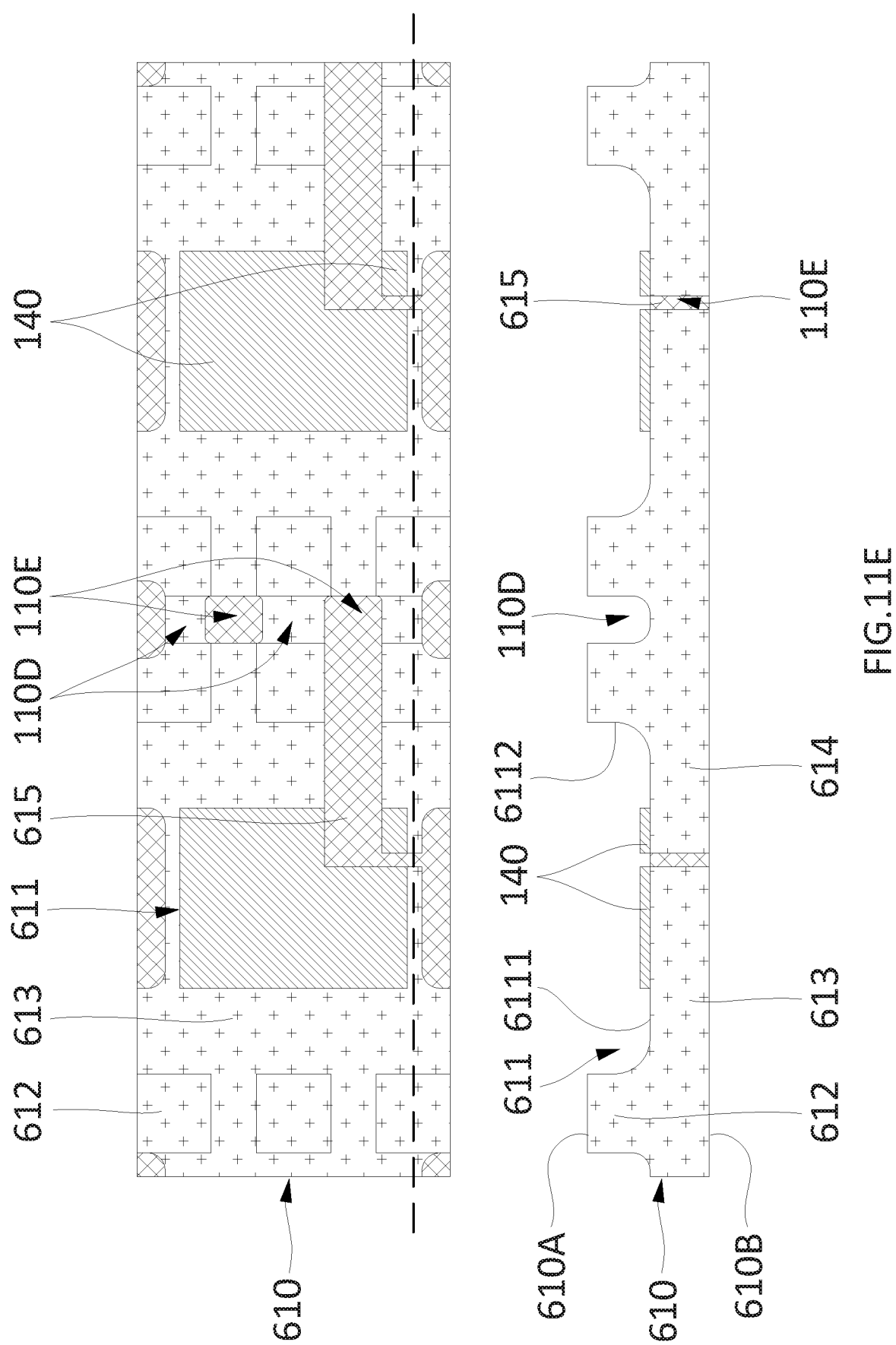

FIG. 11E shows a plan view and a cross-sectional view of electronic device 600 at a later stage of manufacture. In some examples, features or elements in the stage of FIG. 11E can be similar to corresponding ones in the stage of FIG. 2D or FIG. 9D. In the example shown in FIG. 11E, interface 140 can be formed on paddles 613 and traces 614 located in cavities 611. In some examples, interface 140 can be formed on cavity base 6111.

FIG. 11F shows a cross-sectional view of electronic device 600 at a later stage of manufacture. In some examples, features or elements in the stage of FIG. 11F can be similar to corresponding ones in the stage of FIG. 2E or FIG. 9E. In the example shown in FIG. 11F, electronic component 120 can be attached to interface 140. Electronic component 120 can be mounted on paddles 613 and traces 614, and can be received in cavity 611. In some examples, most of electronic component 120 can be positioned on paddle 613 and a portion of electronic component 120 can be positioned trace 614 across opening 110E.

Electronic component 120 can be received in cavity 611 such that first terminal 121 and second terminal 122 contact interface 140, and such that third terminal 123 faces away from substrate 510. First terminal 121 can be electrically coupled to interface 140 of paddle 613. In some examples, source 121 of electronic component 120 can be electrically coupled to paddle 613. Second terminal 122 can be electrically coupled to interface 140 of trace 614. In some examples, gate 122 of electronic component 120 can be electrically coupled to trace 614. Third terminal 123 can be exposed from substrate 610.

FIG. 11G shows a cross-sectional view of electronic device 600 at a later stage of manufacture. In some examples, features or elements in the stage of FIG. 11G can be similar to corresponding ones in the stage of FIG. 2F or FIG. 9F. In the example shown in FIG. 11G, device encapsulant 130 can encapsulate sides 610A or 610B of substrate 510. In some examples, device encapsulant 130 can fill cavities 611 and grooves 110D formed on substrate 610. In some examples, device encapsulant 130 can be formed between substrate encapsulant 615 and the front side of electronic component 120. Device encapsulant 130 can leave leads 612 exposed. In some examples, device encapsulant 130 can be substantially coplanar with leads 612. Device encapsulant 130 can cover lateral sides of electronic component 120 mounted within each of cavities 611 while exposing the back side of electronic component 120. Device encapsulant 130 can expose third terminal 123 at the back side of electronic component 120. In some examples, device encapsulant 130 can be substantially coplanar with the back side of electronic component 120. In some examples, device encapsulant 130 can entirely encapsulate over side 610B of substrate 110. In some examples, device encapsulant 130 does not encapsulate over side 610B of substrate 110.

FIGS. 11H-11K show cross-sectional views of electronic device 600 at a later stage of manufacture. In some examples, features or elements in the stages of FIGS. 11H-11K can be similar to corresponding ones in the stages of FIG. 2G-2J or FIGS. 9G-9J. In the example shown in FIG. 11H, plating 150 can be formed on leads 512 and third terminal 123. In some examples, plating 150 can be formed on leads 512 and third terminal 123, and are exposed by device encapsulant 130. In some examples, plating 150 can prevent exposed portions of leads 612 from being oxidized. Plating 150 can be provided as electrical contacts between leads 612 and external interconnects or the external component. Plating 150 can be provided as electrical contacts between third terminal 123 and the external interconnects or the external component.

Figure 11J:
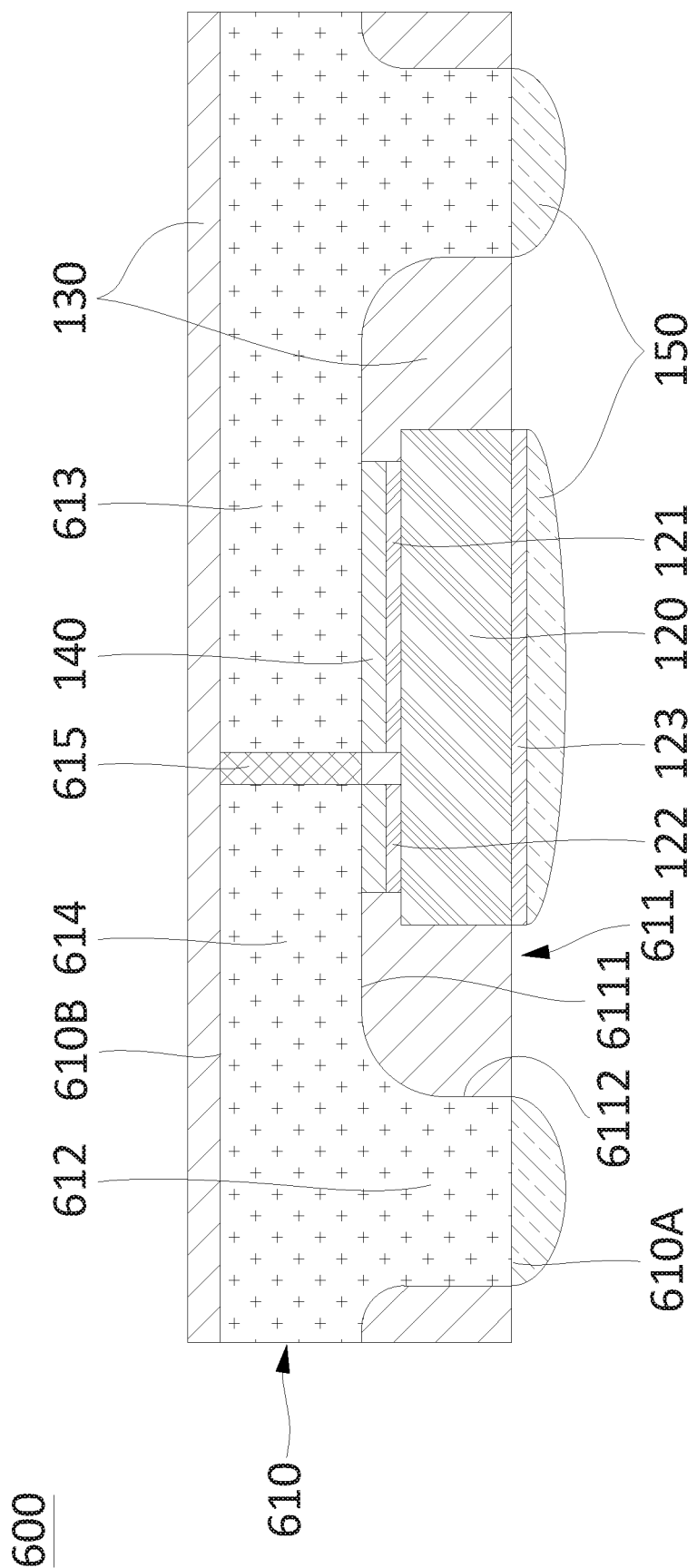

In the example shown in FIG. 11H, a singulation process for separating substrates 610 can be performed. In some examples, a sawing tool can cut device encapsulant 130 and substrate 610 along the boundary lines, for example the dashed lines. The sawing tool can cut device encapsulant 130 and substrate 610 while passing through grooves 110D, and as shown in FIG. 11J, lateral sides of paddles 613 and lateral sides of traces 614 can be exposed. Accordingly, electronic device 600 comprising substrate 610, electronic component 120, substrate encapsulant 615, device encapsulant 130, and platings 140 and 150, can be completed.

In some examples, singulation can be performed at the dashed line through grooves 110D to result in individual electronic devices 600 as shown in FIG. 11J with leads 612 at opposite sides of electronic device 600.

Figure 11K:
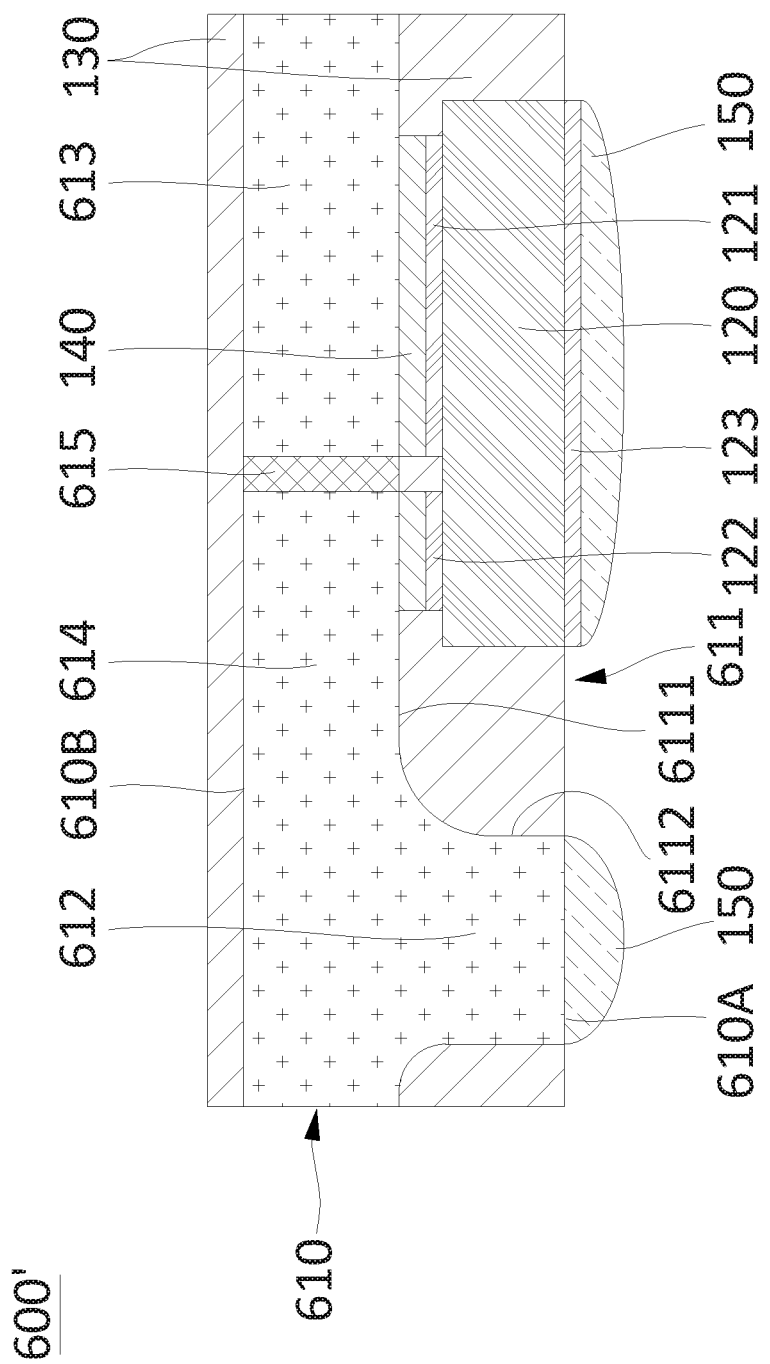

In some examples, singulation can be performed at the dashed line through encapsulant 130 in cavity 611, adjacent to electronic component 120, to result in individual electronic devices 600' as shown in FIG. 11K with one or more leads 612 at one side of electronic component 120 but not at the opposite side. In some examples yielding electronic device 600', leads 612 or groove 110D do not need to be formed between the two electronic components 120 of FIG. 11G, and instead the two electronic components 120 can be provided in a single cavity 611 with encapsulant 130 in cavity 611 between the two electronic components 120.

Optionally, as shown in FIG. 11I, the singulation process can be performed after forming wettable flank 6121. In some examples, wettable flank 6121 can comprise corresponding elements, features, materials, or formation processes similar to those of wettable flank 1121 previously described. In some examples, a plating can be formed on the lateral sides of leads 612 exposed by wettable flank 6121.

Similar to FIG. 11H, in some examples, singulation can be performed at the dashed line through wettable flank 6121, resulting in individual electronic devices 601 with leads 612 at opposite sides of electronic device 601 (e.g., one or more leads 612 at one side electronic component 120 and another one or more leads 612 at the opposite side of electronic component 120.

In some examples, singulation can be performed at the dashed line through encapsulant 130 in cavity 611, adjacent to electronic component 120, resulting in individual electronic devices 601' with one or more leads 612 at one side of electronic device 601' but no lead 612 at the opposite side of electronic device 601'. In some examples yielding electronic device 601', leads 612 and wettable flank 6121 do not need to be formed between the two electronic components 120 of FIG. 11H, and instead the two electronic components 120 can be provided in a single cavity 611 with encapsulant 130 in cavity 611 between the two electronic components 120.

FIG. 11K shows a cross-section view of an example electronic device 600'. The example shown in FIG. 11K shows how electronic device 600' having one or more leads 612 at one side of electronic device 600', but not at the opposite side (similar to device 100' of FIG. 2J or device 500' of FIG. 9J), can be achieved by singulating along the dashed singulation line of FIG. 11H or FIG. 11I through encapsulant 130 in cavity 611. The resulting electronic device 600' can be smaller sized than the version of electronic device 600 shown in FIG. 11J.

Figure 12:
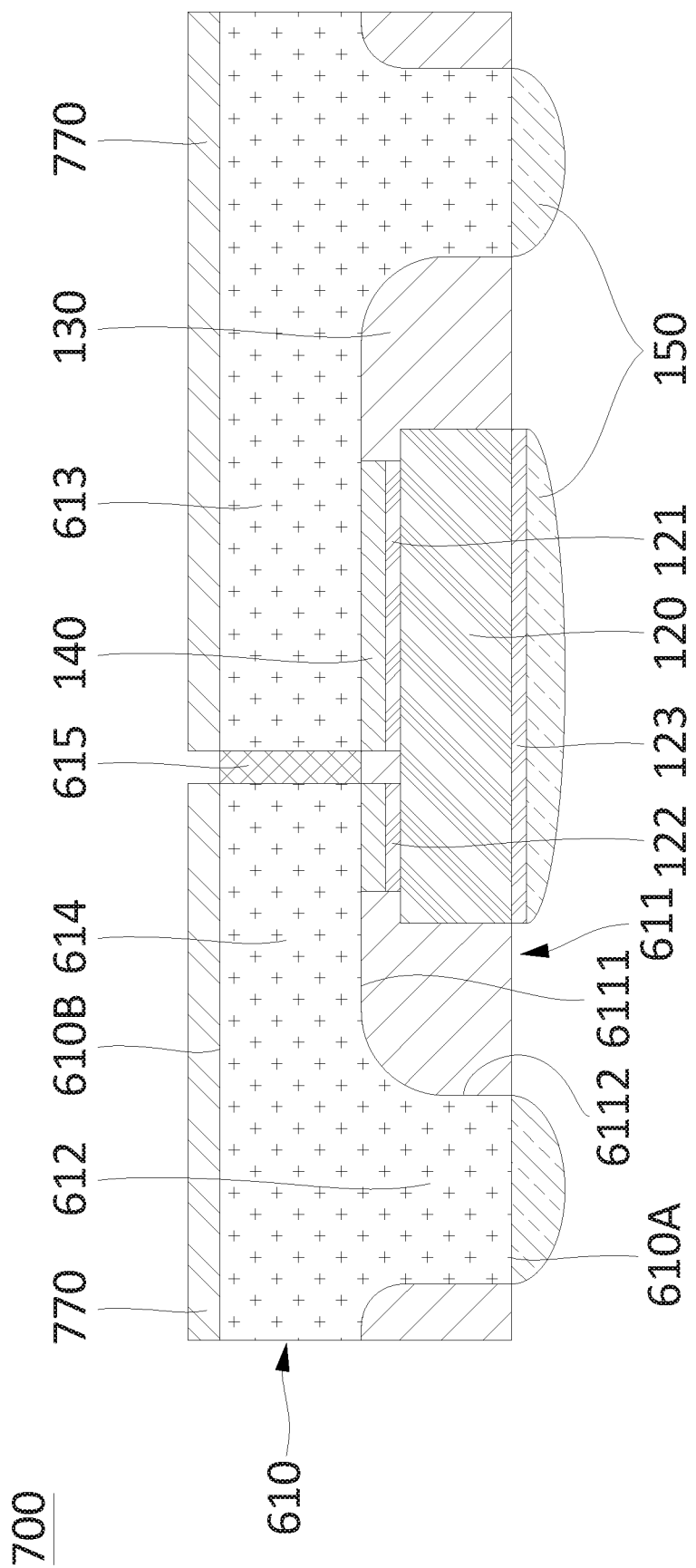
FIG. 12 shows a cross-sectional view of an example electronic device.

FIG. 12 shows a cross-sectional view of an example electronic device 700. In the example shown in FIG. 12, electronic device 700 can comprise substrate 610, electronic component 120, device encapsulant 130, platings 140 and 150, and coating 770. Electronic device 700 can be similar to other electronic devices described here, such as electronic device 600 (FIGS. 10-11).

In the present example, device encapsulant 130 can expose side 610B of substrate 610 and substrate encapsulant 615. In some examples, device encapsulant 130 can expose a portion of substrate encapsulant 615 substantially coplanar with side 610B of substrate 610. In some examples, electronic device 700 can be formed by removing encapsulant 130 covering side 610B of substrate 610 from electronic device 600 shown in FIGS. 10-11. In some examples, encapsulant 130 located on the side 610B of substrate 610 can be removed by etching or grinding. In some examples, a thickness of paddle 613 can be thinned as well, such as when removing encapsulant 130 from side 610B of substrate 610. In some examples, device encapsulant 130 can be formed in cavities 611 of substrate 610 and can encapsulate side sides of electronic component 120 while exposing sides 610A and 610B of substrate 610, a portion of substrate encapsulant 615, and third terminal 123 of electronic component 120.

In some examples, coating 770 can be formed on the exposed side 610B of substrate 610. Coating 770 can be formed on paddles 613 and traces 614. In some examples, coating 770 can comprise corresponding elements, features, materials, or formation processes similar to those of coating 362 of FIG. 5 previously described. In some examples, coating 770 can comprise a conductive material or an insulating material. In some examples, coating 770 can prevent paddles 613 or traces 614 from being oxidized. In some examples, coating 770 can prevent paddles 613 or traces 614 from electrical contacting an external component.

To maximize thermal and electrical properties, the electronic devices described with respect to FIGS. 1-12 can be configured to maximize the amount of conductive material within the volume of the package. To facilitate such goal, the use of a continuous conductive substrate such as substrate 110, 410, 510, 610 (rather than for example a clip between leadframe and electronic device), can permit the amount of conductive material in respective electronic devices of FIGS. 1-12 can be 70% or higher.

It is noted that exemplary electronic devices that have, for brevity, been shown or described without explicitly illustrating wettable flank options can also be configured to include or support wettable flank options, using similar wettable flank structures or fabrication described for other examples. For instance, electronic devices 200, 300, 400, 700 can comprise wettable flank features similar to those described with respect to wettable flank 1121 (FIG. 2H), wettable flank 5121 (FIG. 9H), wettable flank 6121 (FIG. 11I), or variations.

Figure 13:
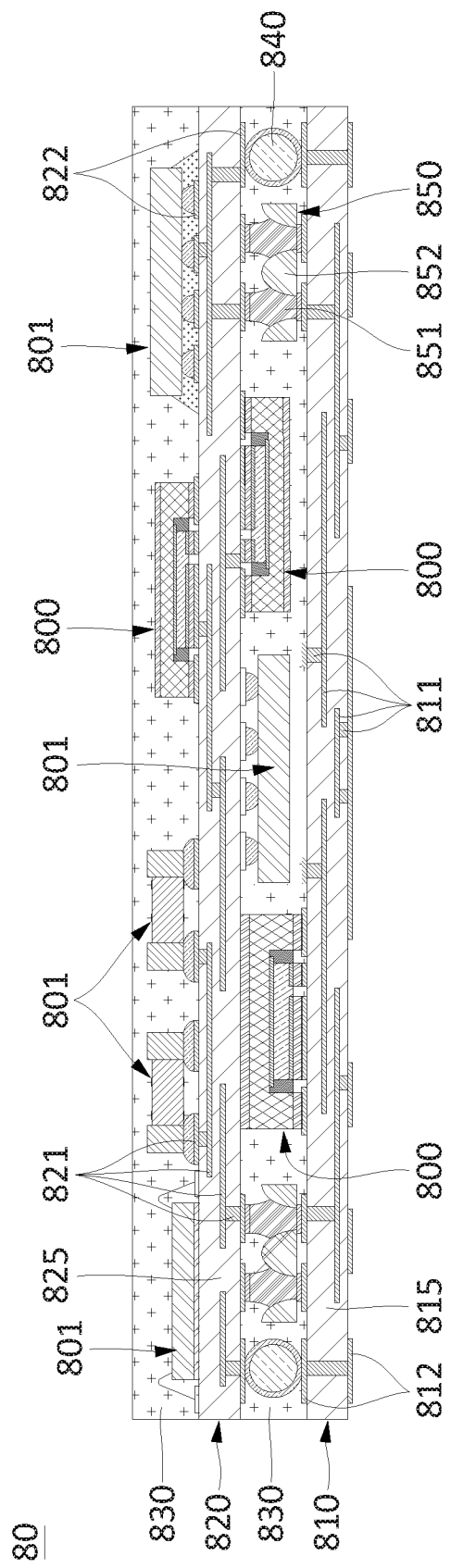
FIG. 13 shows a cross-sectional view of an example module device.

FIG. 13 shows a cross-sectional view of an example module device 80. In the example shown in FIG. 13, module device 80 can comprise one or more electronic devices 800, one or more electronic devices 801, substrate 810, substrate 820, module encapsulant 830, and one or more vertical interconnects 840 or 850. In some examples, module device 80, having substrate 810 and 820 stacked, can comprise or be referred to as a Package on Package (POP) device.

Electronic devices 800 or 801 can be electrically coupled to substrate 810 or substrate 820. In some examples, electronic devices 800 or 801 can be coupled to a top side of substrate 810, a bottom side of substrate 810, a top side of substrate 820, or a bottom side of substrate 820.

In some examples, any of electronic device 800 can be similar to any of electronic devices 100, 200, 300, 400, 500, 600, or 700 previously described. In some examples, electronic device 801 can comprise one or more semiconductor dies, semiconductor chips or semiconductor packages. In some examples, electronic component 801 can comprise passive components, or active components. In some examples, electronic component 801 can comprise wire bonding structures or flip chip bonding structures.

Substrate 810 can comprise conductive structure 811, substrate terminal 812, and dielectric structure 815. In some examples, conductive structure 811 can comprise or be referred to as one or more traces, pads, terminals, vias, under bump metallization (UBM), conductors, conductive materials, conductive patterns, conductive paths, conductive layers, redistribution layers (RDL), wiring patterns, trace patterns, or circuit patterns. Substrate 810 can have a thickness in the range from about 100 μm to about 600 μm.

For example, conductive structure 811 can comprise an electrically conductive material such as copper (Cu), aluminum (Al), palladium (Pd), titanium (Ti), tungsten (W), titanium/tungsten, nickel (Ni), gold (Au), or silver (Ag). Conductive structure 811 can be formed using, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). A portion of conductive structure 811 can be exposed to top and bottom sides of substrate 810. Conductive structure 811 can transfer or redistribute signals, currents, or voltages across substrate 810.

Substrate terminals 812 can be coupled to or can be part of conductive structure 811. In some examples, substrate terminals 812 can be located exposed at top or bottom sides of substrate 810. In some examples, substrate terminals 812 can comprise or be referred to as pads, lands, UBMs, studs, or bumps. In some examples, electronic devices 800 or 801, or vertical interconnects 840 or 850 can be coupled to substrate terminals 812. Substrate terminals 812 can provide electrical contacts between substrate 810 and electronic devices 800 or 801 or between substrate 810 and vertical interconnects 840 or 850.

Dielectric structure 815 can comprise or be referred to as one or more dielectric layers, passivation layers, solder mask layers, core layers or prepreg layers. In some examples, dielectric structure 815 can comprise an electrically insulating material, such as a polymer, polyimide (PI), benzocyclobutene (BCB), polybenzoxazole (PBO), bismaleimide triazine (BT), a molding material, a phenolic resin, an epoxy, silicone, or an acrylate polymer. In some examples, dielectric structure 815 can be formed by any of a variety of processes, such as by thermal oxidation, chemical vapor deposition (CVD), physical vapor deposition (PVD), atomic layer deposition (ALD), low pressure chemical vapor deposition (LPCVD), plasma enhanced chemical vapor deposition (PECVD), sheet lamination, printing, spin coating, spray coating, sintering, or evaporating. Dielectric structure 815 can provide protection for conductive structure 811 from external elements and/or environmental exposure. In some examples, dielectric structure 815 can expose a portion of conductive structure 811 to the top and bottom sides of substrate 810.

In some examples, substrate 820 can comprise corresponding elements, features, materials, or formation processes similar to those of substrate 810 previously described. For example, substrate 820 can comprise conductive structure 821, substrate terminals 822, and dielectric structure 825, and can be correspondingly similar to conductive structure 811, substrate terminals 812, and dielectric structure 815 of substrate 810. In some examples, substrate 820 can be mounted on, or formed over, substrate 810. In some examples, substrate 810 or substrate 820 can comprise or be referred to as a laminate substrate, a pre-formed substrate, or an RDL substrate.

In some examples, substrate 810 or substrate 820 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers and can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate and omits the permanent core structure, and the dielectric and conductive layers can be formed on a sacrificial carrier and is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process. Other substrates in this disclosure can also comprise a pre-formed substrate.

In some examples, substrate 810 or substrate 820 can be a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride ($Si_3N_4$), silicon oxide ($SiO_2$), or silicon oxynitride (SiON). The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this disclosure can also comprise an RDL substrate.

In some examples, module encapsulant 830 can comprise corresponding elements, features, materials, or formation processes similar to those of device encapsulant 130 previously described. In some examples, electronic device 800 can be between substrate 810 and substrate 820. In some examples, module encapsulant 830 can be formed between substrate 810 and substrate 820. Encapsulant 830 can contact a lateral side of electronic device 800. In some examples, module encapsulant 830 can be formed on substrate 820. Module encapsulant 830 can encapsulate electronic devices 800 or 801 or vertical interconnects 840 or 850 coupled to substrate 810 or substrate 820. Vertical interconnects 840 or 850 can be coupled with conductive structure 811 or 821. In some examples, module encapsulant 830 can provide protection for electronic devices 800 or 801 or vertical interconnects 840 or 850 from external elements and/or environmental exposure. Module encapsulant 830 can have a thickness in the range from about 150 µm to about 300 µm.

In some examples, vertical interconnects 840 or 850 can electrically couple substrate 810 and substrate 820 to each other. Vertical interconnects 840 or 850 can be coupled to substrate terminals 812 or 822 of substrates 810 or 820. In some examples, vertical interconnects 840 or 850 can be provided as electrically coupling paths between substrates 810 or 820. In some examples, heights of vertical interconnects 840 or 850 can correspond to a height of module encapsulant 830 located between substrates 810 or 820.

In some examples, vertical interconnects 840 can comprise or be referred to as solder balls, metal-core balls, metal-core solder-coated balls, vertical wires, posts, pillars, or bumps. Vertical interconnects 840 can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. Vertical interconnects 840 can be formed by, for example, a ball drop process, a screen-printing process, an electroplating process, or a deposition process.

In some examples, vertical interconnects 850 can comprise or be referred to as lead frame cubes. Lead frame cube 850 can comprise leads 851 and encapsulant 852. In some examples, leads 851 can be electrically coupled between substrate terminal 812 of substrate 810 and substrate terminal 822 of substrate 820. In some examples, lead frame cube 850 can comprise a plating formed on leads 851, and the plating can be connected to substrate terminals 812 or 822. In some examples, leads 851 can be electrically disconnected from each other by encapsulant 852.

In some examples, module device 80 optionally can include only one of substrate 810 or 820 but not the other of substrate 810 or 820. For instance, module device 80 can lack substrate 810 such that a portion of vertical interconnects 840/850, or a portion of electronic device 800, can be exposed or protruded from lower module encapsulant 830. Furthermore, in some examples, module device 80 does not include or have module encapsulant 830. In some examples, module encapsulant 830 can be on one side of substrate 810 or 820 but not on the opposite side of substrate 810 or 820. In some examples electronic device 800 can fully extend through the thickness of the layer of encapsulant 830 that encapsulates it, such as from substrate 810 to substrate 820, or from the top of substrate 820 to the top of the upper encapsulant 830, or from the bottom of substrate 820 to the bottom of the lower encapsulant 830. In some examples, the top or bottom of electronic device 800 can be encapsulated by encapsulant 830, such as the top of electronic device 800 coupled to the top side of substrate 820, or the bottom of electronic device 800 coupled to the bottom of substrate 820. In some examples, module device 80 can comprise substrate 820 but not substrate 810, and substrate 820 can comprise a laminate substrate. In some examples, module encapsulant 830 can be on one side of substrate 820 but not on the opposite side of substrate 820.

Figure 14C:
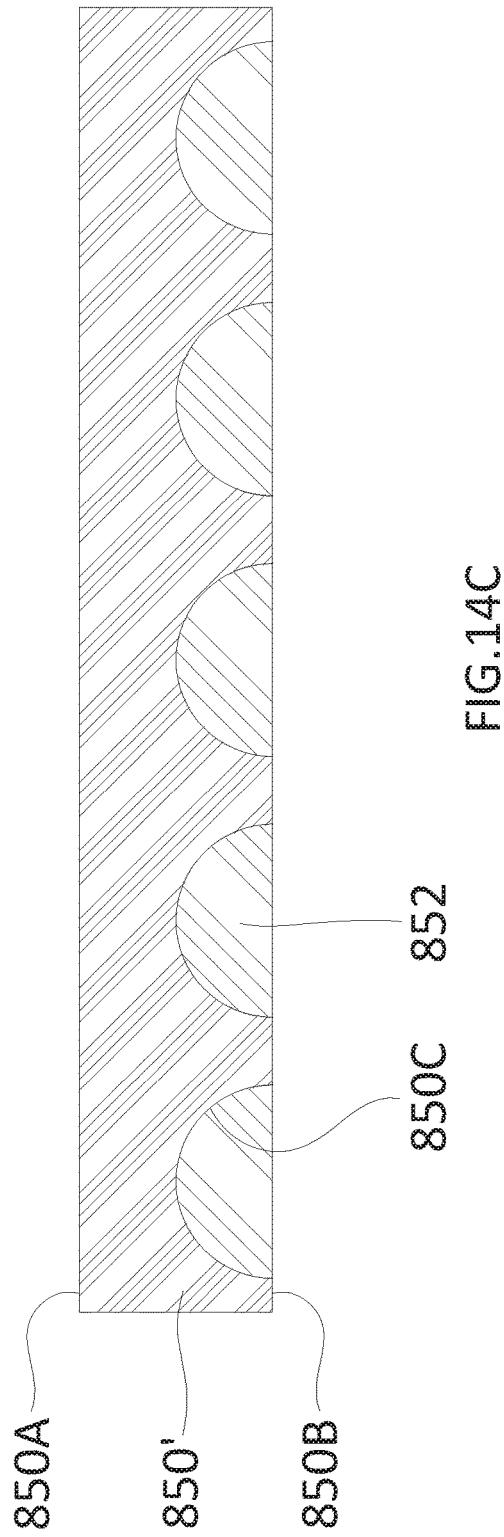

FIGS. 14A to 14E show cross-sectional views of an example method for manufacturing an example lead frame cube 850. FIG. 14A shows a cross-sectional view of lead frame cube 850 at an initial stage of manufacture.

In the example shown in FIG. 14A, raw substrate 850' having first side 850A and second side 850B opposite to first side 850A can be prepared. In some examples, raw substrate 850' can comprise corresponding elements, features, materials, or formation processes similar to those of raw substrate 110' previously described.

FIG. 14B shows a cross-sectional view of lead frame cube 850 at a later stage of manufacture. In the example shown in FIG. 14B, grooves 850C can be formed by partial-etching side 850B of raw substrate 850'. Grooves 850C can be formed laterally spaced apart from each other along second side 850B of raw substrate 850'. In some examples, grooves 850C can define portions of lateral sides of leads 851.

FIG. 14C shows a cross-sectional view of lead frame cube 850 at a later stage of manufacture. In the example shown in FIG. 14C, encapsulant 852 can encapsulate side 850B of raw substrate 850'. In some examples, encapsulant 852 can comprise corresponding elements, features, materials, or formation processes similar to those of encapsulants 130 or 615. Encapsulant 852 can fill grooves 850C. Encapsulant 852 can be formed or grinded to expose side 850B of raw substrate 850'.

Figure 14D:
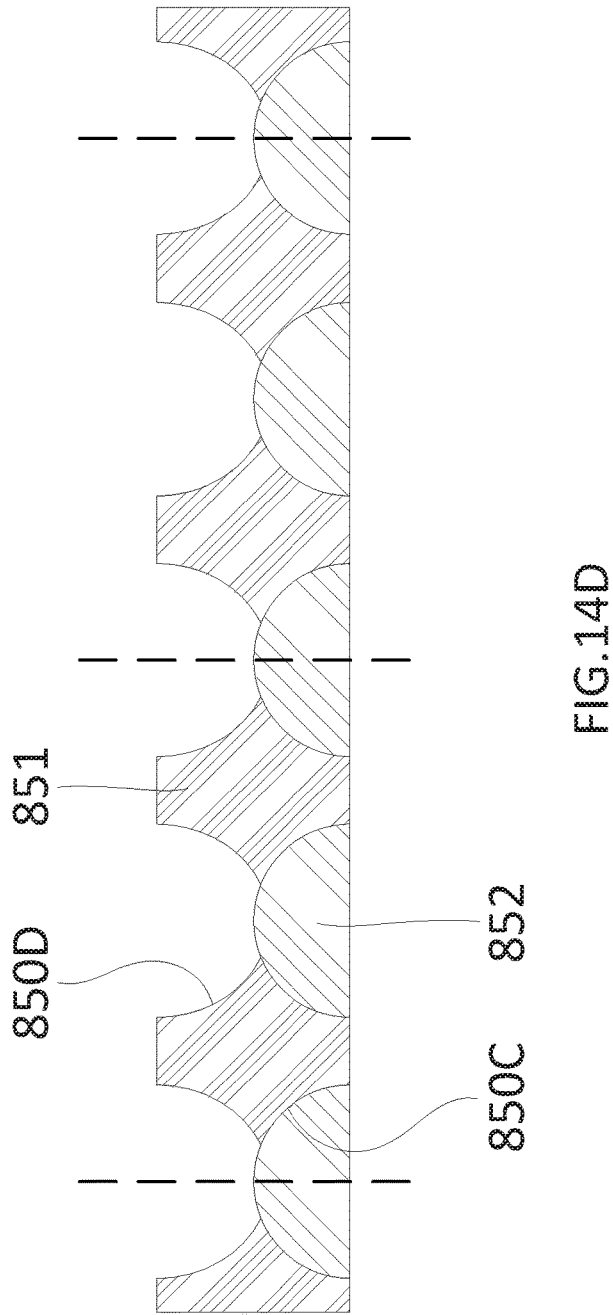

FIG. 14D shows a cross-sectional view of lead frame cube 850 at a later stage of manufacture. In the example shown in FIG. 14D, grooves 850D can be formed by partial-etching side 850A of raw substrate 850'. Grooves 850D can be vertically aligned with grooves 850C to define leads 851 vertically. In some examples, grooves 850D can extend to reach encapsulant 852 or grooves 850C, and thus can electrically disconnect or isolate adjacent leads 851 from each other. In some examples, grooves 850D can be arcuate in shape and can be between leads 851. In some examples, grooves 850D can constitute portions of lateral sides of leads 851. Optionally, another encapsulant layer, similar to encapsulant 852, can also be applied to fill grooves 850D.

Figure 14E:
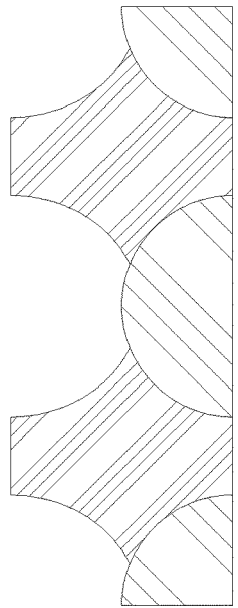
Figure 14E:
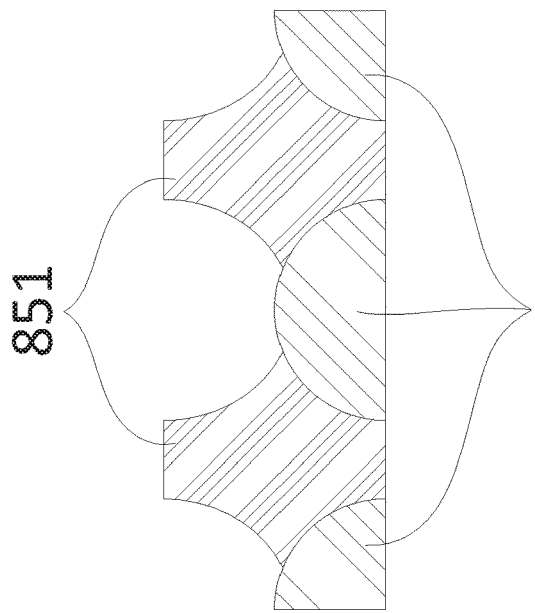

In the example shown in FIG. 14D, a singulation process can be performed on a lead frame comprising leads 851 and encapsulant 852. In some examples, a sawing tool can cut encapsulant 852 along boundary lines, for example the dashed lines, and lead frame cube 850 can thus be formed as shown in FIG. 14E. In some examples, lead frame cube 850 can comprise more or fewer leads 851 than shown in FIG. 14E by adjusting the boundary lines. In some examples, platings can be formed on top and bottom sides of leads 851.

The present disclosure includes reference to certain examples. It will be understood by those skilled in the art, however, that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic device, comprising:
a substrate comprising a first side and a second side, a first lead and a second lead on the second side, a cavity in the second side of the substrate adjacent to the first lead, and a cavity base between the first lead and the second lead, wherein the first lead comprises a contiguous extension of the substrate;
an electronic component in the cavity and comprising a first terminal, a second terminal, and a third terminal; and
a device encapsulant in the cavity and contacting the first side of the substrate and a lateral side of the electronic component, and contacting a lateral side of the first lead;
wherein the first terminal comprises a gate terminal of the electronic component, wherein the gate terminal is on a side of the electronic component facing away from the cavity, and wherein the gate terminal is external to the device encapsulant;
wherein the first terminal and the second terminal are on the second side of the substrate, and the third terminal is coupled with the first lead via the cavity base;
wherein an external side of the electronic component is exposed from the device encapsulant;
wherein a first lateral end of the substrate extends beyond an exterior lateral side of the first lead, and the substrate has a first thickness at the first lead that is greater than a second thickness at the first lateral end of the substrate; and
wherein the first lateral end of the substrate and the exterior lateral side of the first lead are exposed from the device encapsulant, and the first lateral end of the substrate is flush with a lateral end of the device encapsulant.

2. The electronic device of claim 1, wherein:
the cavity comprises a curved transition from a cavity base to a cavity wall.

3. The electronic device of claim 1, wherein:
the cavity comprises an angular transition from a cavity base to a cavity wall.

4. The electronic device of claim 1, wherein:
the substrate comprises a third lead that is coupled with a paddle of the substrate, wherein the third lead comprises a contiguous extension of the substrate; and
the first lead and the third lead are at different lateral sides of the electronic component.

5. The electronic device of claim 1, further comprising:
a plating on the cavity base of the cavity; and
a sintering material between the plating and the third terminal;
wherein the third terminal is coupled with the substrate via the plating.

6. The electronic device of claim 1, wherein:
the substrate includes a wettable flank comprising a groove on the first lead opposite to the cavity; and
the groove and the gate terminal are both on the second side of the substrate.

7. The electronic device of claim 1, wherein:
a distance between the first lateral end of the substrate and a second lateral end of the substrate is greater than a distance between the exterior lateral side of the first lead and an exterior lateral side of the second lead.

8. The electronic device of claim 7, wherein:
the cavity base, the first lead, and the second lead comprise a single monolithic structure.

9. An electronic device, comprising:
a substrate comprising a first side and a second side, a first lead and a second lead on the second side, and a cavity in the second side adjacent to the first lead;
an electronic component in the cavity and comprising a gate terminal, a source terminal, and a drain terminal, wherein the gate terminal and the source terminal are on a first side of the electronic component facing away from the substrate, and the drain terminal is on a second side of the electronic component facing toward the substrate; and
a device encapsulant in the cavity and contacting the first side of the substrate and a lateral side of the electronic component, wherein the device encapsulant contacts an internal lateral side of the first lead and an internal lateral side of the second lead;
wherein the first lead has a first wettable flank on an external lateral side of the first lead, and the second lead has a second wettable flank on an external lateral side of the second lead;
wherein an external side of the electronic component is exposed from the device encapsulant; and
wherein a lateral side of the substrate is exposed from the device encapsulant and is flush with a lateral side of the device encapsulant.

10. The electronic device of claim 9, wherein:
the drain terminal is coupled with the first lead and the second lead via the substrate;
the first lead, the second lead, the gate terminal, and the source terminal are at the second side of the substrate; and
the substrate comprises a plating on the second side of the substrate, wherein the plating contacts the first lead, the second lead, the gate terminal, and the source terminal.

11. An electronic device, comprising:
a substrate comprising a first side and a second side, a first lead on the second side, and a cavity in the second side adjacent to the first lead;
an electronic component in the cavity and comprising a first terminal, a second terminal, and a third terminal; and
a device encapsulant in the cavity and contacting the first side of the substrate, a lateral side of the electronic component, and a first internal lateral side of the first lead in the cavity;
wherein:
the first lead comprises a groove in a first external lateral side of the first lead, the groove comprising a horizontal portion and a vertical portion;
the substrate comprises a plating contacting the first lead, the first terminal, and the second terminal; and
the plating contacts the first external lateral side of the first lead on the horizontal portion and the vertical portion of the groove.

12. The electronic device of claim 11, wherein:
a lateral side of the substrate is exposed from the device encapsulant and is flush with a lateral side of the device encapsulant.

13. The electronic device of claim 12, wherein:
the exposed lateral side of the substrate is bound by the plating and the device encapsulant.

* * * * *